United States Patent
Tsuda et al.

(10) Patent No.: US 10,600,799 B2
(45) Date of Patent: Mar. 24, 2020

(54) MEMORY DEVICE AND LOW BREAKDOWN VOLTAGE TRANSISTOR

(71) Applicant: Renesas Electronics Corporation, Tokyo (JP)

(72) Inventors: Shibun Tsuda, Tokyo (JP); Tomohiro Yamashita, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/366,047

(22) Filed: Dec. 1, 2016

(65) Prior Publication Data

US 2017/0200726 A1     Jul. 13, 2017

(30) Foreign Application Priority Data

Jan. 7, 2016   (JP) ................. 2016-001669

(51) Int. Cl.
*H01L 27/115*     (2017.01)
*H01L 29/06*     (2006.01)
(Continued)

(52) U.S. Cl.
CPC .. *H01L 27/1157* (2013.01); *H01L 21/823431* (2013.01); *H01L 27/0886* (2013.01);
(Continued)

(58) Field of Classification Search
CPC ............. H01L 27/0886; H01L 27/0924; H01L 27/1211; H01L 29/41791; H01L 29/66795;
(Continued)

(56) References Cited

U.S. PATENT DOCUMENTS 9,006,110 B1 * 4/2015 Sun .................... H01L 21/30604
257/368
9,214,358 B1 * 12/2015 Lin ......................... H01L 29/66
(Continued)

FOREIGN PATENT DOCUMENTS

JP     2005-276930 A    10/2005
JP     2015-005746 A     1/2015
WO   WO 2010/150429 A1 * 12/2010

OTHER PUBLICATIONS

Office Action issued in corresponding Japanese Patent Application No. 2016-001669, dated Apr. 16, 2019, with English translation.

*Primary Examiner* — Allen L Parker
*Assistant Examiner* — Pauline Vu
(74) *Attorney, Agent, or Firm* — McDermott Will & Emery LLP

(57) ABSTRACT

When a memory cell is formed over a first fin and a low breakdown voltage transistor is formed over a second fin, the depth of a first trench for dividing the first fins in a memory cell region is made larger than that of a second trench for dividing the second fins in a logic region. Thereby, in the direction perpendicular to the upper surface of a semiconductor substrate, the distance between the upper surface of the first fin and the bottom surface of an element isolation region in the memory cell region becomes larger than that between the upper surface of the second fin and the bottom surface of the element isolation region in the logic region.

7 Claims, 31 Drawing Sheets

(51) Int. Cl.
  *H01L 29/66* (2006.01)
  *H01L 29/78* (2006.01)
  *H01L 29/792* (2006.01)
  *H01L 21/28* (2006.01)
  *H01L 27/1157* (2017.01)
  *H01L 29/423* (2006.01)
  *H01L 27/088* (2006.01)
  *H01L 27/11573* (2017.01)
  *H01L 21/8234* (2006.01)

(52) U.S. Cl.
  CPC .... *H01L 27/11573* (2013.01); *H01L 29/0653* (2013.01); *H01L 29/40117* (2019.08); *H01L 29/42344* (2013.01); *H01L 29/66545* (2013.01); *H01L 29/66795* (2013.01); *H01L 29/66833* (2013.01); *H01L 29/7851* (2013.01); *H01L 29/792* (2013.01); *H01L 29/7923* (2013.01)

(58) Field of Classification Search
  CPC ............... H01L 29/785; H01L 29/0657; H01L 29/7851; H01L 27/1157; H01L 29/792; H01L 21/28282; H01L 29/66833; H01L 21/823431; H01L 21/823821; H01L 21/845
  See application file for complete search history.

(56) References Cited

U.S. PATENT DOCUMENTS

| | | |
|---|---|---|
| 2005/0221579 A1 | 10/2005 | Matsumoto |
| 2005/0239242 A1* | 10/2005 | Zhu ....................... H01L 21/845 438/199 |
| 2007/0054448 A1* | 3/2007 | Choi ................. H01L 21/28273 438/201 |
| 2009/0294857 A1* | 12/2009 | Lee ................... H01L 27/10876 257/365 |
| 2011/0031552 A1* | 2/2011 | Iwamatsu ............. H01L 21/845 257/347 |
| 2011/0121406 A1* | 5/2011 | Lee ................. H01L 21/823431 257/401 |
| 2011/0147848 A1* | 6/2011 | Kuhn ................ H01L 21/76229 257/368 |
| 2013/0175611 A1* | 7/2013 | Shinohara ......... H01L 21/02697 257/334 |
| 2013/0221443 A1* | 8/2013 | Lin ..................... H01L 27/0924 257/368 |
| 2013/0244392 A1* | 9/2013 | Oh ................... H01L 29/66477 438/299 |
| 2014/0077303 A1* | 3/2014 | Baek .................... G06F 17/5063 257/365 |
| 2014/0131813 A1* | 5/2014 | Liaw ................. H01L 27/1104 257/401 |
| 2014/0191323 A1* | 7/2014 | Bergendahl ..... H01L 21/823431 257/368 |
| 2014/0242775 A1 | 8/2014 | Lin et al. |
| 2014/0252428 A1* | 9/2014 | Chang ................... H01L 29/785 257/288 |
| 2014/0374828 A1 | 12/2014 | Song et al. |
| 2015/0014808 A1* | 1/2015 | Tsai .................. H01L 21/76224 257/506 |
| 2015/0187634 A1* | 7/2015 | Chiang ............... H01L 21/2636 257/401 |
| 2015/0270279 A1* | 9/2015 | Arigane ............ H01L 27/11568 257/324 |
| 2016/0260715 A1* | 9/2016 | Chung ................ H01L 27/0886 |
| 2017/0005014 A1* | 1/2017 | Yamashita ............. H01L 22/12 |
| 2017/0179121 A1* | 6/2017 | Gaynor ................ H01L 29/7853 |

* cited by examiner

FIG. 54

| | OPERATION METHOD WRITE / ERASE | WRITE OPERATION VOLTAGE(V) Vmg/Vs/Vcg/Vd/Vb | ERASE OPERATION VOLTAGE(V) Vmg/Vs/Vcg/Vd/Vb | READ OPERATION VOLTAGE(V) Vmg/Vs/Vcg/Vd/Vb |
|---|---|---|---|---|
| A | SSI(WRITE) / BTBT(ERASE) | 10/5/1/0.5/0 | −6/6/0/open/0 | 0/0/1.5/1.5/0 |
| B | SSI(WRITE) / FN(ERASE) | 10/5/1/0.5/0 | 12/0/0/0/0 | 0/0/1.5/1.5/0 |

MEMORY DEVICE AND LOW BREAKDOWN VOLTAGE TRANSISTOR

CROSS-REFERENCE TO RELATED APPLICATIONS

The disclosure of Japanese Patent Application No. 2016-001669 filed on Jan. 7, 2016 including the specification, drawings and abstract is incorporated herein by reference in its entirety.

BACKGROUND

The present invention relates to a semiconductor device and a manufacturing method thereof, and in particular, to a technique effective when applied to a semiconductor device including a fin-type transistor.

A fin-type transistor is known as a field effect transistor whose: operation speed is high; leakage current and power consumption can be reduced; and miniaturization can be achieved. The fin-type transistor (FINFET: Fin Field Effect Transistor) is a semiconductor element that has, for example, both a semiconductor layer pattern formed over a substrate as a channel layer and a gate electrode formed to stretch over the pattern.

EEPROMs (Electrically Erasable and Programmable Read Only Memory) are widely used as nonvolatile semiconductor memory devices in which data can be electrically written/erased. Each of these memory devices represented by the flash memories now widely used has, under the gate electrode of a MISFET, a conductive floating gate electrode or a trap insulating film, which is surrounded by an oxide film, so that a charge storage state in the floating gate or the trap insulating film, i.e., memory data, is read as the threshold value of a transistor. This trap insulating film refers to an insulating film in which charges can be stored, and examples thereof include a silicon nitride film, and the like. Each of these memory devices is operated as a memory element by shifting the threshold value of a MISFET with charges being injected/discharged into/from such a charge storage region. An example of this flash memory is a split gate type cell using a MONOS (Metal-Oxide-Nitride-Oxide-Semiconductor) film.

Patent Document 1 (Japanese Unexamined Patent Application Publication No. 2015-5746) discloses that an active base is provided over a substrate and a memory cell is formed over each of a plurality of fins protruding from the upper surface of the active base.

Patent Document 2 (Japanese Unexamined Patent Application Publication No. 2005-276930) discloses that when trenches, into each of which an element isolation region for isolating a plurality of memory cells from each other is to be embedded, are formed, multiple types of trenches, each having an aspect ratio different from those of the others, are formed in order to improve the embeddability of an insulating film into the trench.

SUMMARY

When a high breakdown voltage element, such as a memory cell, is formed by using a FINFET, it is preferable from the viewpoint of improving isolation breakdown voltage that the depth of a trench, into which an element isolation region for isolating fins from each other is to be embedded, is large. However, in a chip where a memory cell and a low breakdown voltage FET are mounted together, there is the problem that it is difficult to satisfy both an improvement in the isolation breakdown voltage of the memory cell and an improvement in the integration degree of the low breakdown voltage FETs.

Other purposes and new characteristics will become clear from the description of the present specification and accompanying drawings.

Of the preferred embodiments disclosed in the present application, outlines of the typical ones will be briefly described as follows.

In a semiconductor device according to one embodiment, a trench, which divides fins over each of which a high breakdown voltage memory is formed, is formed to be deeper than a trench that divides fins over each of which a low breakdown voltage FET is formed.

In a manufacturing method of a semiconductor device according to one embodiment, a trench, which divides fins over each of which a high breakdown voltage memory is formed, is formed to be deeper than a trench that divides fins over each of which a low breakdown voltage FET is formed.

Advantage of the Invention

According to one embodiment disclosed in the present application, the performance of a semiconductor device can be improved. In particular, the breakdown voltage of a high breakdown voltage element can be improved, and a low breakdown voltage element can be miniaturized.

BRIEF DESCRIPTION OF THE DRAWINGS

FIG. 54 is a table for explaining the operation voltages of a memory cell on a split gate side;

DETAILED DESCRIPTION

Figure 1:
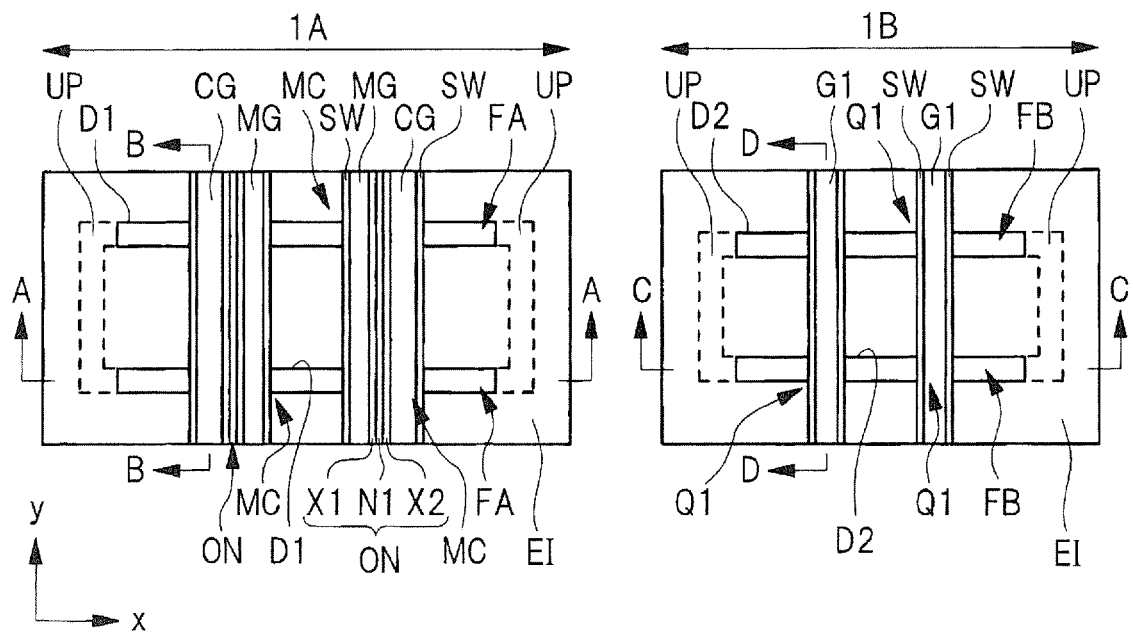
FIG. 1 is plan views illustrating a semiconductor device according to First Embodiment of the present invention.

Hereinafter, preferred embodiments of the present invention will be described in detail based on the accompanying drawings. In each view for explaining the embodiments, components having the same function will be denoted with the same reference numerals, and duplicative description thereof will be omitted. Additionally, in the following embodiments, description of the same or similar parts will not be repeated in principle, unless it is particularly necessary.

First Embodiment

<Structure of Semiconductor Device>

Figure 2:
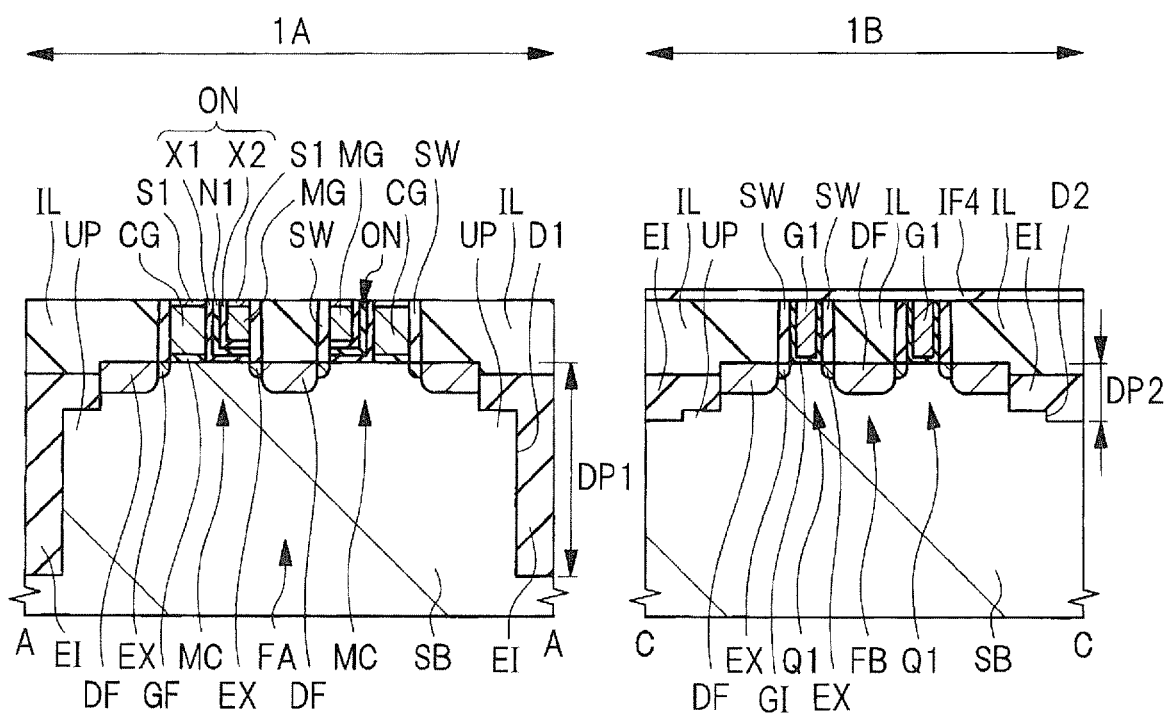
FIG. 2 is sectional views taken along A-A Line and C-C Line in FIG. 1, illustrating a semiconductor device according to First Embodiment of the invention.
Figure 3:
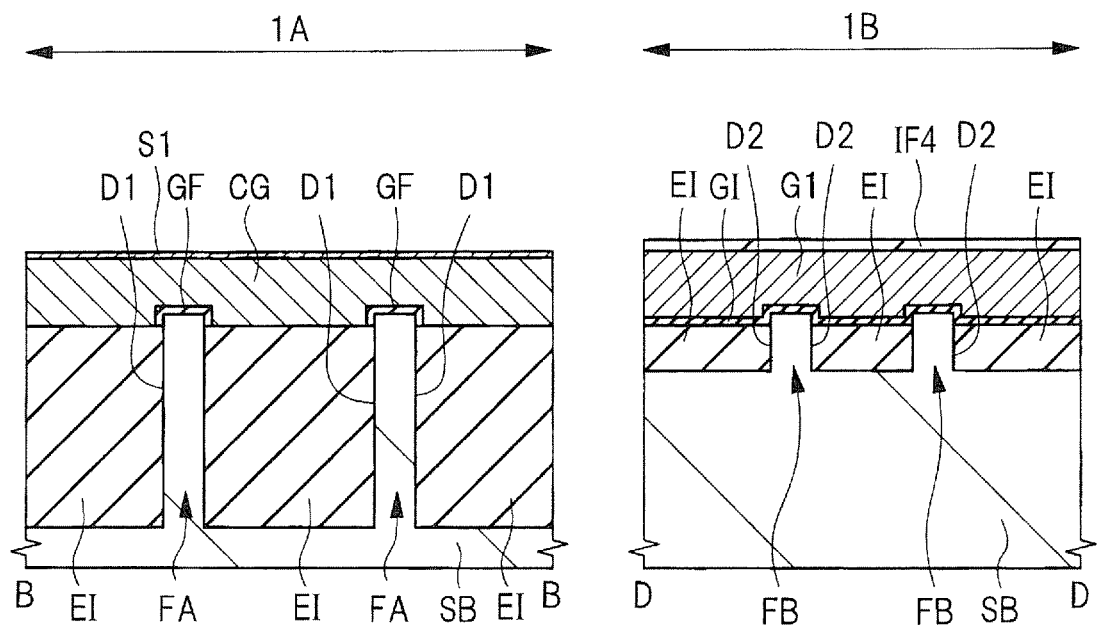
FIG. 3 is sectional views taken along B-B Line and D-D Line in FIG. 1, illustrating a semiconductor device according to First Embodiment of the invention.
Figure 4:
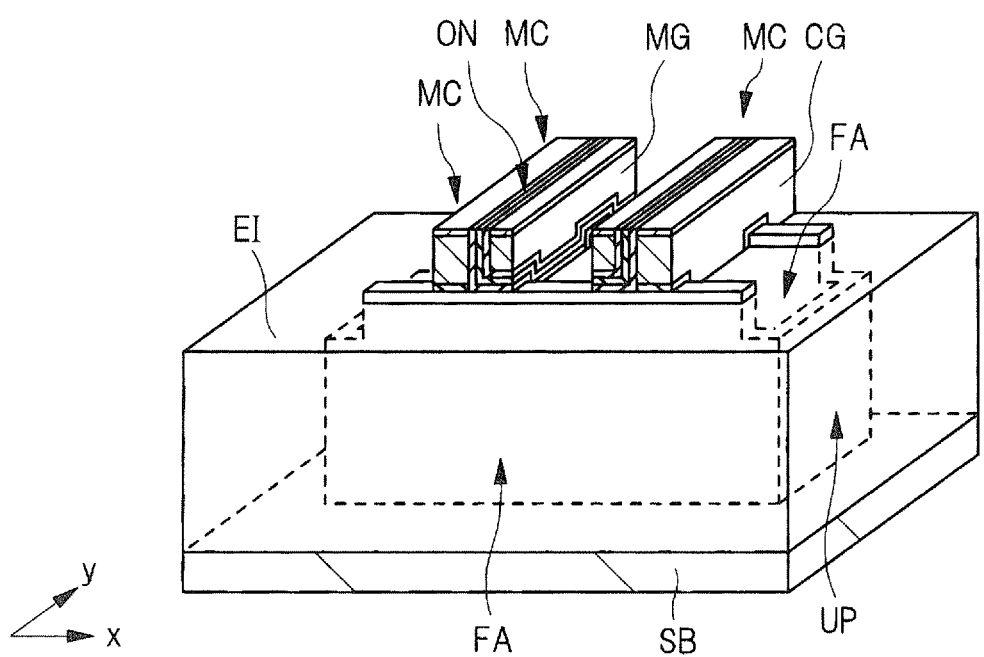
FIG. 4 is a perspective view illustrating a semiconductor device according to First Embodiment of the invention.

Hereinafter, a structure of a semiconductor device according to the present embodiment will be described with reference to FIGS. 1 to 4. FIG. 1 is plan views illustrating a semiconductor device according to the embodiment. FIGS. 2 and 3 are sectional views illustrating a semiconductor device according to the embodiment. FIG. 4 is a perspective view illustrating a memory cell that forms a semiconductor device according to the embodiment.

FIG. 2 illustrates sectional surfaces taken along A-A Line and C-C Line in FIG. 1. FIG. 3 illustrates sectional surfaces taken along B-B Line and D-D Line in FIG. 1. FIG. 2 illustrates sectional surfaces taken along the direction in which a fin over a semiconductor substrate extends, and FIG. 3 illustrates sectional surfaces taken along the direction in which a gate electrode over the fin extends. In FIG. 1, a source/drain region including a diffusion layer DF (see FIG. 2) is not illustrated. In FIGS. 1 and 4, the source/drain region and an interlayer insulating film are not illustrated, and the outlines of a fin, etc., located in a portion covered with an element isolation region are illustrated by dashed lines. In FIG. 1, a silicide layer over each gate electrode is not illustrated. In FIG. 4, hatching lines to be drawn on the sectional surface of the element isolation region are not illustrated, and a sidewall spacer and a logic region 1B are not illustrated.

In a semiconductor device according to the present embodiment, both a split gate type memory cell including two FINFETs and, for example, a low breakdown voltage n-type FINFET are mounted over the same semiconductor chip. As illustrated in FIGS. 1 to 3, the memory cell is arranged in a memory cell region 1A, and the low breakdown voltage FINFET in a logic region 1B. The memory cell region 1A and the logic region 1B are regions lined up in the direction along the main surface of a semiconductor substrate SB.

As illustrated in the memory cell region 1A in FIGS. 1 to 3, a memory cell (nonvolatile memory element) MC is formed over a plate-shaped fin FA that is part of the semiconductor substrate SB and is formed in the upper portion of the semiconductor substrate SB. As illustrated in the logic region 1B in FIGS. 1 to 3, a transistor Q1, a low breakdown voltage FINFET, is formed over a plate-shaped fin FB that is part of the semiconductor substrate SB and is formed in the upper portion of the semiconductor substrate SB. Each of the fins FA and FB is a semiconductor layer pattern extending along an x direction (see FIG. 1) along the main surface of the semiconductor substrate SB, and the width of each of the fins FA and FB in a y direction intersecting the X direction at a right angle, the y direction extending along the main surface of the semiconductor substrate SB, is remarkably smaller than the width in the x direction of each of them. The semiconductor substrate SB includes, for example, single crystalline silicon.

A plurality of the respective fins FA and FB are arranged to be lined up in the y direction. Although only two fins FA lined up in the y direction are illustrated in FIG. 1, more than two of the fins FA may be arranged to be lined up in the y direction. The same is true with the fin FB. Although not illustrated, the fins FA may be arranged to be lined up also in the x direction in the memory cell region 1A, and the shape of the fin FA is not limited as far as it is a protruding portion having a length, width, and height. For example, a pattern meandering in plan view is also acceptable. Additionally, the way in which the fins FA are lined up is not limited. The same is true with the arrangements of the fins FB and the transistors Q1 in the logic region 1B.

A trench D1 formed in the upper surface of the semiconductor substrate SB is formed between the fins FA. A trench D2 formed in the upper surface of the semiconductor substrate SB is formed between the fins FB. As illustrated in FIG. 1, the ends of two fins FA adjacent to each other in the y direction are coupled by a lower pattern UP that is part of the semiconductor substrate SB and is covered with an element isolation region EI. The lower pattern UP extends in the x direction from both the ends of the two fins FA. Similarly, the ends of two fins FB adjacent to each other in the y direction are coupled by a lower pattern UP covered with the element isolation region EI. Although not illustrated, the shape of the lower pattern UP is not limited as far as it couples the fins FA together and the fins FB together.

Each of the sidewalls of the fin FA and the lower pattern UP coupled to the fin FA forms the sidewall of the trench D1. Each of the sidewalls of the fin FB and the lower pattern UP coupled to the fin FB forms the sidewall of the trench D2. The above lower pattern UP coupled to the fin FA or FB may not be formed. That is, the region where the lower pattern UP is formed may be part of the element isolation region EI embedded in the trench D1 or D2.

As illustrated in FIGS. 2 and 3, the element isolation region EI is an insulating film that fills the trenches D1 and D2. However, the element isolation region EI does not fill the trenches D1 and D2 completely, and part of each of the fins FA and FB protrudes over the upper surface of the element isolation region EI. The element isolation region EI covers the whole lower pattern UP. The element isolation region EI includes, for example, a silicon oxide film.

In the present application, a plate-shaped semiconductor layer is referred to as the fin FA, the plate-shaped semiconductor layer including: an upper layer pattern, which is a pattern that forms part of the semiconductor substrate SB in the memory cell region 1A and is exposed from the element isolation region EI to extend in the x direction; and a lower layer pattern, which reaches the bottom of the trench D1 on the upper layer pattern side directly under the upper layer pattern. Similarly, a plate-shaped semiconductor layer is referred to as the fin FB, the plate-shaped semiconductor layer including: an upper layer pattern, which is a pattern that forms part of the semiconductor substrate SB in the logic region 1B and is exposed from the element isolation region EI to extend in the x direction; and a lower layer pattern, which reaches the bottom of the trench D2 on the upper layer pattern side directly under the upper layer pattern.

That is, the fin is a semiconductor pattern protruding, in the upper surface of the semiconductor substrate, upward of the semiconductor substrate, and is a protruding portion extending, for example, in the x direction in FIG. 1. Herein, description will be made, assuming that the lower pattern UP is not part of the fins FA and FB. Although not illustrated, a p-type well containing p-type impurities (e.g., B (boron)) is formed over each of the upper surfaces of the fins FA and FB so as to be deeper than the later-described source/drain region.

As illustrated in FIGS. 1 to 4, a control gate electrode CG extending in the y direction and a memory gate electrode MG extending in the y direction are formed directly over the fins FA lined up in the y direction so as to stretch over the fins FA. As illustrated in FIGS. 2 and 3, the control gate electrode CG is formed over the fin FA via a gate insulating film GF. As illustrated in FIG. 3, the control gate electrode CG is formed, via the gate insulating film GF, over the sidewall of the fin FA over the element isolation region EI. The gate insulating film GF in the memory cell region 1A covers the upper surface and sidewall of the fin FA exposed from the element isolation region EI, and includes, for example, a silicon oxide film. The control gate electrode CG includes, for example, a polysilicon film.

As illustrated in FIGS. 1 and 2, one sidewall in the x direction of the control gate electrode CG is covered with a sidewall spacer SW, and over the other sidewall thereof, the memory gate electrode MG is formed via an ONO (Oxide-Nitride-Oxide) film ON. The ONO film ON is a laminated film in which a silicon oxide film X1, a silicon nitride film N1, and a silicon oxide film X2 are formed sequentially from the semiconductor substrate SB side and the control gate electrode CG side, and the memory gate electrode MG includes, for example, a polysilicon film. The silicon nitride film N1 is a trap insulating film (a charge storage film, a charge retention film), and can change the threshold voltage of the memory cell MC by changing the charge storage state of the silicon nitride film N1 with the operation of the memory cell MC.

As illustrated in FIGS. 2 and 4, the memory gate electrode MG is formed over the fin FA via the ONO film ON. That is, the ONO film ON has an L-shaped sectional surface that is continuously formed along the upper surface of the fin FA and the sidewall of the control gate electrode CG. The memory gate electrode MG is insulated from the control gate electrode CG and the fin FA by the ONO film ON.

As illustrated in FIG. 2, the sidewall in the x direction of the memory gate electrode MG, the sidewall not contacting the ONO film ON, is covered with the sidewall spacer SW. The sidewall spacer SW includes, for example, a silicon nitride film, a silicon oxide film, or a laminated film thereof. A silicide layer S1 is formed over the upper surface of each of the control gate electrode CG and the memory gate electrode MG. The silicide layer S1 includes, for example, NiSi (nickel silicide) or CoSi (cobalt silicide). The silicide layer S1 is provided in order to reduce the coupling resistance between a contact plug (not illustrated), which is coupled to each of the upper surfaces of the control gate electrode CG and the memory gate electrode MG, and the control gate electrode CG or the memory gate electrode MG.

One pair of patterns, each including the control gate electrode CG and the memory gate electrode MG adjacent to each other via the ONO film ON, are formed directly over the fin FA in the memory cell region 1A so as to be lined up in the x direction. The one pair of patterns are spaced apart from each other, and the memory gate electrode MG is adjacent to the surfaces of two control gate electrodes CG that form the one pair of patterns, the surfaces facing each other.

One pair of source/drain regions are formed in the upper surfaces of the fins FA that are, in the x direction, beside and on both sides of the pattern. Each of the source/drain regions is formed by two n-type semiconductor regions into which n-type impurities (e.g., P (phosphorus) or As (arsenic)) have been introduced, i.e., by an extension region EX and a diffusion layer DF. The extension region EX is a region having a concentration of n-type impurities lower than that of the diffusion layer DF. Herein, the diffusion layer DF is formed to be deeper than the extension region EX. Additionally, the extension region EX is arranged at a position closer to the upper surface of the fin FA directly under each of the control gate electrode CG and the memory gate electrode MG than to the adjacent diffusion layer DF. Thus, the source/drain region has an LDD (Lightly Doped Drain) structure including the extension region EX having a lower impurity concentration and the diffusion layer DF having a higher impurity concentration.

The control gate electrode CG and the one pair of source/drain regions formed in the upper surfaces of the fins FA on both sides of the control gate electrode CG form a first transistor (control transistor) having a MISFET (Metal Insulator Semiconductor Field Effect Transistor) structure. The memory gate electrode MG and the one pair of source/drain regions formed in the upper surfaces of the fins FA on both sides of the memory gate electrode MG form a second transistor (memory transistor) having a MISFET structure. The memory cell MC according to the present embodiment is formed by the first transistor and the second transistor that share a source/drain region with each other. That is, the memory cell MC has the control gate electrode CG, the memory gate electrode MG, the ONO film ON, a drain region near the control gate electrode CG, and a source region near the memory gate electrode MG.

Two memory cells MC are formed over one fin FA. The two memory cells MC share a source region with each other. The upper surface of the fin FA directly under each of the control gate electrode CG and the memory gate electrode MG includes a channel region where a channel is formed when the memory cell MC is operating. The channel is a fin-type channel. The memory cell MC is a nonvolatile memory in which both a write operation and an erase operation can be electrically rewritten.

In the logic region 1B, the gate electrode G1 extending in the y direction is formed directly over the fins FB lined up in the y direction so as to stretch over the fins FB, as illustrated in FIGS. 1 to 3. As illustrated in FIGS. 2 and 3, the gate electrode G1 is formed over the fin FB and the element isolation region EI via a gate insulating film GI. As illustrated in FIG. 3, the gate electrode G1 is formed over the sidewall of the fin FB over the element isolation region EI via the gate insulating film GI. The gate insulating film GI covers the upper surface and the sidewall of the fin FB exposed from the element isolation region EI and the upper surface of the element isolation region EI.

As illustrated in FIG. 2, the gate insulating film GI continuously covers the bottom surface and both the sidewalls of the gate electrode G1. That is, the surfaces of the gate electrode G1, other than the upper surface thereof, are surrounded by the gate insulating film GI. Although not illustrated, for example, a silicon oxide film may be formed, as part of the gate insulating film, between the gate insulating film GI and the fin FB. As the gate insulating film GI, a metal oxide film, such as, for example, a hafnium oxide film, zirconium oxide film, aluminum oxide film, tantalum oxide film, or lanthanum oxide film, can be used. The gate insulating film GI is a so-called high-k film having a dielectric constant higher than that of a silicon oxide film.

The gate electrode G1 includes, for example, an Al (aluminum) film. The gate electrode G1 may have a laminated structure in which, for example, a titanium aluminum (TiAl) film and an aluminum (Al) are laminated sequentially over the semiconductor substrate SB.

As illustrated in FIGS. 1 and 2, each of the sidewalls in the x direction on both sides of the gate electrode G1 is covered with the sidewall spacer SW. The silicide layer S1 is not formed over the upper surface of the gate electrode G1. When the gate electrode G1 and a contact plug (not illustrated) thereover are coupled together, they can be ohmic-coupled without the silicide layer S1 interposed therebetween, because the resistance of the gate electrode G1 including a metal film is lower than that of a silicone film. One pair of the gate electrodes G1 are formed directly over the fin FB in the logic region 1B so as to be lined up in the x direction. The one pair of the gate electrodes G1 are spaced from each other.

One pair of source/drain regions are formed in the upper surfaces of the fins FB that are, in the x direction, beside and on both sides of the gate electrode G1. Each of the source/drain regions is formed by two n-type semiconductor regions into which n-type impurities (e.g., P (phosphorus) or As (arsenic)) have been introduced, i.e., by the extension region EX and the diffusion layer DF, similarly to the source/drain region in the memory cell region 1A. The impurity concentration of the source/drain region in the memory cell region 1A is higher than that of the source/drain region in the logic region 1B.

The gate electrode G1 and the one pair of the source/drain regions formed in the upper surfaces of the fins FB on both sides of the gate electrode G1 form the low breakdown voltage transistor Q1 having a MISFET structure. Two transistors Q1 are formed over one fin FB. The upper surface of the fin FB directly under the gate electrode G1 includes a channel region where a channel is formed when the transistor Q1 is operating. The channel is a fin-type channel. The two transistors Q1 share one of the one pair of the source/drain regions each of which has.

In the present application, each of the above first transistor, second transistor, and transistor Q1, each of which has part of the fin FA as the channel region and is formed over the fin FA, is referred to as a FINFET. Because each of the first transistor and the second transistor, which form the memory cell MC, is a transistor driven by a voltage higher than that for the low breakdown voltage transistor Q1 that forms a logic circuit, they are required to have a breakdown voltage performance higher than that of the transistor Q1.

The upper surface of the element isolation region EI and the sidewalls of the fin FA, the fin FB, and the sidewall spacer SW are covered with the interlayer insulating film IL. The interlayer insulating film IL includes, for example, a silicon oxide film. Although not illustrated, a thin insulating film is formed between the upper surfaces of the interlayer insulating film IL and the element isolation region EI and the sidewalls of the fin FA, the fin FB, and the sidewall spacer SW, the thin insulating film including, for example, a silicon nitride film. The respective upper surfaces of the interlayer insulating film IL, the sidewall spacer SW, the gate electrode G1, the ONO film ON, the control gate electrode CG, and the memory gate electrode MG are flattened on almost the same flat surface.

Although not illustrated, the upper portion of each of the interlayer insulating film IL, the memory cell MC, and the transistor Q1 is covered with an interlayer insulating film. Although not illustrated, a plurality of contact plugs, each penetrating the interlayer insulating film IL and the interlayer insulating film over the interlayer insulating film IL, are formed, and the contact plug is electrically coupled to the gate electrode G1, the control gate electrode CG, the memory gate electrode MG, or each source drain region. A wire (not illustrated) is formed over the contact plug.

Herein, the semiconductor device according to the present embodiment is mainly characterized in that: in a semiconductor device having multiple types of FINFETs each having a required breakdown voltage performance different from those of the others, the depth of a trench, in which the element isolation region EI for isolating high breakdown voltage FINFETs is embedded, is larger than that of a trench, in which the element isolation region EI for isolating low breakdown voltage FINFETs, as described above. That is, in the direction perpendicular to the main surface of the semiconductor substrate SB, the space between the upper surface of the fin FA in the memory cell region 1A and the bottom surface of the element isolation region EI in the memory cell region 1A is larger than that between the upper surface of the fin FB in the logic region 1B and the bottom surface of the element isolation region EI in the logic region 1B. In the logic region 1B, the upper surface of each of the gate electrode G1, the sidewall spacer SW, and the interlayer insulating film IL is covered with an insulating film IF4 including, for example, a silicon oxide film.

<Operation of Semiconductor Device>

Subsequently, the operation of a nonvolatile memory, of the semiconductor device according to the present embodiment, will be mainly described with reference to FIG. 54. FIG. 54 is a table for explaining the operation voltages of a memory cell on a split gate side.

A memory cell according to the present embodiment has a MISFET structure, and reads, as the threshold value of a transistor, a charge storage state in the trap insulating film in the gate electrode of the MISFET by assuming that the charge storage state is memory data. The trap insulating film refers to an insulating film in which charges can be stored, and examples thereof include a silicon nitride film, and the like. The memory cell is operated as a memory element by shifting the threshold value of a MISFET with charges being injected/discharged into/from such a charge storage region. Examples of the nonvolatile semiconductor memory device using a trap insulating film include a split gate type MONOS memory, such as a memory cell according to the embodiment.

FIG. 54 illustrates a table showing an example of applying a voltage to each part of a selected memory cell when "write", "erase", and "read" of the present embodiment are performed. In the table of FIG. 54, a voltage Vmg to be applied to the memory gate electrode MG of the memory cell MC as illustrated in FIG. 2, a voltage Vs to be applied to the source region thereof, a voltage Vcg to be applied to the control gate electrode CG thereof, a voltage Vd to be applied to the drain region thereof, and a base voltage Vb to be applied to the p-type well in the upper surface of the semiconductor substrate thereof are listed, those voltages being applied when "write", "erase", or "read" is performed. The selected memory cell described herein refers to a memory cell selected as a target on which "write", "erase", or "read" is performed.

In the example of the nonvolatile memory illustrated in FIG. 2, the semiconductor region on the side of the memory gate electrode MG is a source region, and the semiconductor region on the side of the control gate electrode CG is a drain region. The voltages listed in the table of FIG. 54 are preferred examples of voltage application conditions, but should not be limited thereto, and can be changed variously if necessary. In the present embodiment, injection of an electron into the silicon nitride film N1, which is a charge storage part of the ONO film ON in the memory transistor, is defined as "write", and injection of a hole thereinto is defined as "erase."

In the table of FIG. 54, A Column corresponds to the case where the write method is an SSI method and the erase method is a BTBT method; and B Column to the case where the write method is an SSI method and the erase method is an FN method.

The SSI method can be assumed as an operation method in which data is written into a memory cell by injecting a hot electron into the silicon nitride film N1 (see FIG. 2); the BTBT method can be assumed as an operation method in which data is erased from the memory cell by injecting a hot hole into the silicon nitride film N1; and the FN method can be assumed as an operation method in which data is written or erased by tunneling an electron or a hole. In other words of the FN method, the write in the FN method can be assumed as an operation method in which data is written into the memory cell by injecting an electron into the silicon nitride film N1 with an FN tunneling effect; and the erase in the FN method can be assumed as an operation method in which data is erased from the memory cell by injecting a hole into the silicon nitride film N1 with an FN tunneling effect. Hereinafter, specific description will be made.

The write method includes: a write method (hot electron injection write method) that is referred to as a so-called SSI (Source Side Injection) method in which write is performed by hot electron injection using source side injection; and a write method (tunneling write method) that is referred to as a so-called FN method in which write is performed by FN (Fowler Nordheim) tunneling. In the present application, the case where write is performed by the SSI method will be described.

In the write according to the SSI method, for example, the voltages as listed in A Column or B Column in the table of FIG. 54 (Vmg=10 V, Vs=5 V, Vcg=1 V, Vd=0.5 V, Vb=0 V) are applied to each part of the selected memory cell on which write is to be performed, and an electron is injected into the silicon nitride film N1 of the ONO film ON in the selected memory cell, thereby performing write.

In this case, a hot electron is generated in the channel region (between a source and a drain) under the space between two gate electrodes (memory gate electrode MG and control gate electrode CG), and a hot electron is injected into the silicon nitride film N1 that is a charge storage part of the ONO film ON under the memory gate electrode MG. The injected hot electron (electron) is captured by the trap level in the silicon nitride film N1 that forms the ONO film ON, and as a result, the threshold voltage of the memory transistor is increased. That is, the memory transistor is brought into a write state.

The erase method includes: an erase method (hot hole injection erase method) that is referred to as a so-called BTBT method in which erase is performed by hot hole injection using BTBT (Band-To-Band Tunneling); and an erase method (tunneling erase method) that is referred to as a so-called FN method in which erase is performed by FN (Fowler Nordheim) tunneling.

In the erase according to the BTBT method, erase is performed by injecting a hole generated by BTBT into the charge storage part (the silicon nitride film N1 of the ONO film ON). For example, the voltages as listed in A Column in the table of FIG. 54 (Vmg=−6 V, Vs=6 V, Vcg=0 V, Vd=open, Vb=0 V) are applied to the respective parts of the selected memory cell on which erase is to be performed. Thereby, a hole is generated by a BTBT phenomenon and is injected into the silicon nitride film N1 that forms the ONO film ON in the selected memory cell by electric field acceleration, thereby the threshold voltage of the memory transistor is reduced. That is, the memory transistor is brought into an erase state.

In the erase according to the FN method, for example, voltages as listed in "Erase Operation Voltage" in B Column in the table of FIG. 54 (Vmg=12 V, Vs=0 V, Vcg=0 V, Vd=0 V, Vb=0 V) are applied to the respective parts of the selected memory cell on which erase is to be performed, and in the selected memory cell, a hole is tunneled from the memory gate electrode MG and injected into the silicon nitride film N1 of the ONO film ON, thereby performing erase. In this case, a hole is injected from the memory gate electrode MG into the ONO film ON by tunneling the silicon oxide film X2 with FN tunneling (FN tunneling effect), and is captured by the trap level in the silicon nitride film N1 that forms the ONO film ON, and as a result, the threshold voltage of the memory transistor is reduced. That is, the memory transistor is brought into an erase state.

When read is performed, for example, the voltages as listed in "Read Operation Voltage" in A Column or B Column in the table of FIG. 54 are applied to the respective parts of the selected memory cell on which read is to be performed. A write state and an erase state can be distinguished from each other by setting the voltage Vmg to be applied to the memory gate electrode MG when read is performed, to a value between the threshold voltage of the memory transistor in a write state and the threshold voltage thereof in an erase state.

<Manufacturing Method of Semiconductor Device>

A manufacturing method of a semiconductor device according to the present embodiment will be described with reference to FIGS. 5 to 41. FIGS. 5, 7, 9, 11 to 18, and 20 to 41 are sectional views for illustrating a manufacturing method of a semiconductor device according to the embodiment. FIGS. 6, 8, 10, and 19 are plan views for explaining the manufacturing method of a semiconductor device according to the embodiment.

Figure 9:
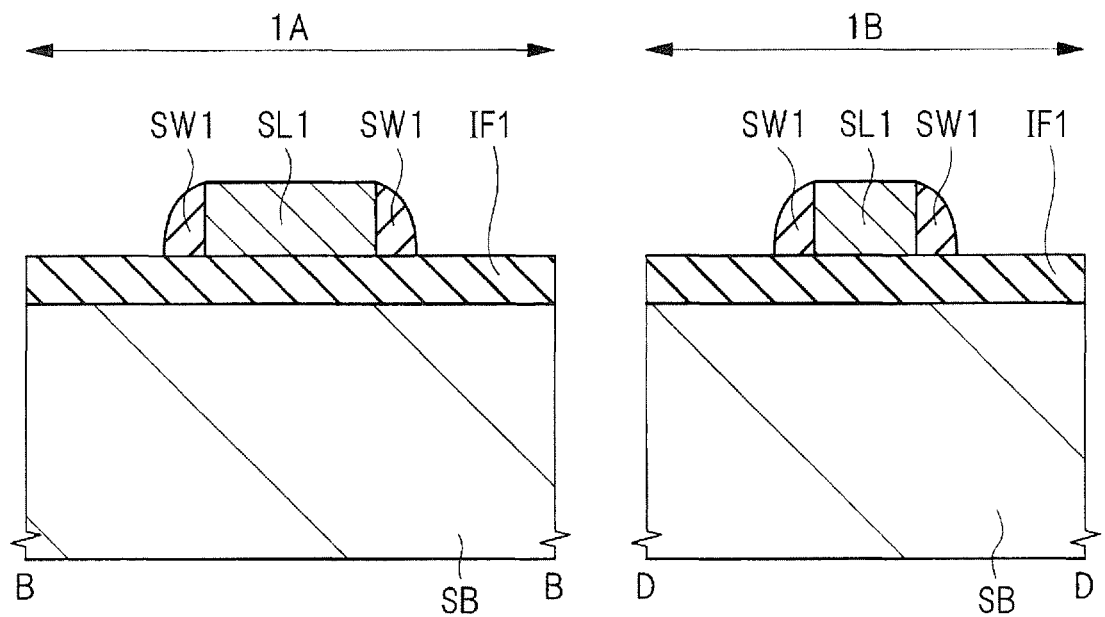
FIG. 9 is sectional views taken along B-B Line and D-D Line in FIG. 8, for explaining a manufacturing step of the semiconductor device following FIG. 7.
Figure 10:
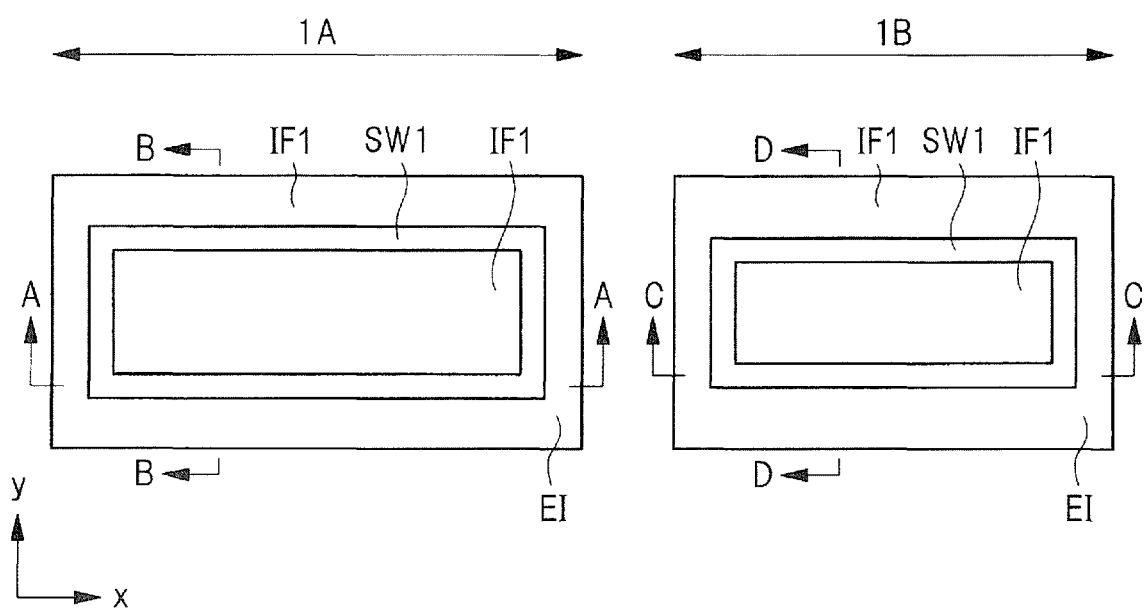
FIG. 10 is plan views for explaining a manufacturing step of the semiconductor device following FIG. 9.
Figure 18:
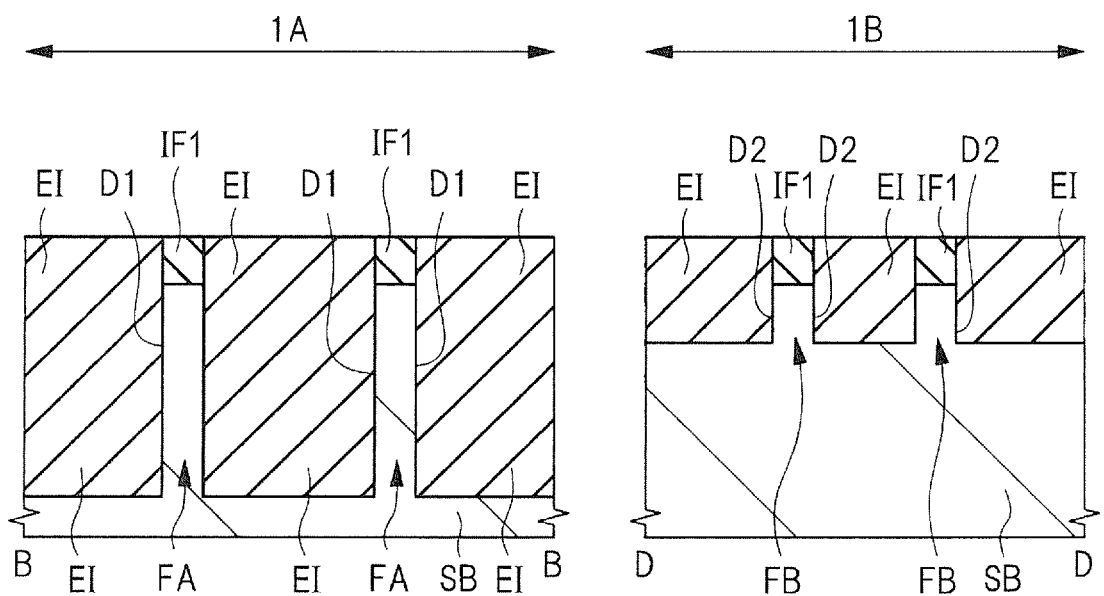
FIG. 18 is sectional views taken along B-B Line and D-D Line in FIG. 10, for explaining a manufacturing step of the semiconductor device following FIG. 16.
Figure 19:
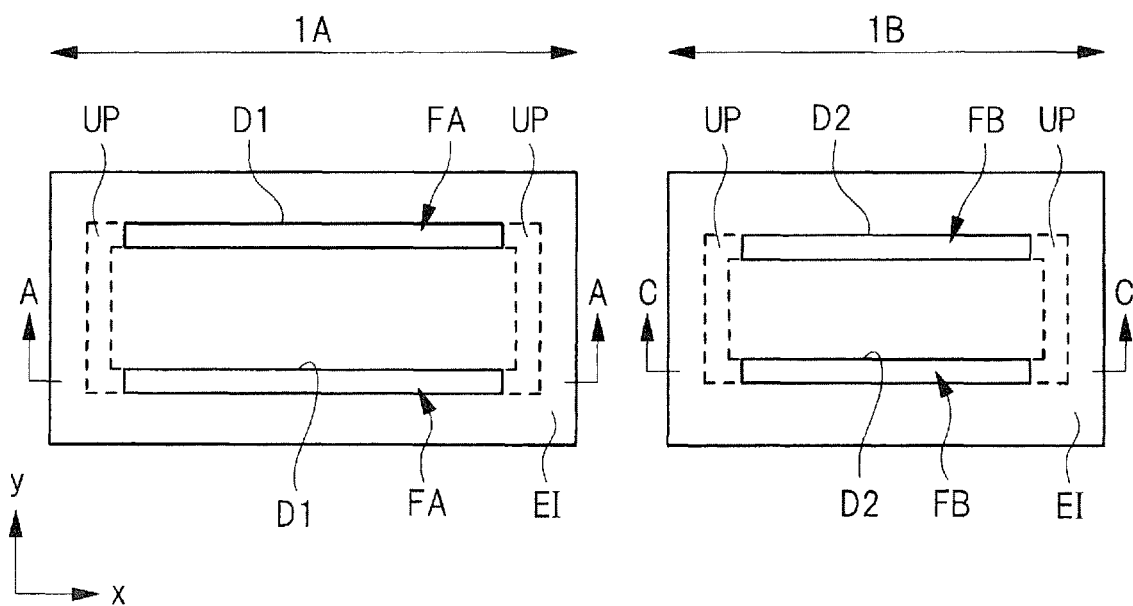
FIG. 19 is plan views for explaining a manufacturing step of the semiconductor device following FIG. 18.

In each of FIGS. 11, 13, 15, 17, 20, 21, 23, 25, 27 to 37, and 39 to 41, the sectional surface taken along the same line as A-A Line in the memory cell region 1A in FIGS. 10 and 19 is illustrated on the left side of the view, and the sectional surface taken along the same line as C-C Line in the logic region 1B is illustrated on the right side thereof. In each of FIGS. 7, 9, 12, 14, 16, 18, 22, 24, and 38, the sectional surface taken along the same line as B-B Line in the memory cell region 1A in FIGS. 6, 8, and 10 is illustrated on the left side of the view, and the sectional surface taken along the same line as D-D Line in the logic region 1B is illustrated on the right side thereof.

Figure 5:
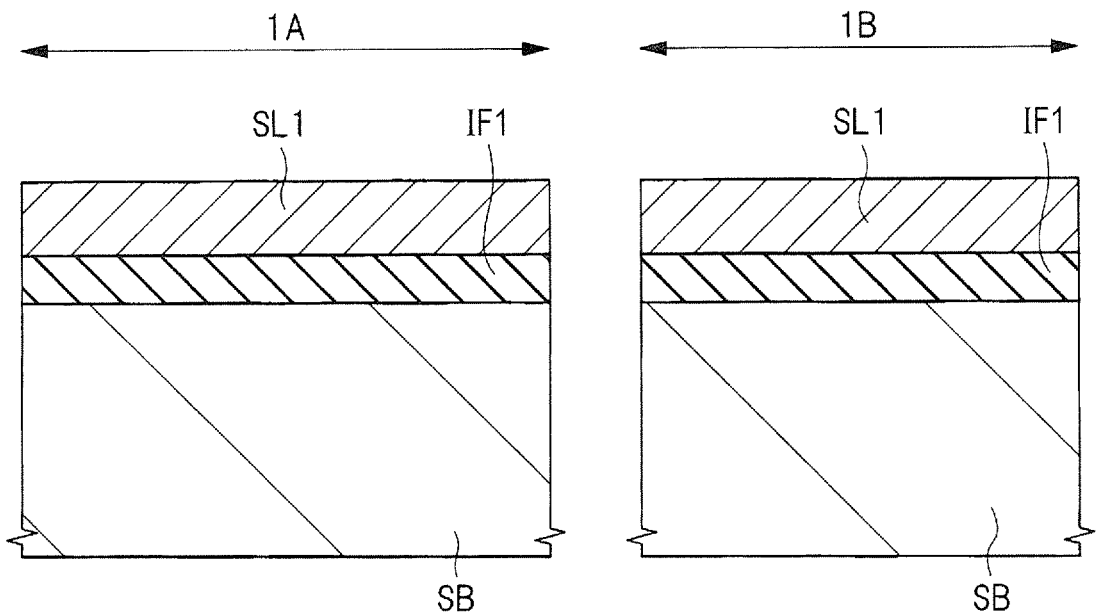
FIG. 5 is sectional views for explaining a manufacturing step of a semiconductor device according to First Embodiment of the invention.

As illustrated in FIG. 5, the semiconductor substrate SB is first provided, and an insulating film IF1 is formed over the semiconductor substrate SB by using, for example, a CVD (Chemical Vapor Deposition) process. The insulating film IF1 includes, for example, a silicon nitride film. Subsequently, an amorphous silicon film SL1 is formed over the insulating film IF1 by using, for example, a CVD process. Although not illustrated, a thin silicon oxide film is formed over the upper surface of the semiconductor substrate SB by a thermal oxidation process, or the like, prior to the formation of the insulating film IF1.

Figure 6:
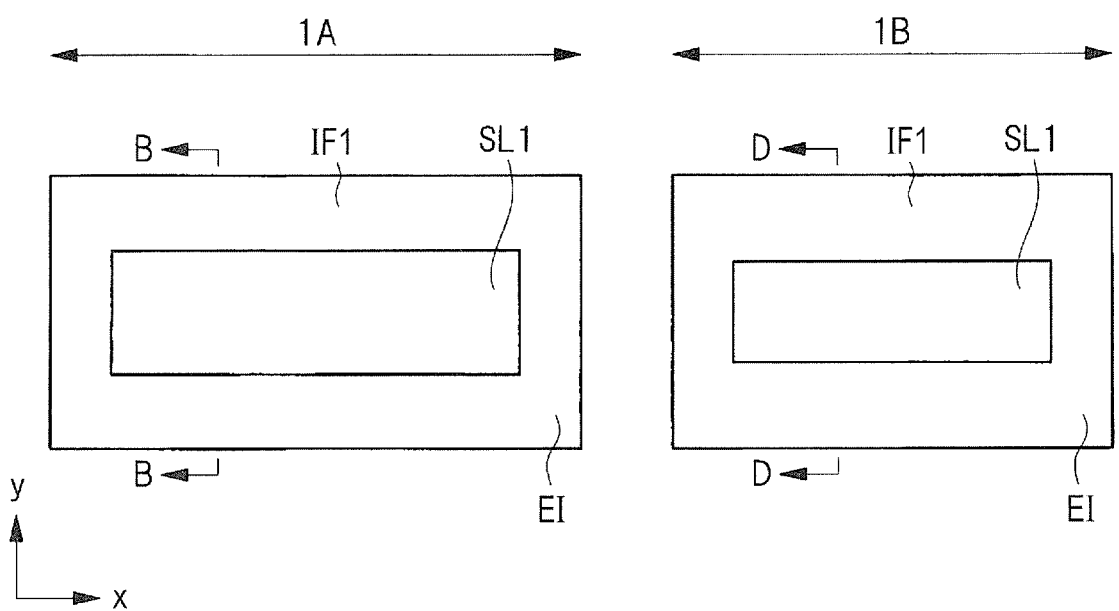
FIG. 6 is plan views for explaining a manufacturing step of the semiconductor device following FIG. 5.
Figure 7:
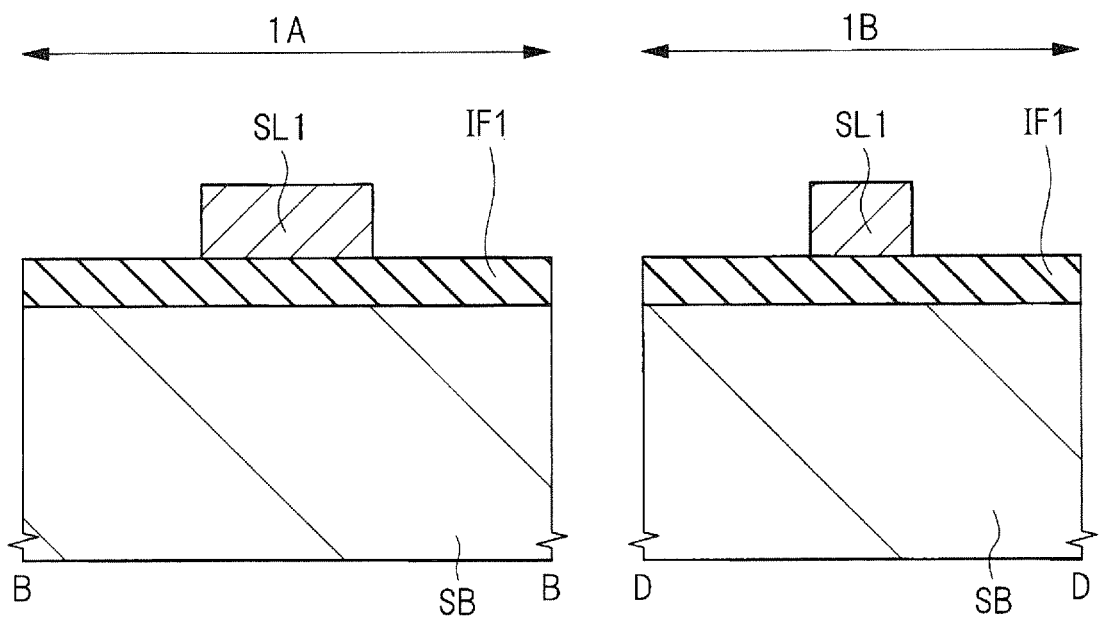
FIG. 7 is sectional views taken along B-B Line and D-D Line in FIG. 6, for explaining a manufacturing step of the semiconductor device following FIG. 5.

Subsequently, the amorphous silicon film SL1 is patterned by using a photolithography technique and a dry etching process, as illustrated in FIGS. 6 and 7. Thereby, the processed amorphous silicon film SL1 has a rectangular shape extending in the x direction in plan view. In each view, a single pattern of the amorphous silicon film SL1 is illustrated in each of the memory cell region 1A and the logic region 1B, but a plurality of the amorphous silicon films SL1 are arranged, in plan view, in a matrix pattern in each of the memory cell region 1A and the logic region 1B including the non-illustrated regions. The width in the y direction of the amorphous silicon film SL1 in the memory cell region 1A is larger than that in the y direction of the amorphous silicon film SL1 in the logic region 1B.

Figure 8:
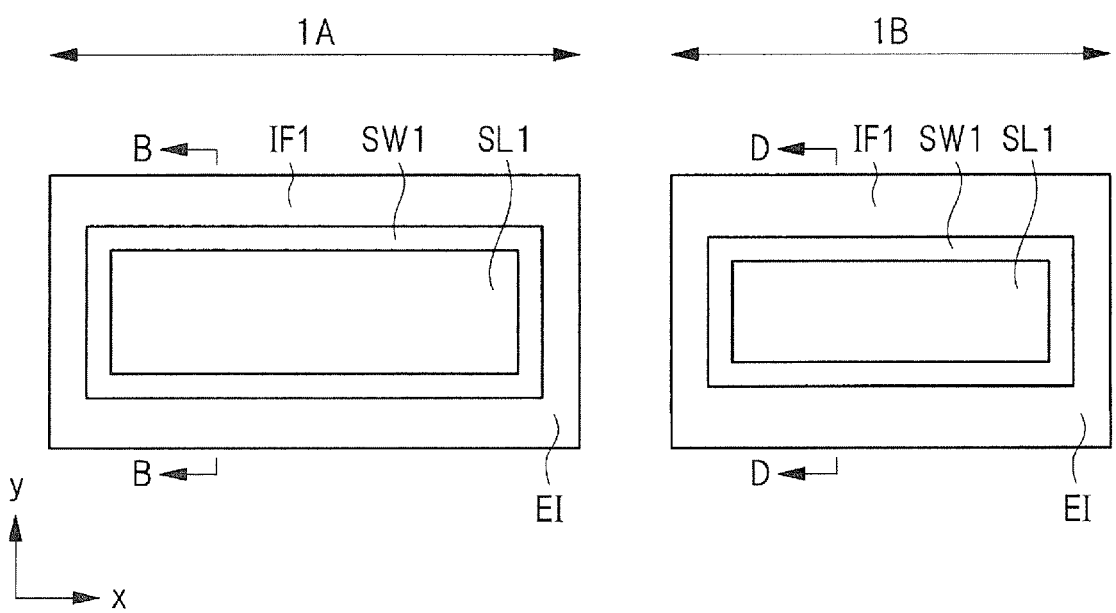
FIG. 8 is plan views for explaining a manufacturing step of the semiconductor device following FIG. 7.

Subsequently, a sidewall spacer SW1 that covers the sidewall of the amorphous silicon film SL1 is formed, as illustrated in FIGS. 8 and 9. Herein, after a silicon oxide film is formed over the amorphous silicon film SL1 and the insulating film IF1 by using, for example, a CVD process, the silicon oxide film is etched back, thereby allowing the sidewall spacer SW1 including the silicon oxide film to be formed. That is, the upper surfaces of the amorphous silicon film SL1 and the insulating film IF1 are exposed in the etching back. As illustrated in FIG. 8, the sidewall spacer SW1 has a rectangular annular structure in plan view.

Figure 11:
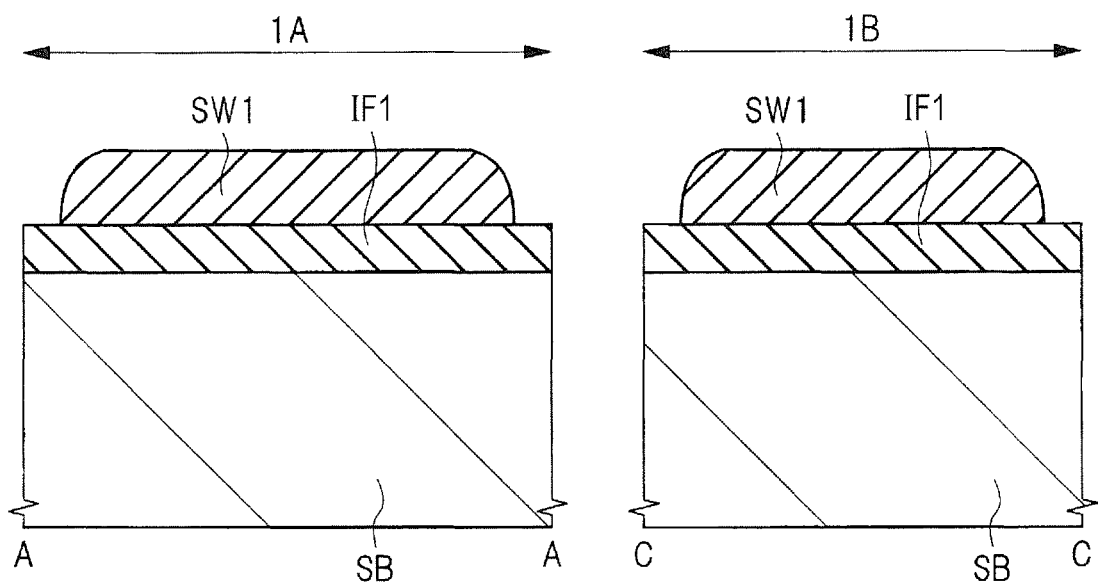
FIG. 11 is sectional views taken along A-A Line and C-C Line in FIG. 10, for explaining a manufacturing step of the semiconductor device following FIG. 9.
Figure 12:
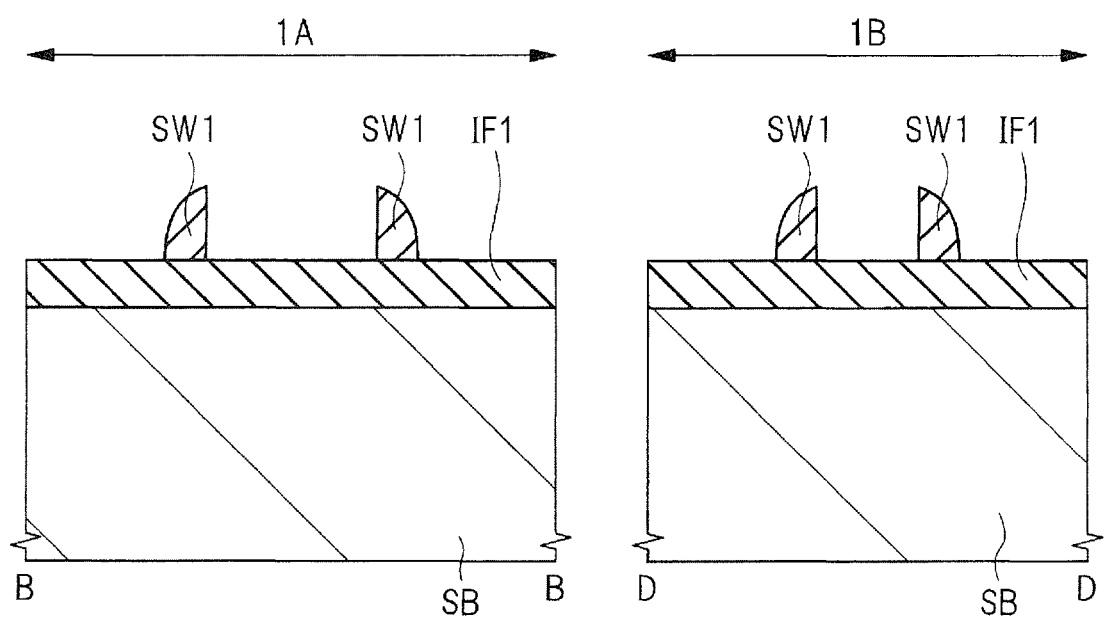
FIG. 12 is sectional views taken along B-B Line and D-D Line in FIG. 10, for explaining a manufacturing step of the semiconductor device following FIG. 9.

Subsequently, the amorphous silicon film SL1 is removed by performing, for example, wet etching, as illustrated in FIGS. 10 to 12. Thereby, the sidewall spacer SW1 having, in plan view, a rectangular frame shape is left over the insulating film IF1 in each of the memory cell region 1A and the logic region 1B.

Figure 13:
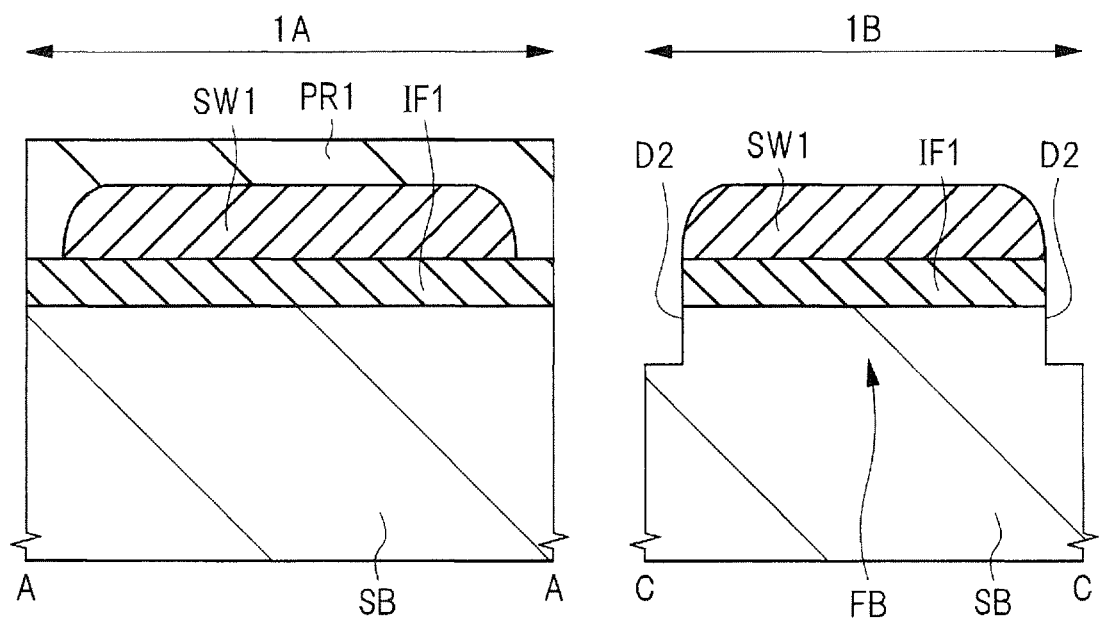
FIG. 13 is sectional views taken along A-A Line and C-C Line in FIG. 10, for explaining a manufacturing step of the semiconductor device following FIG. 12.
Figure 14:
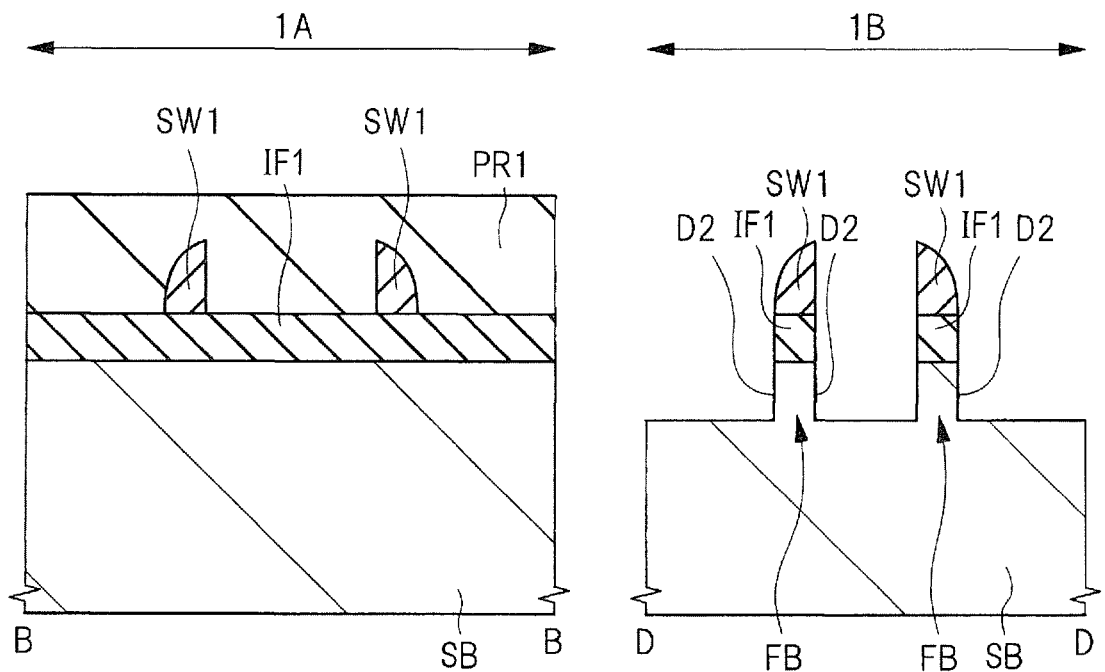
FIG. 14 is sectional views taken along B-B Line and D-D Line in FIG. 10, for explaining a manufacturing step of the semiconductor device following FIG. 12.

Subsequently, both the fin FB including part of the semiconductor substrate SB, the part including the upper surface of the semiconductor substrate SB, and the trench D2 around the fin FB are formed by processing, only in the logic region 1B, the insulating film IF1 and part of the upper surface of the semiconductor substrate SB, as illustrated in FIGS. 13 and 14. Herein, after the logic region 1B is exposed and a photoresist film PR1, which covers the sidewall spacer SW1 and the insulating film IF1 in the memory cell region 1A, is formed, dry etching is performed by using the photoresist film PR1 and the sidewall spacer SW1 in the logic region 1B as a mask.

Thereby, the plate-shaped fin FB protruding upward in the upper surface of the semiconductor substrate SB is formed by processing both the insulating film IF1 exposed from the sidewall SW1 in the logic region 1B and part of the upper surface of the semiconductor substrate SB. The plate-shaped pattern, which is part of the upper surface of the semiconductor substrate SB, includes two fins FB extending in the x direction and has, in plan view, a rectangular annular structure.

Figure 15:
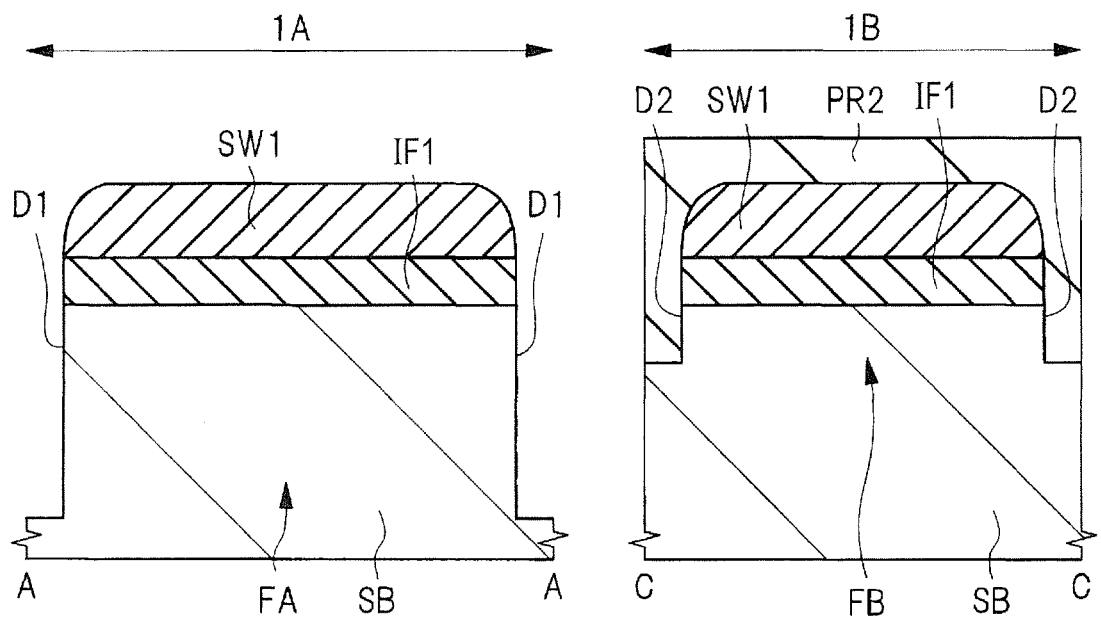
FIG. 15 is sectional views taken along A-A Line and C-C Line in FIG. 10, for explaining a manufacturing step of the semiconductor device following FIG. 14.
Figure 16:
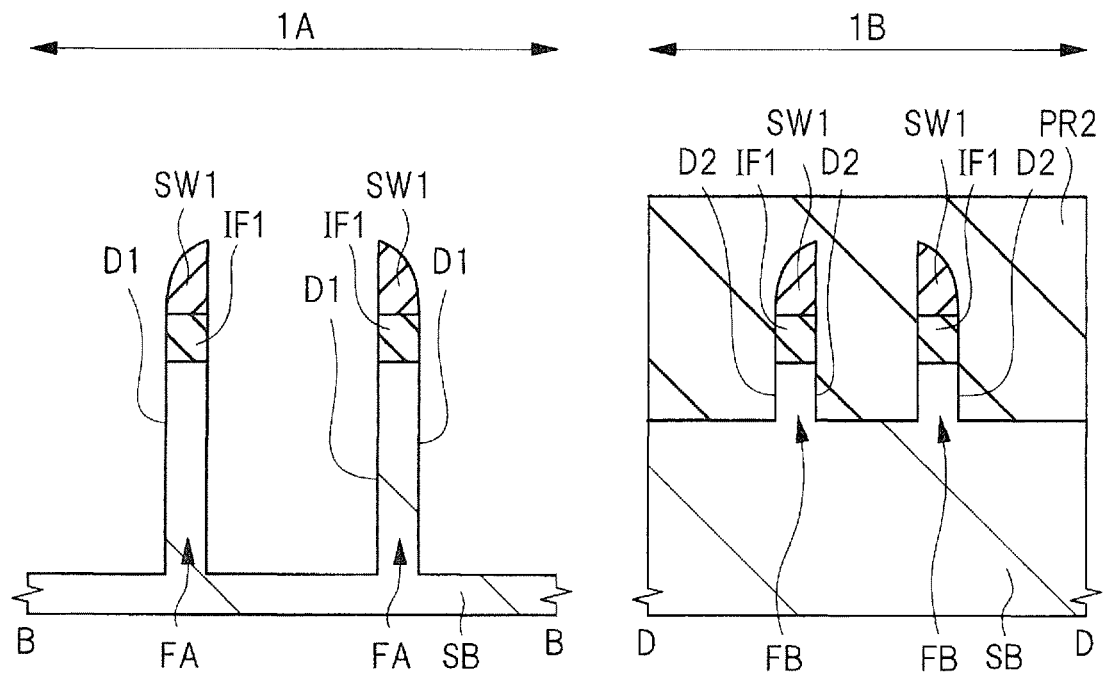
FIG. 16 is sectional views taken along B-B Line and D-D Line in FIG. 10, for explaining a manufacturing step of the semiconductor device following FIG. 14.

Subsequently, after the photoresist film PR1 is removed, both the fin FA including part of the semiconductor substrate SB, the part including the upper surface of the semiconductor substrate SB, and the trench D1 around the fin FA are formed by processing, only in the memory cell region 1A, the insulating film IF1 and part of the upper surface of the semiconductor substrate SB, as illustrated in FIGS. 15 and 16. Herein, after the memory cell region 1A is exposed and a photoresist film PR2, which covers the sidewall spacer SW1, the insulating film IF1, the fin FB, and the semiconductor substrate SB in the logic region 1B, is formed, dry etching is performed by using the photoresist film PR2 and the sidewall spacer SW1 in the memory cell region 1A as a mask.

Thereby, the plate-shaped fin FA protruding upward in the upper surface of the semiconductor substrate SB is formed by processing both the insulating film IF1 exposed from the sidewall spacer SW1 in the memory cell region 1A and part of the upper surface of the semiconductor substrate SB. The plate-shaped pattern, which is part of the upper surface of the semiconductor substrate SB, includes two fins FA extending in the x direction and has, in plan view, a rectangular annular structure.

The trenches D1 and D2 are trenches formed in the upper surface of the semiconductor substrate SB. In the direction perpendicular to the main surface of the semiconductor substrate, a distance DP1 between the upper surface of the semiconductor substrate SB, i.e., the upper surface of the fin FA, and the bottom surface of the trench D1 is larger than a distance DP2 between the upper surface of the semiconductor substrate SB, i.e., the upper surface of the fin FB, and the bottom surface of the trench D2. It has been described above that the trench D2 is formed by performing the steps described with reference to FIGS. 13 and 14 and then the trench D1 is formed by performing the steps described with reference to FIGS. 15 and 16, but the trench D1 may be formed prior to the formation of the trench D2.

Figure 17:
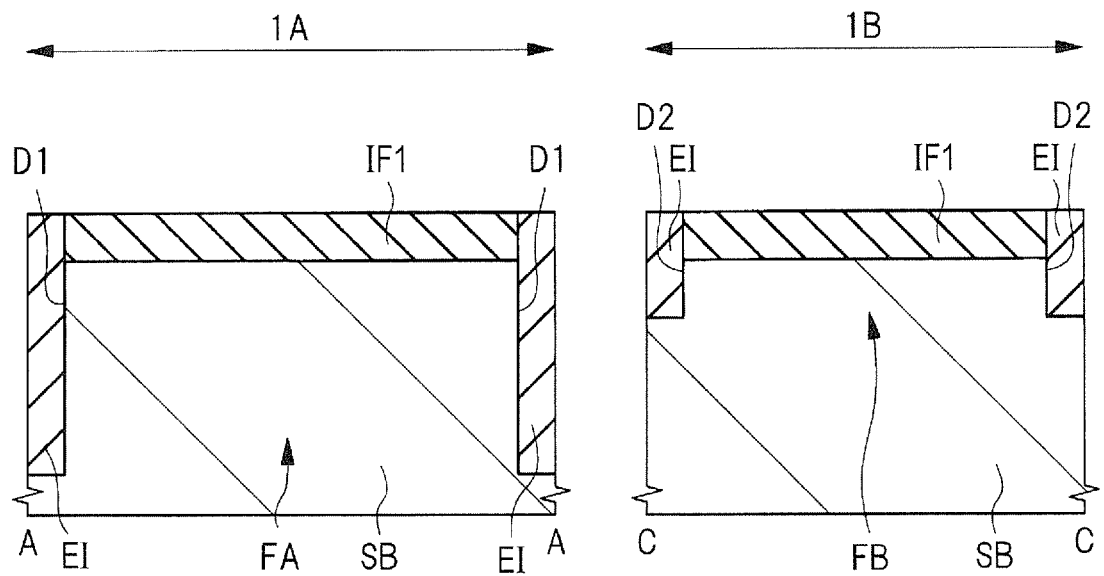
FIG. 17 is sectional views taken along A-A Line and C-C Line in FIG. 10, for explaining a manufacturing step of the semiconductor device following FIG. 16.

Subsequently, after the photoresist film PR2 is removed, an insulating film is embedded inside each of the trenches D1 and D2 by using, for example, a CVD process, as illustrated in FIGS. 17 and 18. The insulating film includes, for example, a silicon oxide film. Thereafter, the insulating film and the sidewall spacer SW1 are polished by using, for example, a CMP (Chemical Mechanical Polishing) process. Thereby, the upper surface of the insulating film IF1 in each of the memory cell region 1A and the logic region 1B is exposed, and the upper surface of the insulating film IF1 and that of the insulating film embedded in each of the trenches D1 and D2 are flattened. The sidewall spacer SW1 is removed by the polishing. The insulating film embedded in each of the trenches D1 and D2 forms the element isolation region EI.

Figure 20:
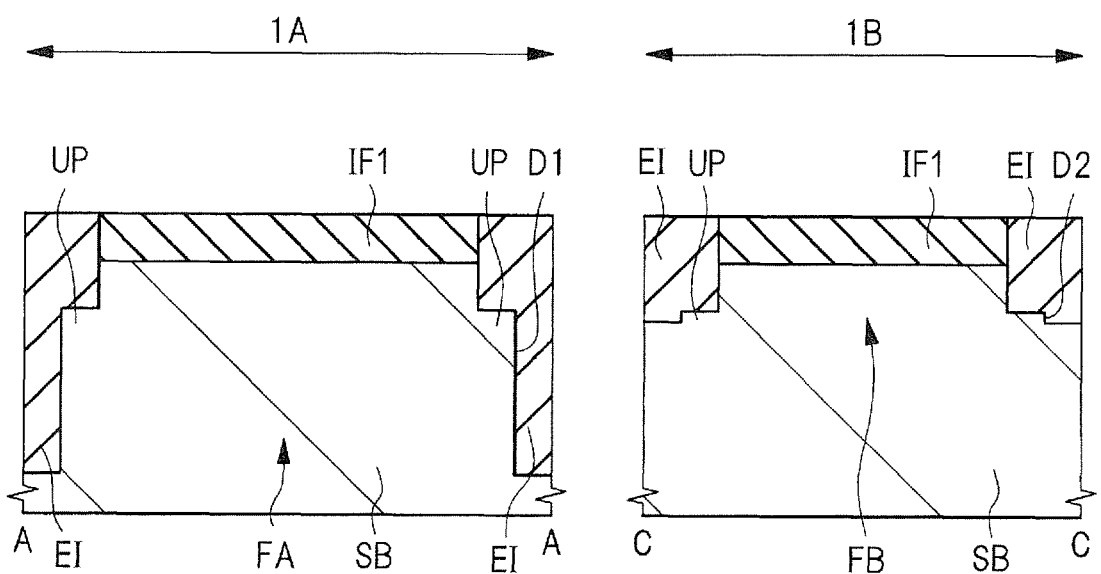
FIG. 20 is sectional views taken along A-A Line and C-C Line in FIG. 19, for explaining a manufacturing step of the semiconductor device following FIG. 18.

Subsequently, part of the insulating film IF1 exposed from the element isolation region EI and part of the plate-shaped pattern including the upper surface of the semiconductor substrate SB are removed by using a photolithography technique and a dry etching process, as illustrated in FIGS. 19 and 20. That is, in the memory cell region 1A, a portion of the plate-shaped pattern having a rectangular annular structure, the portion extending, for example, in the y direction, i.e., a portion that couples two fins FA lined up in the y direction is processed. Thereby, part of the upper portion of the pattern that forms the plate-shaped pattern and extends in the y direction is removed. In other words, the upper surface of the plate-shaped pattern extending in the y direction is etched back. Similarly, the ends of the fins FB lined up in the y direction, of the plate-shaped patterns in the logic region 1B, are coupled together, and part of the upper portion of the pattern extending in the y direction is removed, in this step. Although not illustrated, the pattern to be removed is arbitrary, and arbitrary fins FA and FB for finally forming a circuit can be formed in this removing step.

Subsequently, an insulating film including, for example, a silicon oxide film is embedded in the region where part of the insulating film IF1 and part of the plate-shaped pattern have been removed in the above steps, by using a CVD process, or the like. Thereafter, the upper surface of the insulating film is flattened and the upper surface of the insulating film IF1 is exposed by performing polishing using, for example, a CMP process.

In FIGS. 19 and 20, the boundary between the insulating film and the insulating film embedded, in the steps described with reference to FIGS. 17 and 18, inside each of the trenches D1 and D2 is not illustrated. These insulating films form the element isolation region EI. In FIG. 19, the outline of the plate-shaped pattern covered with the element isolation region EI is illustrated by dashed lines.

Figure 21:
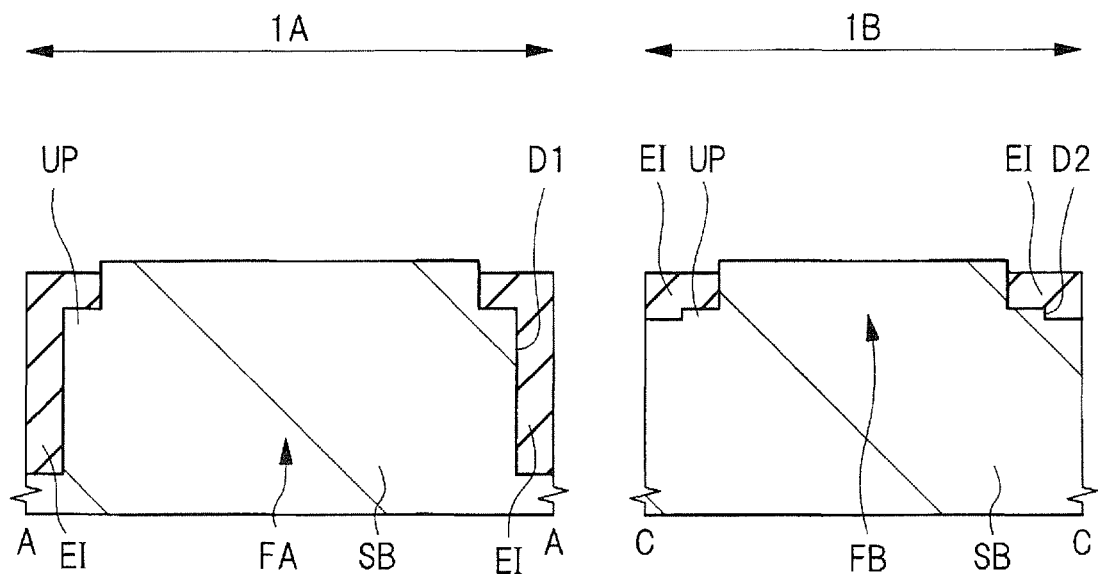
FIG. 21 is sectional views taken along A-A Line and C-C Line in FIG. 10, for explaining a manufacturing step of the semiconductor device following FIG. 20.
Figure 22:
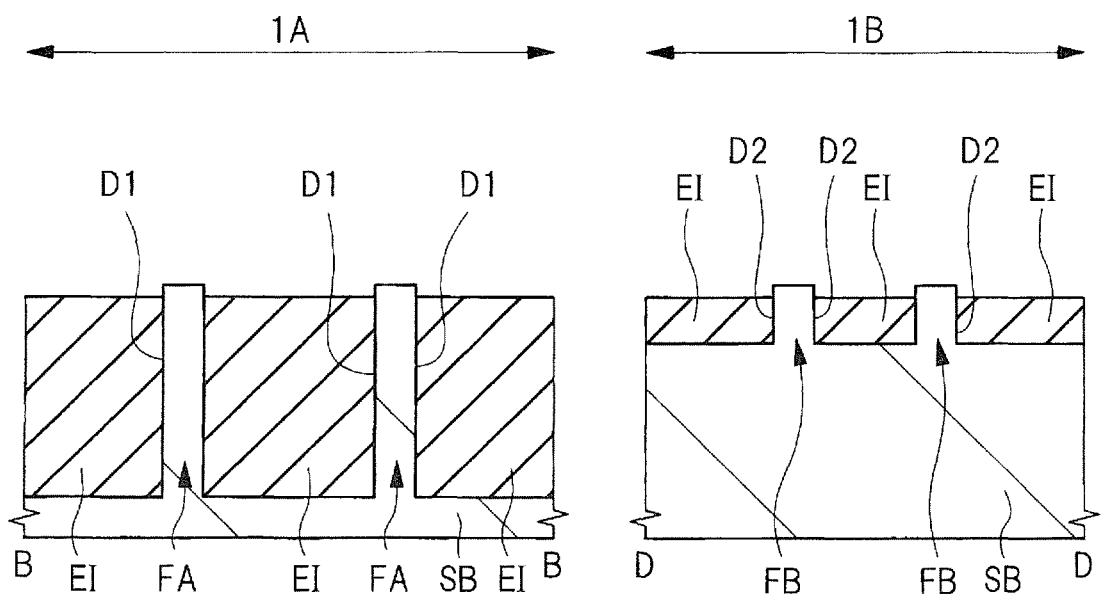
FIG. 22 is sectional views taken along B-B Line and D-D Line in FIG. 10, for explaining a manufacturing step of the semiconductor device following FIG. 20.

Subsequently, after the insulating film IF1 is removed by wet etching such that the upper surface of each of the fins FA and FB is exposed, the upper surface of the element isolation region EI is retreated by etching back, thereby allowing the sidewall of each of the fins FA and FB to be exposed from the element isolation region EI, as illustrated in FIGS. 21 and 22. The etching back may be performed by using either a dry etching process or a wet etching process. In this case, the lower pattern UP, which is part of the plate-shaped pattern and extends in the y direction, is not exposed from the element isolation region EI. That is, the semiconductor substrates SB exposed over the upper surface of the element isolation region EI is only the fins FA and FB each extending in the x direction.

The etching back to be performed on the upper surface of the element isolation region EI may be performed separately on the memory cell region 1A and the logic region 1B. In this case, the etching back is performed in a state where the region, on which the etching back is not to be performed, is covered with a photoresist film. Thus, a difference may be provided between the thickness of fin FA in the portion exposed from the element isolation region EI and that of the fin FB in the portion exposed from the element isolation region EI.

Because the trench D1 is deeper than the trench D2, the distance between the upper surface and the lower surface of the element isolation region EI embedded in the trench D1 is larger than that between the upper surface and the lower surface of the element isolation region EI embedded in the trench D2. However, when there is a difference between the thickness of the portion of the fin FA, the portion being exposed from the element isolation region EI, and that of the portion of the fin FB, the portion being exposed from the element isolation region EI, it can be considered, even in such a case, that the thicknesses of the element isolation regions EI in the memory cell region 1A and the logic region 1B may become equivalent to each other. In the direction perpendicular to the main surface of the semiconductor substrate SB, the length between the upper surface of the fin FA and the bottom surface of the element isolation region EI is larger than that between the upper surface of the fin FB and the bottom surface of the element isolation region EI.

One of the main characteristics of the present embodiment is that, by forming such a structure, a difference is provided between the isolation breakdown voltage of a high breakdown voltage element to be formed in the memory cell region 1A and that of a low breakdown voltage element to be formed in the logic region 1B.

Figure 23:
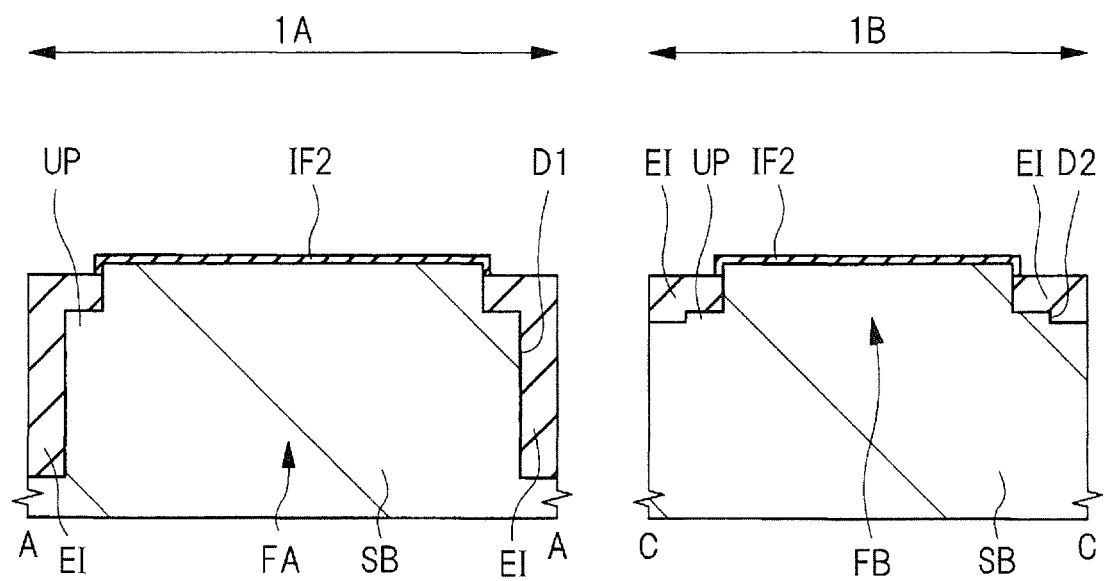
FIG. 23 is sectional views taken along A-A Line and C-C Line in FIG. 10, for explaining a manufacturing step of the semiconductor device following FIG. 22.
Figure 24:
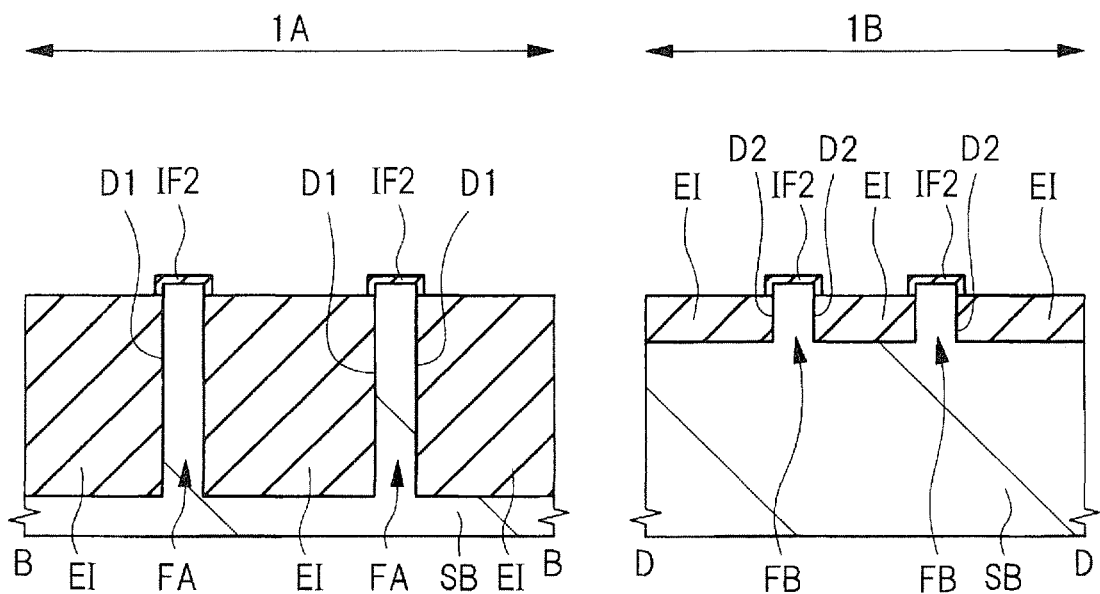
FIG. 24 is sectional views taken along B-B Line and D-D Line in FIG. 10, for explaining a manufacturing step of the semiconductor device following FIG. 22.

Subsequently, an insulating film IF2, which covers the surface of each of the fins FA and FB exposed from the element isolation region EI, is formed, as illustrated in FIGS. 23 and 24. The insulating film IF2 can be formed, for example, by thermal oxidation processing, and the film IF2 includes, for example, a silicon oxide film. The insulating film IF2 covers the upper surface and the sidewall of each of the fins FA and FB, and the upper surface of the element isolation region EI is exposed from the insulating film IF2.

Figure 25:
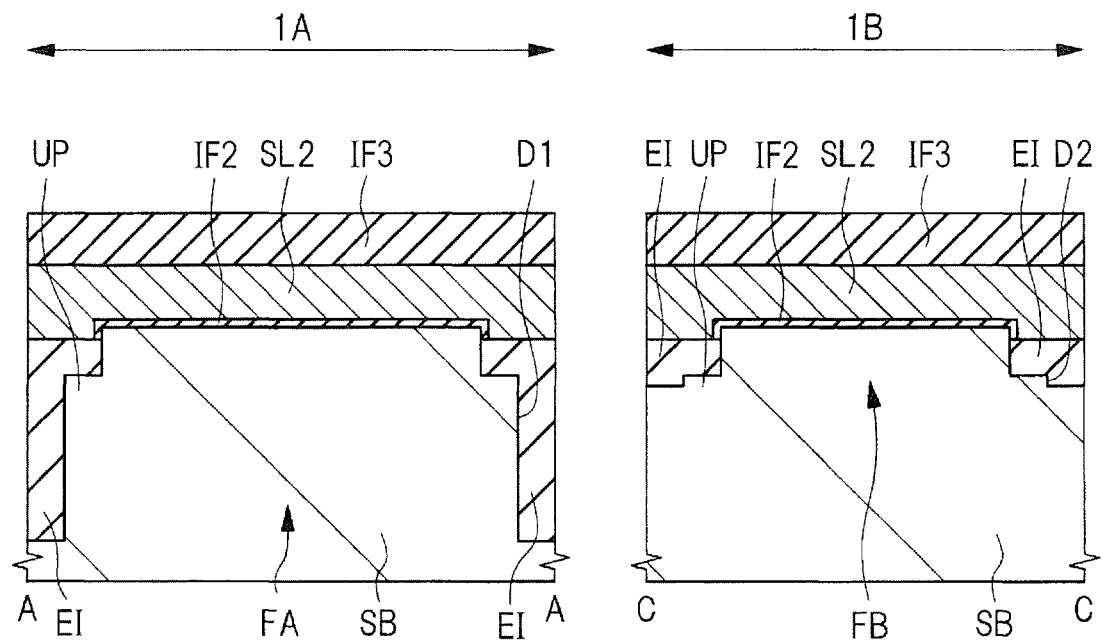
FIG. 25 is sectional views taken along A-A Line and C-C Line in FIG. 10, for explaining a manufacturing step of the semiconductor device following FIG. 24.
Figure 26:
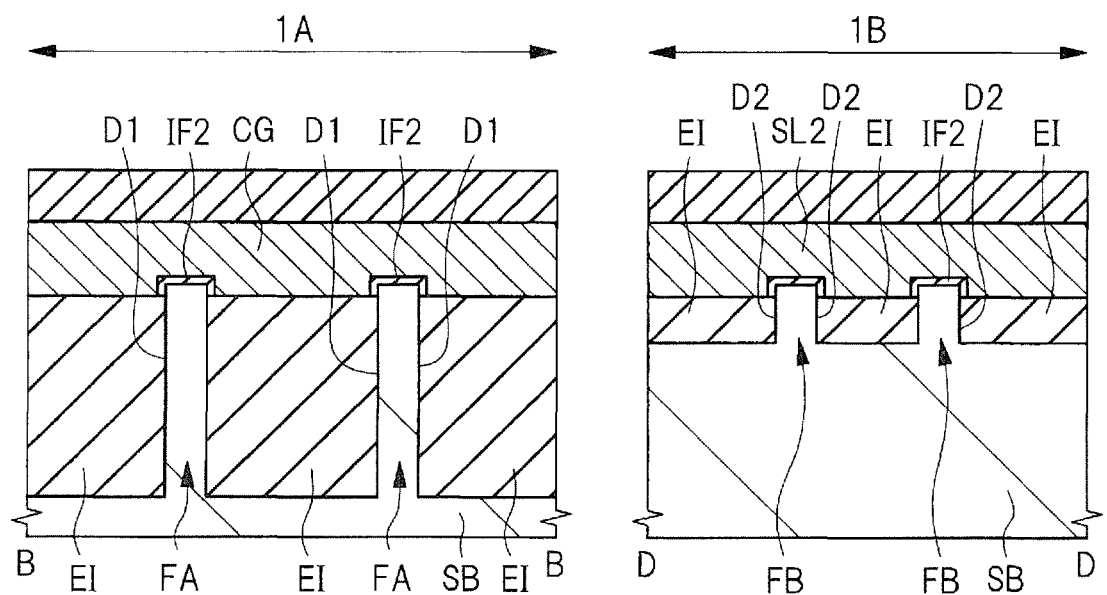
FIG. 26 is sectional views taken along B-B Line and D-D Line in FIG. 10, for explaining a manufacturing step of the semiconductor device following FIG. 24.

Subsequently, after a polysilicon film (conductor film) SL2 is formed over the element isolation region EI, the fins FA and FB, and the insulating film IF2 by using, for example, a CVD process, as illustrated in FIGS. 25 and 26, the upper surface of the polysilicon film SL2 is polished by a CMP process, or the like. Although not illustrated, a silicon oxide film covering the upper surface of the polysilicon film SL2 is subsequently formed by thermally oxidizing the upper surface thereof. Subsequently, an insulating film IF3 is formed over the polysilicon film SL2 by using, for example, a CVD process. The insulating film IF3 includes, for example, a silicon nitride film.

Figure 27:
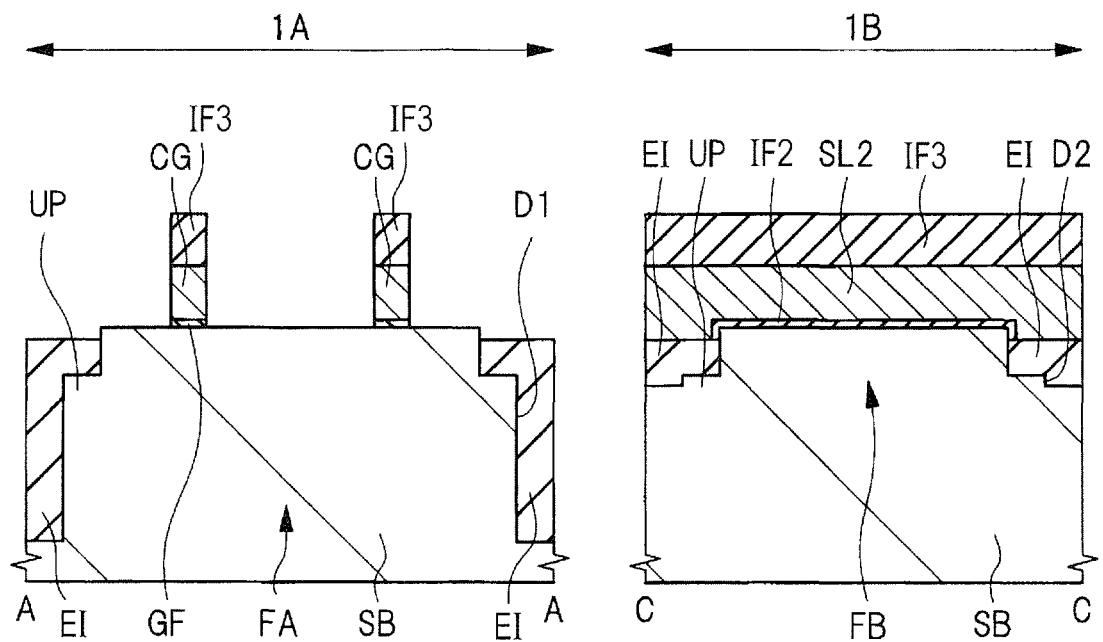
FIG. 27 is sectional views taken along A-A Line and C-C Line in FIG. 10, for explaining a manufacturing step of the semiconductor device following FIG. 26.

Subsequently, the insulating film IF3, the polysilicon film SL2, and the insulating film IF2 in the memory cell region 1A are processed by using a photolithography technique and a dry etching process, as illustrated in FIG. 27. That is, patterning is performed in a state where the logic region 1B is covered with a photoresist film (not illustrated). The photoresist film is removed after the patterning. Thereby, laminated patterns, each including the insulating film IF3, the polysilicon film SL2, and the insulating film IF2, are formed directly over the fin FA so as to be lined up in the x direction. With this patterning, the control gate electrode CG including the polysilicon film SL2 is formed, and the gate insulating film GF including the insulating film IF2 is formed.

The laminated pattern, including the insulating film IF3 and the control gate electrode CG, extends in the y direction, and is arranged to stretch over the fins FA and the gate insulating film GF. Of the memory cell region 1A, in the region other than the place where the laminated pattern is formed, the surface of the fin FA and the upper surface of the element isolation region EI are exposed by removing, in the memory cell region 1A, the insulating film IF3, the polysilicon film SL2, and the insulating film IF2 with the above etching.

Figure 28:
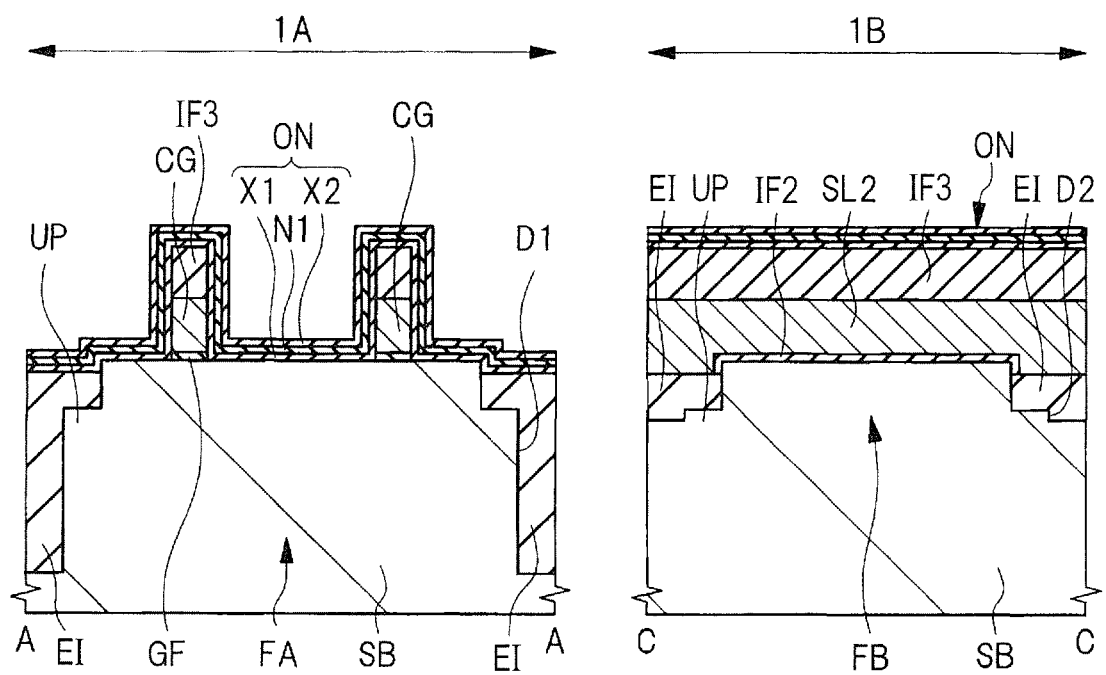
FIG. 28 is sectional views for explaining a manufacturing step of the semiconductor device following FIG. 27.

Subsequently, both the surface of the fin FA exposed from the gate insulating film GF and the sidewall of the control gate electrode CG are oxidized by performing thermal oxidation processing, as illustrated in FIG. 28. Thereby, the silicon oxide film (bottom oxide film) X1, which covers the surface of the fin FA and the sidewall of the control gate electrode CG, is formed. In FIG. 28, the silicon oxide film X1, which is formed continuously from the surface of the fin FA to the sidewall of the control gate electrode CG, is illustrated, but the silicon oxide film X1 may not be formed over the sidewall of the gate insulating film GF.

Subsequently, the silicon nitride film N1 is formed over the silicon oxide film X1 and the insulating film IF1 by using, for example, a CVD process. The silicon nitride film N1 functions as a trap insulating film for storing charges in the later-formed memory cell. It has been described above that the silicon nitride film N1 is formed as a charge storage film, but the material of the charge storage film is not limited to a silicon nitride film, and an insulating film including, for example, HfSiO(s) (hafnium silicate) may be formed. Subsequently, the silicon oxide film (top oxide film) X2 is formed over the silicon nitride film N1 by using, for example, a CVD process.

The laminated film, including the silicon oxide film X1, the silicon nitride film N1, and the silicon oxide film X2 that are sequentially formed over the semiconductor substrate SB, forms the ONO film ON. The ONO film ON, which contacts the sidewall of the control gate electrode CG, includes the silicon oxide film X1, the silicon nitride film N1, and the silicon oxide film X2 that are formed in the x direction sequentially from the control gate electrode CG side. Herein, the material of the uppermost top oxide film of the ONO film ON is not limited to silicon oxide, and for example, alumina ($Al_2O_3$) may be used.

Figure 29:
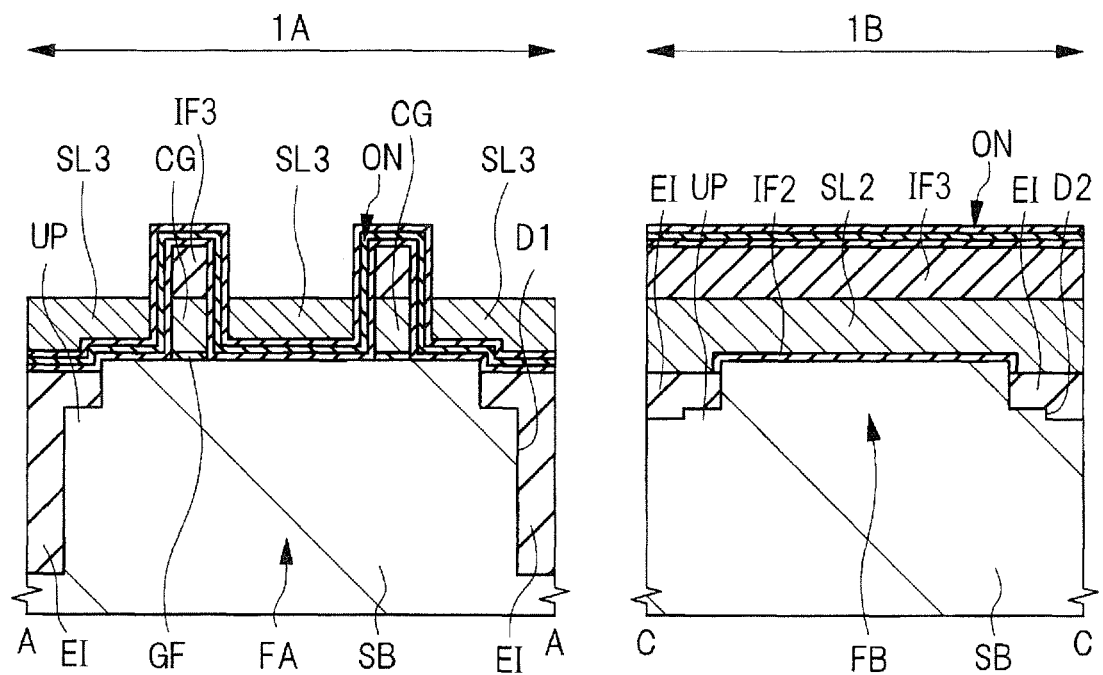
FIG. 29 is sectional views for explaining a manufacturing step of the semiconductor device following FIG. 28.

Subsequently, a polysilicon film SL3 is formed over the ONO film ON by using, for example, a CVD process, as illustrated in FIG. 29. The thickness of the polysilicon film SL3 is at least larger than or equal to the thickness of the control gate electrode CG. Herein, the laminated film including the control gate electrode CG, the insulating film IF3, and the ONO film ON is covered by forming the polysilicon film SL3 to have a thickness larger than that of the laminated film including the control gate electrode CG and the insulating film IF3. Thereafter, the upper surface of the polysilicon film SL3 is flattened by using a CMP process, or the like.

Subsequently, the upper surface of the polysilicon film SL3 is retreated by performing etching back, and for example, the height of the upper surface of the polysilicon film SL3 and that of the upper surface of the control gate electrode CG are made equal to each other. Thereby, the insulating film IF3 and the ONO film ON that covers the insulating film IF3 protrude over the upper surface of the polysilicon film SL3. The above polysilicon film SL3 in the logic region 1B is removed by the flattening step and etching back step on the polysilicon film SL3.

Figure 30:
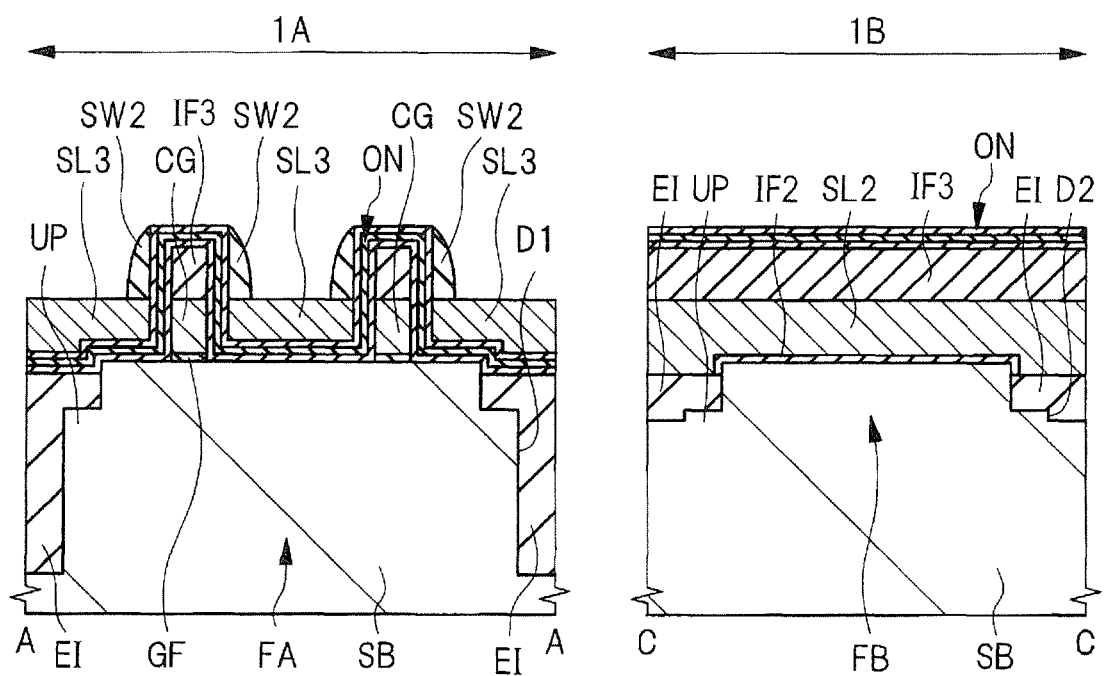
FIG. 30 is sectional views for explaining a manufacturing step of the semiconductor device following FIG. 29.

Subsequently, an insulating film is formed over the ONO film ON and the polysilicon film SL3 by using, for example, a CVD process, as illustrated in FIG. 30. The insulating film includes, for example, a silicon nitride film, and the thickness thereof is, for example, 10 to 50 nm. Subsequently, the upper surface of the polysilicon film SL3 and that of the ONO film ON directly over the insulating film IF3 are exposed from the insulating film by performing dry etching. Thereby, a sidewall spacer SW2 including the insulating film is formed over the sidewall of the insulating film IF3 via the ONO film ON. The insulating film in the logic region 1B is removed in the dry etching step.

Figure 31:
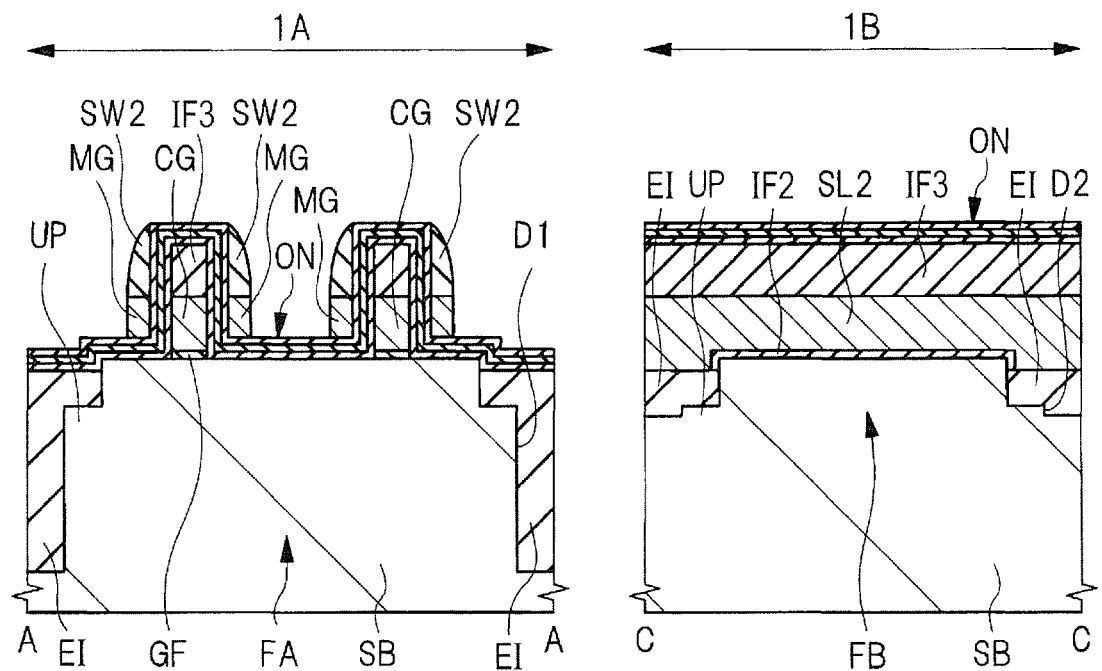
FIG. 31 is sectional views for explaining a manufacturing step of the semiconductor device following FIG. 30.

Subsequently, the polysilicon film SL3 is processed by performing dry etching with the use of the sidewall spacer SW2 as a hard mask, as illustrated in FIG. 31. Thereby, the upper surface of the ONO film ON that contacts the surface of the fin FA is exposed from the polysilicon film SL3. The memory gate electrodes MG, each including the pattern of the polysilicon film SL3, are formed beside and on both sides of the control gate electrode CG via the ONO film ON. However, the memory gate electrode MG adjacent to the sidewall on one side of the control gate electrode CG is a pattern to be removed in a later step, and hence it is not left in the completed semiconductor device.

Figure 32:
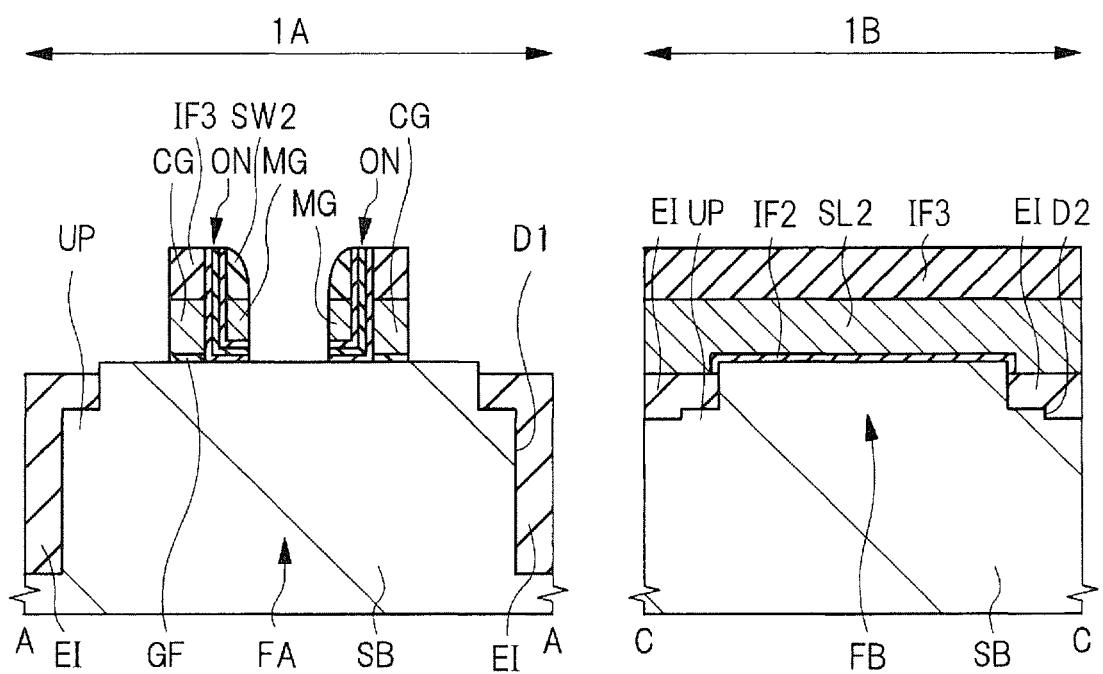
FIG. 32 is sectional views for explaining a manufacturing step of the semiconductor device following FIG. 31.

Subsequently, the memory gate electrode MG, which is adjacent to the sidewall on one side of the laminated film including the control gate electrode CG and the insulating film IF3, and the sidewall spacer SW2 directly over the memory gate electrode MG are removed by using a photolithography technique and an etching process, as illustrated in FIG. 32. Thereby, the memory gate electrode MG adjacent to the sidewall on the other side of the control gate electrode CG is left. Subsequently, the ONO film ON exposed from the control gate electrode CG and the memory gate electrode MG is removed.

That is, the ONO film ON is left only: between the memory gate electrode MG and the fin FA; between the memory gate electrode MG and the control gate electrode CG; and between the sidewall spacer SW and the insulating film IF3. Accordingly, in the memory cell region 1A, the surfaces of the fin FA and the element isolation region EI are exposed from the ONO film ON in the region where the surfaces thereof are exposed from the control gate electrode CG and the memory gate electrode MG. The upper surface and one sidewall of the insulating film IF3 are exposed in each of the memory cell region 1A and the logic region 1B.

The ONO film ON extending along the upper surface of the fin FA, i.e., along the semiconductor substrate SB, and the ONO film ON extending along the sidewall of the control gate electrode CG, are continuously formed, and have an L-shaped sectional surface. One pair of patterns, each having the control gate electrode CG and the memory gate electrode MG adjacent to the control gate electrode CG via the ONO film ON, are formed over the fin FA, and one pair of the memory gate electrodes MG face each other between one pair of the control gate electrodes CG. Subsequently, oxidation processing may be performed on the surface of the fin FA, in order to prevent the fin FA from being damaged in an impurity implantation step that will be performed later on the fin FA, and the like.

Figure 33:
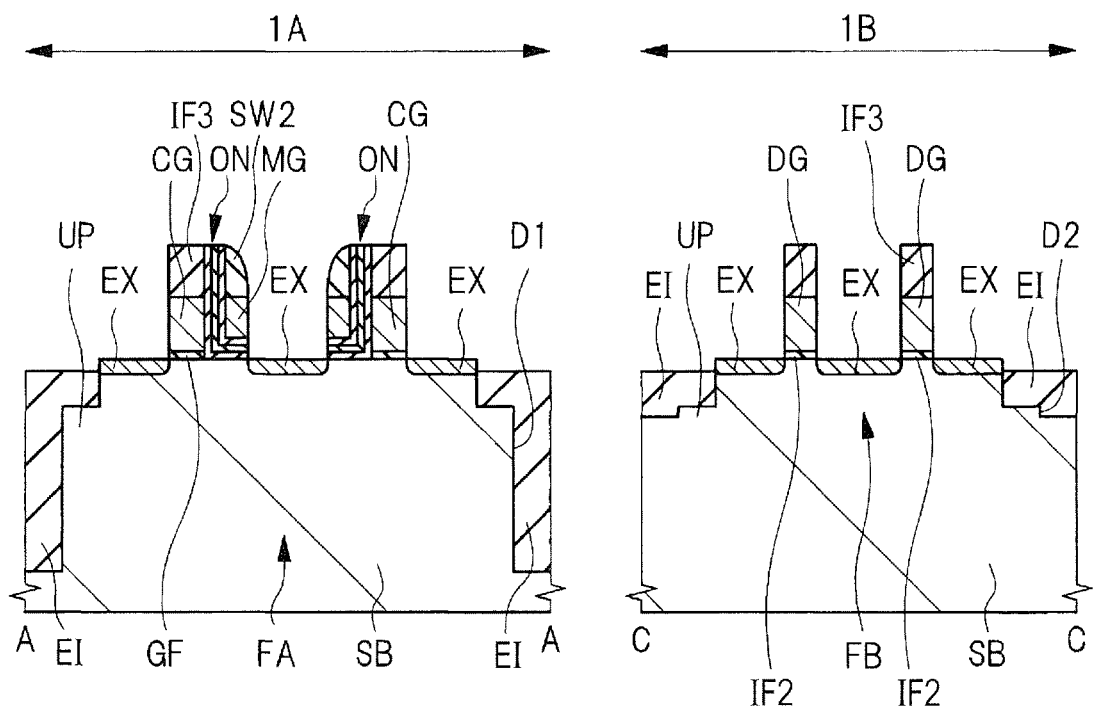
FIG. 33 is sectional views for explaining a manufacturing step of the semiconductor device following FIG. 32.

Subsequently, after the pattern of a photoresist film (not illustrated), which covers the memory cell region 1A and exposes part of the logic region 1B, is formed, the insulating film IF3 in the logic region 1B is processed and subsequently the polysilicon film SL2 is processed by performing dry etching with the use of the photoresist film as a mask, as illustrated in FIG. 33. Thereby, one pair of laminated films, each including both a dummy gate electrode DG including the polysilicon film SL2 and the insulating film IF3 over the dummy gate electrode DG, are formed directly over the fin FB so as to be lined up in the x direction. The fin FB and the element isolation region EI are exposed in the region beside these laminated films. That is, the dummy gate electrode DG and the insulating film IF3 are formed over the fin FB via the insulating film IF2. The dummy gate electrode DG is a pseudo gate electrode to be removed in a later step, and hence it is not left in the completed semiconductor device.

Subsequently, after the above photoresist film is removed, n-type impurities (e.g., P (phosphorus) or As (arsenic)) are implanted into the upper surface of each of the fins FA and FB by performing an ion implantation step with the use of the insulating film IF3, the sidewall spacer SW2, and the ONO film ON as a mask. Thereby, a plurality of extension regions EX, each of which is an n-type semiconductor region having a relatively low impurity concentration, are formed. The extension region EX in the memory cell region 1A is formed in the upper surface of the fin FA beside the pattern having the control gate electrode CG and the memory gate electrode MG adjacent to the control gate electrode CG via the ONO film ON. The extension region EX in the logic region 1B is formed in the upper surface of the fin FB beside the dummy gate electrode DG. Herein, p-type impurities (e.g., B (boron)) may be implanted into the fins FA and FB as halo implantation, if necessary.

Figure 34:
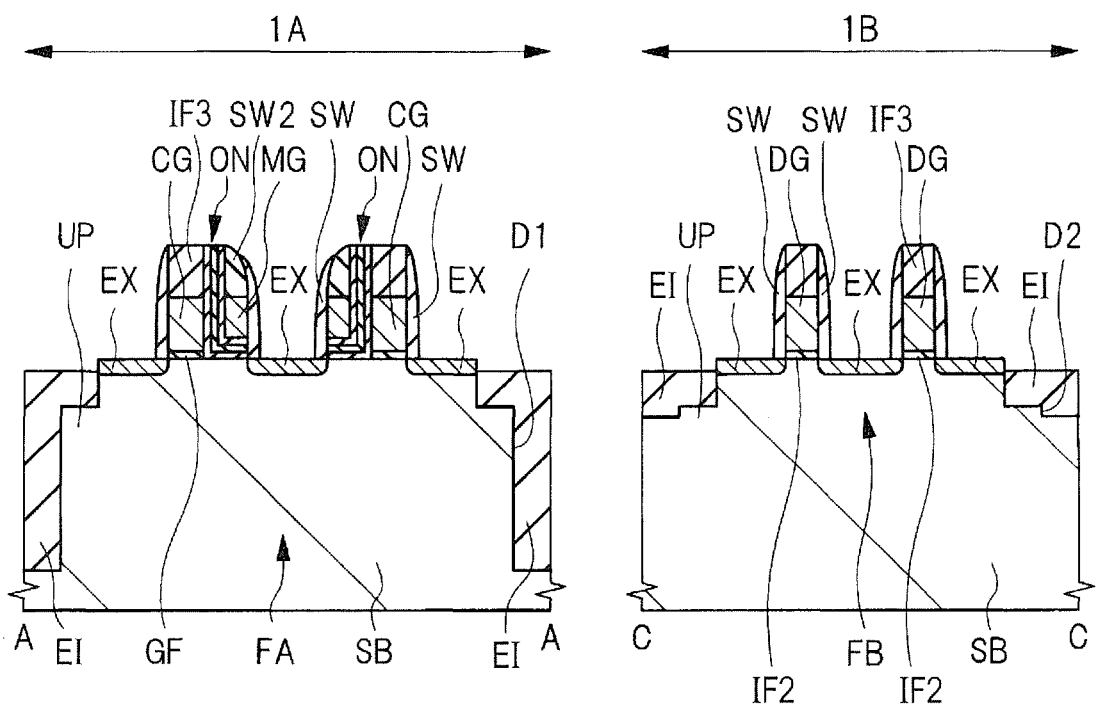
FIG. 34 is sectional views for explaining a manufacturing step of the semiconductor device following FIG. 33.

Subsequently, an insulating film is formed over the semiconductor substrate SB by using, for example, a CVD process, as illustrated in FIG. 34. The insulating film includes, for example, a silicon oxide film, a silicon nitride film, or a laminated film thereof. Subsequently, the upper surface of each of the fins FA and FB and the insulating film IF3 is exposed from the insulating film by performing dry etching. Thereby, in the memory cell region 1A, the sidewall spacers SW, each including the above insulating film, are formed over the sidewalls on both sides of the pattern including the control gate electrode CG, the memory gate electrode MG, the ONO film ON, the insulating film IF3 and the sidewall spacer SW2. In the logic region 1B, the sidewall spacers SW, each including the above insulating film, are formed over the sidewalls on both sides of the laminated film including the dummy gate electrode DG and the insulating film IF3.

Figure 35:
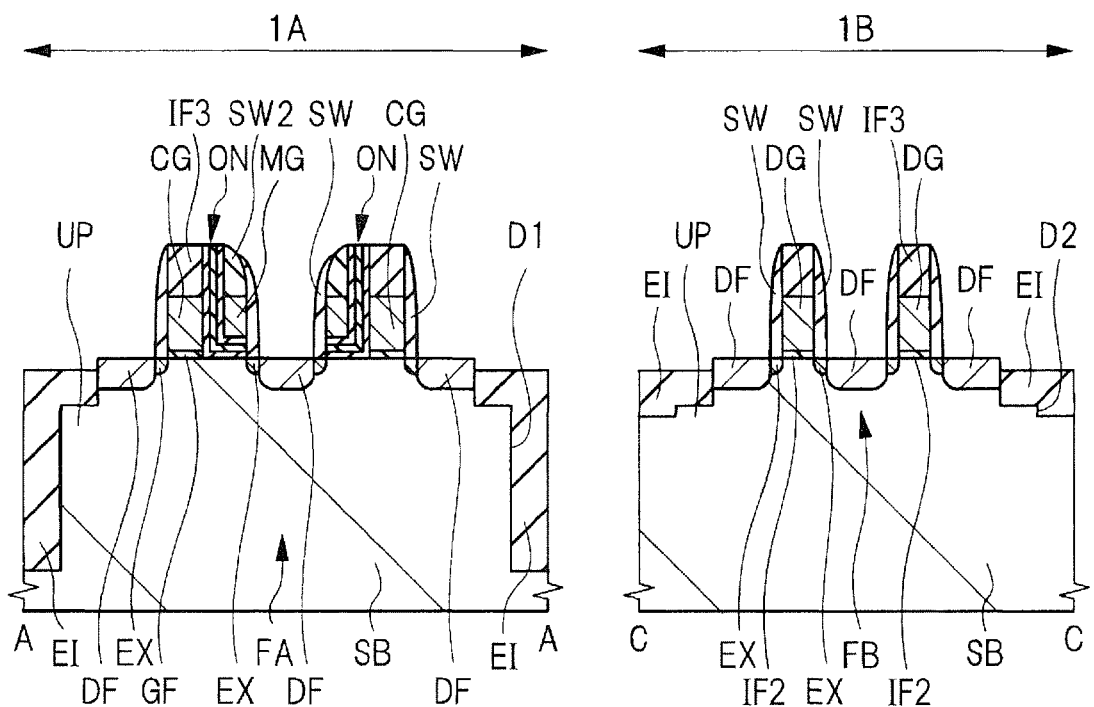
FIG. 35 is sectional views for explaining a manufacturing step of the semiconductor device following FIG. 34.

Subsequently, n-type impurities (e.g., P (phosphorus) or As (arsenic)) are implanted into the upper surface of each of the fins FA and FB by performing an ion implantation step with the use of the insulating film IF3, the sidewall spacers SW and SW2, and the ONO film ON as a mask, as illustrated in FIG. 35. Thereby, a plurality of the diffusion layers DF, each of which is an n-type semiconductor region having a relatively high impurity concentration, are formed. The diffusion layer DF in the memory cell region 1A is formed in the upper surface of the fin FA beside the pattern having the control gate electrode CG and the memory gate electrode MG adjacent to the control gate electrode CG via the ONO film ON. The diffusion layer DF in the logic region 1B is formed in the upper surface of the fin FB beside the dummy gate electrode DG.

The diffusion layer DF is formed at a position farther from the control gate electrode CG, the memory gate electrode MG, or the dummy gate electrode DG in the x direction than the position where the extension region EX that contacts the diffusion layer DF is formed. The diffusion layer DF is formed to be deeper than the extension region EX, and has a higher n-type impurity concentration. The extension region EX and the diffusion layer DF, which contact each other, form the source/drain region of a transistor. Thereafter, a heat treatment is performed if necessary to activate the impurities in each of the extension region EX and the diffusion layer DF.

It has been described above that the source/drain regions in the respective memory cell region 1A and logic region 1B are formed in the same step, but it can be considered that, in the memory cell region 1A where a memory cell, the breakdown voltage of which is higher than that of a transistor formed in the logic region 1B, is formed, the impurity concentration of the source/drain region is made higher than that of the source/drain region in the logic region. Accordingly, the steps of forming the extension region EX and the diffusion layer D in the memory cell region 1A may be performed separately from those in the logic region 1B. It has also been described above that a source/drain region id formed by ion implantation, but instead of ion implantation, an epitaxial layer into which impurities have been introduced may be formed over the surface of a fin beside each gate electrode by using an epitaxial growth process.

Figure 36:
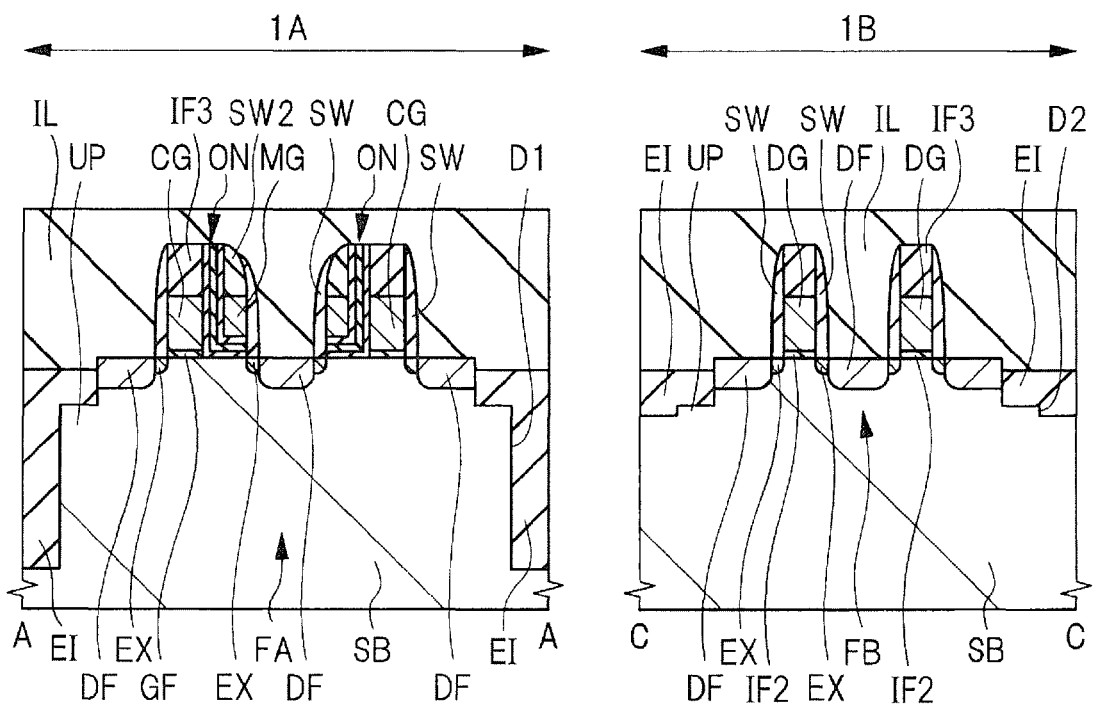
FIG. 36 is sectional views for explaining a manufacturing step of the semiconductor device following FIG. 35.

Subsequently, an insulating film (not illustrated) including a silicon nitride having, for example, a thickness of 5 to 20 nm and the interlayer insulating film IL including, for example, a silicon oxide film are sequentially formed over the semiconductor substrate SB by using, for example, a CVD process, as illustrated in FIG. 36. The interlayer insulating film IL has a thickness larger than at least that of the control gate electrode CG, and herein has a thickness larger than that of the laminated film including the gate insulating film GF, the control gate electrode CG, and the insulating film IF3.

Figure 37:
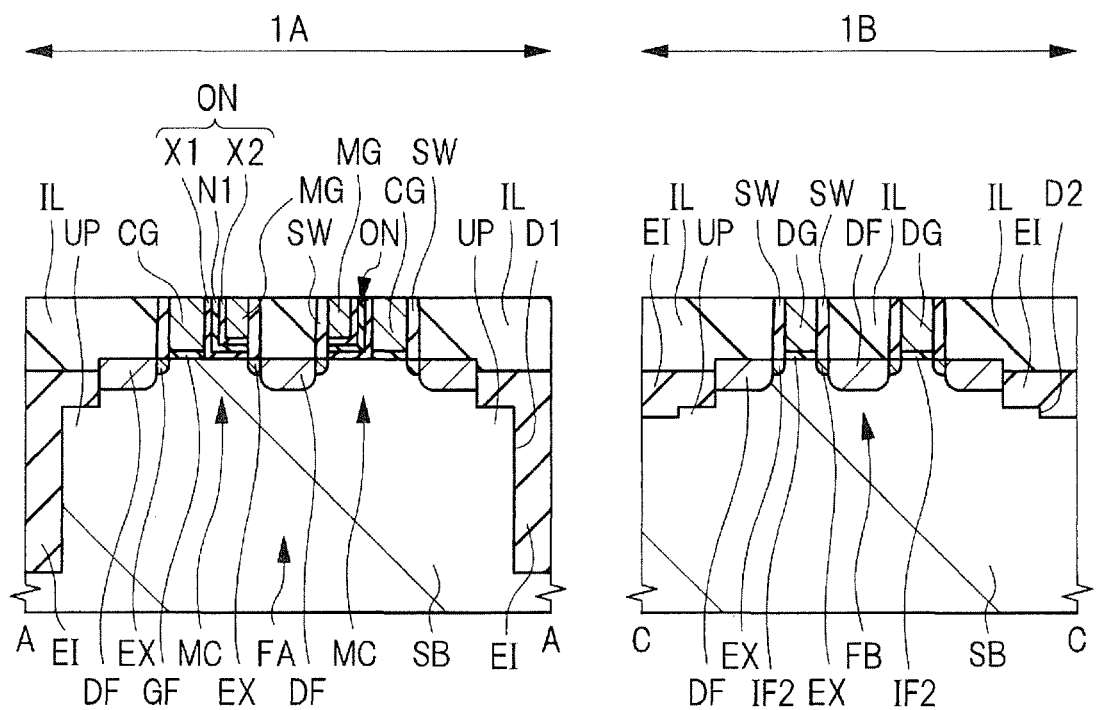
FIG. 37 is sectional views taken along A-A Line and C-C Line in FIG. 10, for explaining a manufacturing step of the semiconductor device following FIG. 36.
Figure 38:
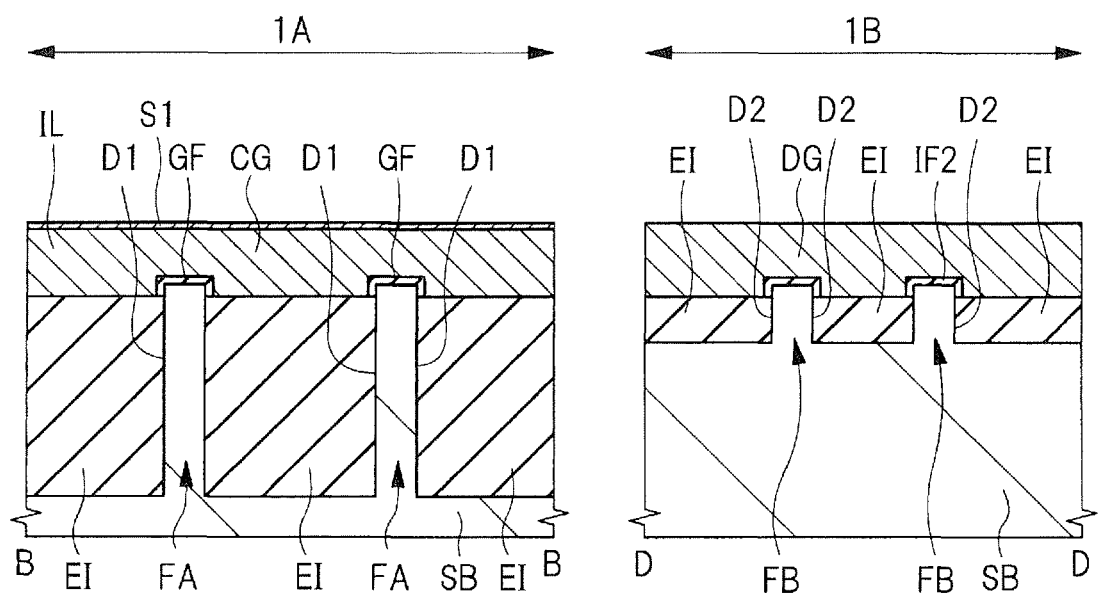
FIG. 38 is sectional views taken along B-B Line and D-D Line in FIG. 10, for explaining a manufacturing step of the semiconductor device following FIG. 36.

Subsequently, the upper surface of the interlayer insulating film IL is flattens by polishing using, for example, a CMP process, as illustrated in FIGS. 37 and 38. In the polishing step, all of the insulating film IF3 and the sidewall spacer SW2 are removed, part of the upper portion of each of the sidewall spacer SW and the ONO film ON is removed, and the upper surface of each of the control gate electrode CG, the memory gate electrode MG, and the dummy gate electrode DG is exposed. That is, the respective upper surfaces of the control gate electrode CG, the memory gate electrode MG, the dummy gate electrode DG, the ONO film ON, the sidewall spacer SW, and the interlayer insulating film IL are flattened on almost the same flat surface, and their heights are made equal to each other.

The control gate electrode CG and the memory gate electrode MG, the upper surfaces of which are exposed in this step, and the source/drain region, including the extension region EX and the diffusion layer DF that are formed on both sides of the pattern including the control gate electrode CG and the memory gate electrode MG, form the split gate type memory cell MC. That is, the memory cell MC forms a MONOS-type nonvolatile memory including both the first transistor having the control gate electrode CG and the second transistor having the memory gate electrode MG.

As illustrated in FIG. 38, the control gate electrode CG in the memory cell region 1A extends in the y direction so as to stretch over the fins FA, directly over each of the fin FA and the element isolation region EI. The control gate electrode CG is also formed to fill the space between the fins FA each protruding over the element isolation region EI. The dummy gate electrode DG in the logic region 1B extends in the y direction so as to stretch over the fins FB, directly over each of the fin FB and the element isolation region EI. The dummy gate electrode DG is also formed to fill the space between the fins FB each protruding over the element isolation region EI.

Figure 39:
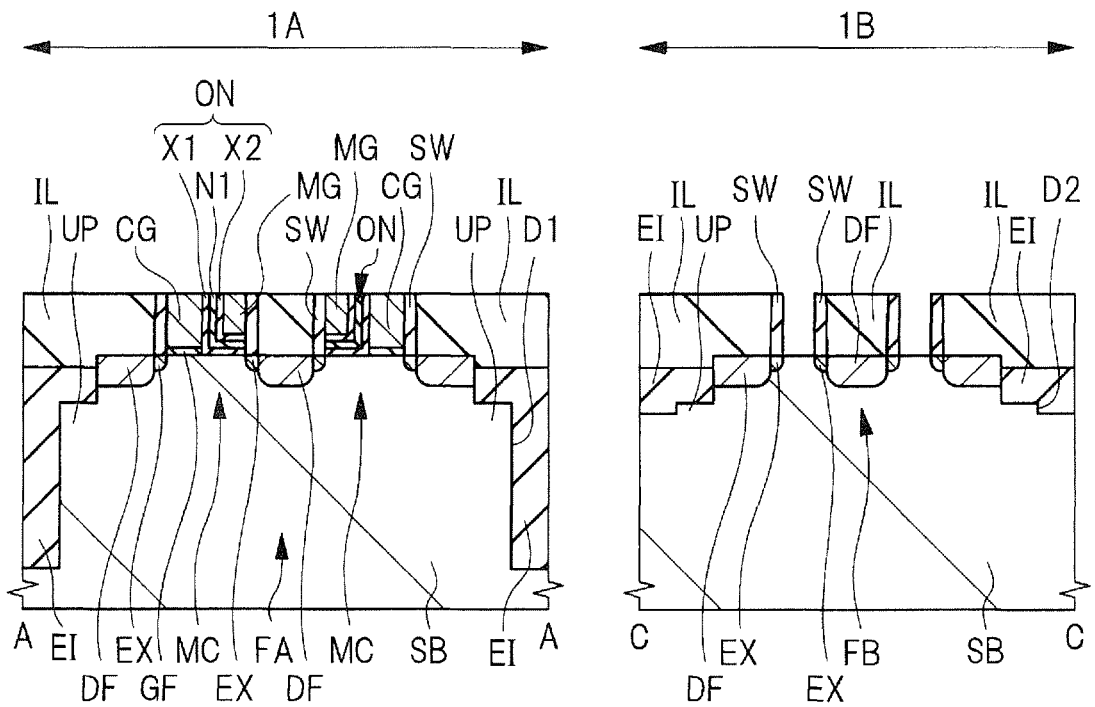
FIG. 39 is sectional views taken along A-A Line and C-C Line in FIG. 10, for explaining a manufacturing step of the semiconductor device following FIG. 38.

Subsequently, the dummy gate electrode DG is removed by performing wet etching in a state where the control gate electrode CG and the memory gate electrode MG in the memory cell region 1A are protected by a photoresist film (not illustrated), as illustrated in FIG. 39. Subsequently, the insulating film IF2 is removed. Alternatively, the insulating film IF2 may not be remove to use as part of the gate insulating film to be formed in the logic region 1B in a later step. In the logic region 1B, a trench is formed in the region where the dummy gate electrode DG and the insulating film IF2 have been removed in the above removal step. Thereafter, the above photoresist film in the memory cell region 1A is removed.

Figure 40:
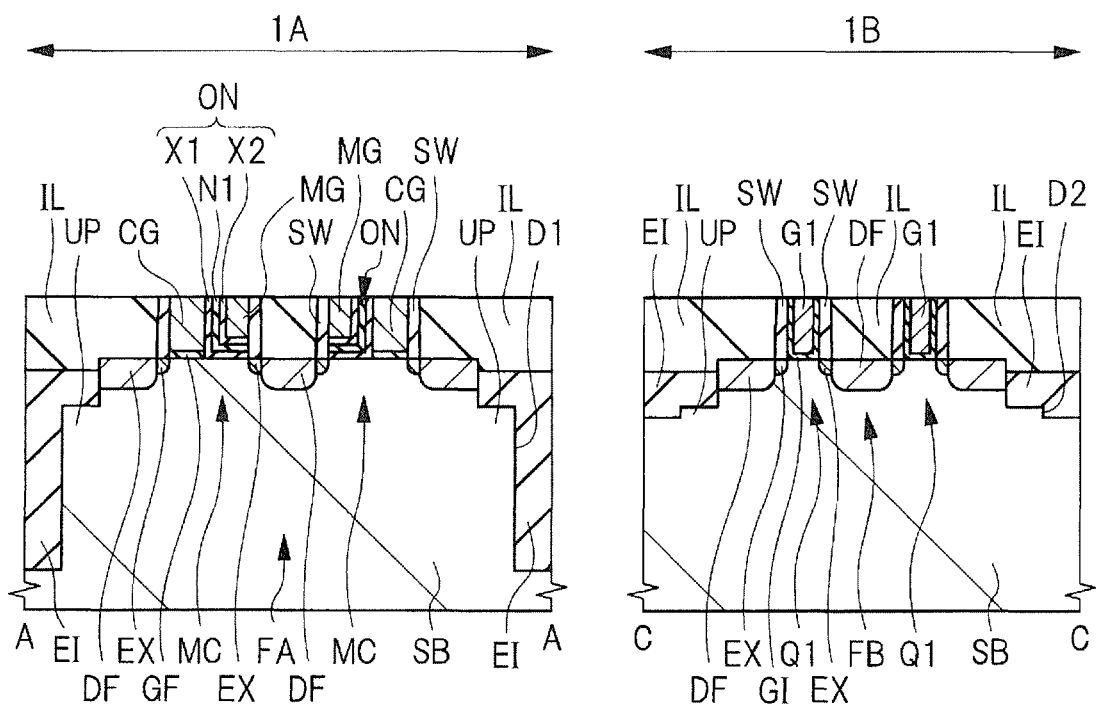
FIG. 40 is sectional views for explaining a manufacturing step of the semiconductor device following FIG. 39.

Subsequently, after an insulating film is formed over the semiconductor substrate SB by using, for example, an ALD (Atomic layer Deposition) process, a metal film is formed over the insulating film by using, for example, a sputtering process, thereby the trench is filled with a laminated film including the insulating film and the metal film, as illustrated in FIG. 40. Thereafter, the excessive insulating film and metal film over the interlayer insulating film IL are removed by polishing using, for example, a CMP process, so that the upper surface of each of the interlayer insulating film IL, the control gate electrode CG, and the memory gate electrode MG is exposed. Thereby, the gate electrode G1, including both the gate insulating film GI having the insulating film embedded in the trench and the metal film embedded in the trench via the gate insulating film GI, is formed.

The gate electrode G1 and one pair of the source/drain regions formed in the fin FB beside the gate electrode G1 form the transistor Q1. The transistor Q1 is a low breakdown voltage MISFET driven by a voltage lower than that for each of the first transistor and the second transistor, and has a metal gate electrode. As the above insulating film that forms the gate insulating film GI, a metal oxide film, such as, for example, a hafnium oxide film, zirconium oxide film, aluminum oxide film, tantalum oxide film, or lanthanum oxide film, can be used. That is, the gate insulating film GI is a high-k film (high dielectric constant film) having a dielectric constant higher than that of a silicon oxide film.

The above metal film that forms the gate electrode G1 is formed, for example, by a two-layer laminated film. The laminated film has a first metal film and a second metal film that have been sequentially laminated from the semiconductor substrate SB side. The first metal film includes, for example, a titanium aluminum (TiAl) film, and the second metal film includes, for example, an aluminum (Al) film. Herein, the threshold voltage of the transistor Q1 may be adjusted by interposing a titanium (Ti) film, titanium nitride (TiN) film, or laminated film thereof, between the first metal film and the second metal film. The first metal film and the second metal film are illustrated as a single metal film in the view.

The gate insulating film GI covers, in the trench, the bottom surface and sidewall of the gate electrode G1 and the bottom surface and sidewall of the trench. When the insulating film IF2 is removed in the step described with reference to FIG. 39, a new insulating film may be formed over the bottom surface of the trench by performing oxidation processing prior to the formation of the gate insulating film GI such that the insulating film is used as part of the gate insulating film GI. It has been described above that the high-k film is formed after the removal of the dummy gate electrode DG (see FIG. 37), but the high-k film may be formed prior to the formation of the polysilicon film SL2 (see FIG. 25) that forms the dummy gate electrode DG and after the step described with reference to FIG. 22, so that the high-k film is left as a gate insulating film in the logic region 1B.

Figure 41:
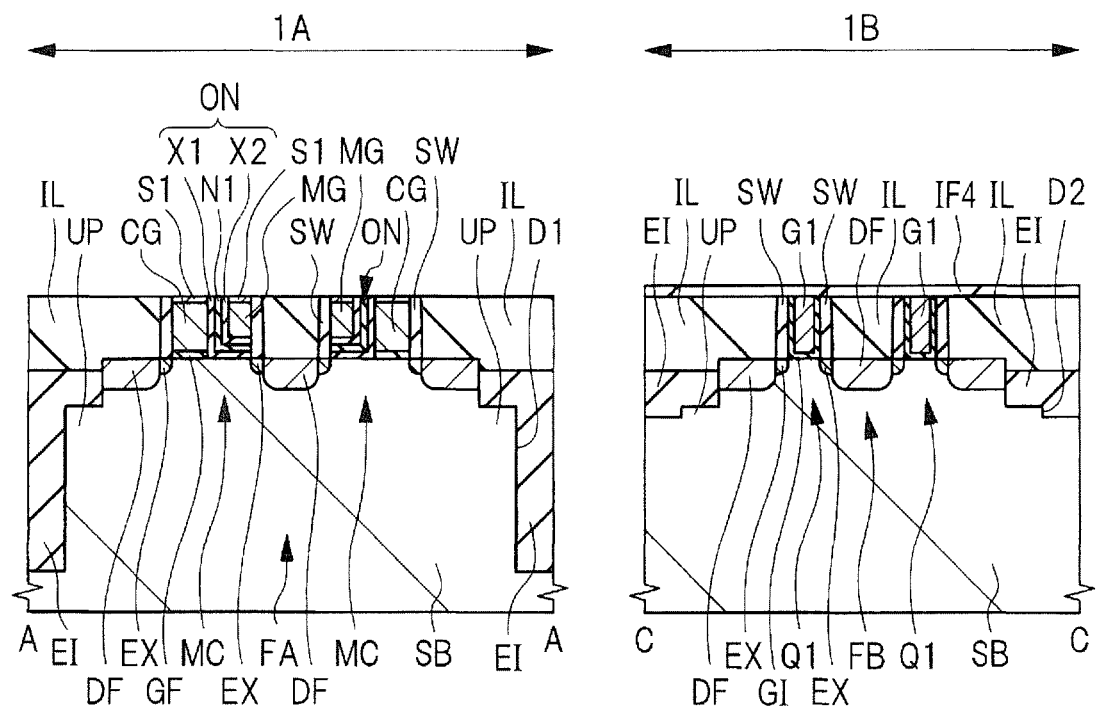
FIG. 41 is sectional views for explaining a manufacturing step of the semiconductor device following FIG. 40.

Subsequently, after the upper surface of the gate electrode G1 in the logic region 1B is covered with the insulating film IF4, the silicide layer S1, which covers the upper surface of each of the control gate electrode CG and the memory gate electrode MG, is formed, as illustrated in FIG. 41.

The insulating film IF4 includes a silicon oxide film formed, for example, by a CVD process. Herein, after the insulating film IF4 is formed to cover the memory cell region 1A and the logic region 1B, the insulating film IF4 in the memory cell region 1A is removed by performing patterning. Thereby, the insulating film IF4, which covers the upper surface of each of the interlayer insulating film IL, the sidewall spacer SW, and the gate electrode G1 in the logic region 1B, is left. Subsequently, after a metal film including a nickel (Ni) film or a cobalt (Co) film is formed over the exposed control gate electrode CG and memory gate electrode MG by using, for example, a sputtering process, the metal film is reacted with the upper surface of each of the control gate electrode CG and the memory gate electrode MG by performing a heat treatment.

Thereby, the silicide layer S1 including a nickel silicide (NiSi) layer or a cobalt silicide (CoSi) layer, which covers the upper surface of each of the control gate electrode CG and the memory gate electrode MG, is formed, and then an unreacted metal film is removed by wet etching, or the like. Thereby, the element isolation region EI and the insulating film IF4 are exposed. Herein, the gate electrode G1 is covered with the insulating film IF4, and hence the gate electrode G1, a metal gate electrode, can be prevented from being removed by the wet etching. The silicide layer is not formed over the gate electrode G1.

Although not illustrated, an interlayer insulating film is then formed over the interlayer insulating film IL, and a plurality of contact plugs (coupling portions), each penetrating these insulating films and being to be coupled to the control gate electrode CG, the memory gate electrode MG, the source/drain region, or the gate electrode G1, are formed, thereby allowing the semiconductor device according to the present embodiment to be completed.

Specifically, after an interlayer insulating film including a silicon oxide film, or the like, is formed over the interlayer insulating film IL by using, for example, a CVD process, a plurality of contact holes, each penetrating a laminated interlayer insulating film including the interlayer insulating film IL and the interlayer insulating film thereover, are formed by using a photolithography technique and a dry etching process. The contact hole is an opening for exposing, from the laminated interlayer insulating film, the upper surface of: the diffusion layer DF that forms the source/drain region of the memory cell MC; the diffusion layer DF that forms the source/drain region of the transistor Q1; the control gate electrode CG; and the memory gate electrode MG or the gate electrode G1. The upper surface of the silicide layer S1 is exposed at the bottom surface of the contact hole directly over each of the control gate electrode CG and the memory gate electrode MG.

Subsequently, a metal film mainly including, for example, tungsten (W) is formed, as a conductive film for coupling, over the laminated interlayer insulating film by using, for example, a sputtering process, or the like, which fills up each contact hole. Herein, after a barrier conductor film including, for example, a titanium film, titanium nitride film, or a laminated film thereof is formed, a main conductor film including a tungsten film is formed over the barrier conductor film, thereby allowing the metal film including the barrier conductor film and the main conductor film to be formed. Thereafter, the contact plug embedded in each contact hole is formed by removing the unnecessary metal film over the laminated interlayer insulating film by a CMP process, or the like. The contact plug is electrically coupled to the control gate electrode CG, the memory gate electrode MG, the source/drain region, or the gate electrode G1.

<Advantages of Semiconductor Device and Manufacturing Method Thereof>

Figure 55:
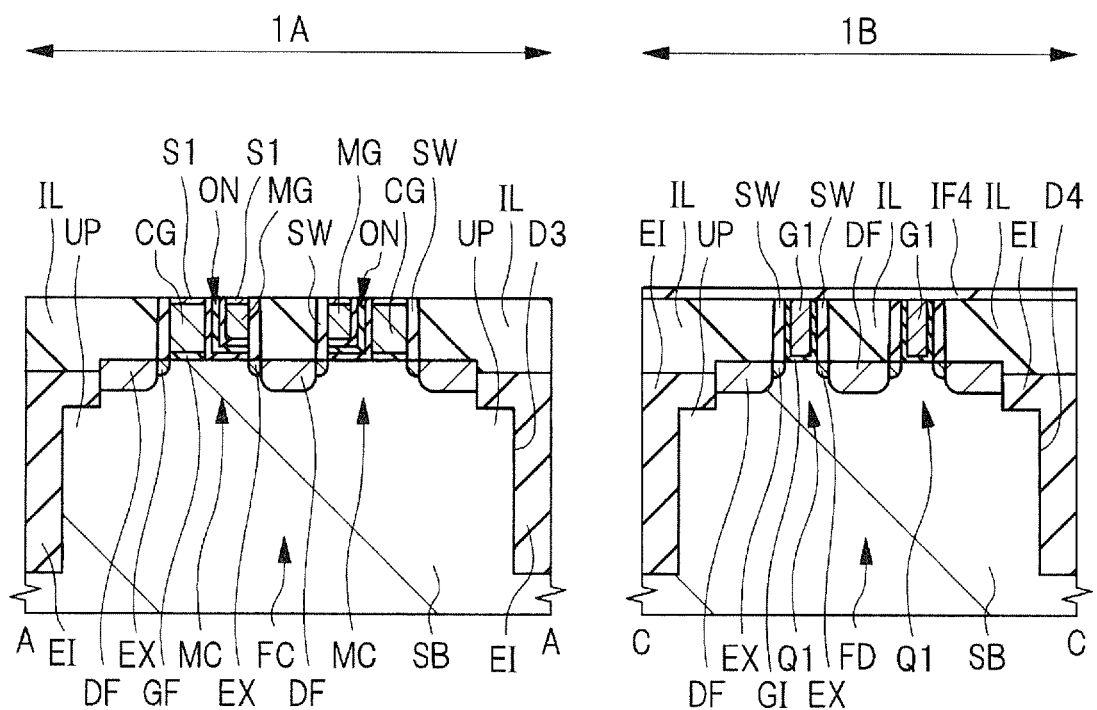
FIG. 55 is sectional views illustrating a semiconductor device of a comparative example.
Figure 56:
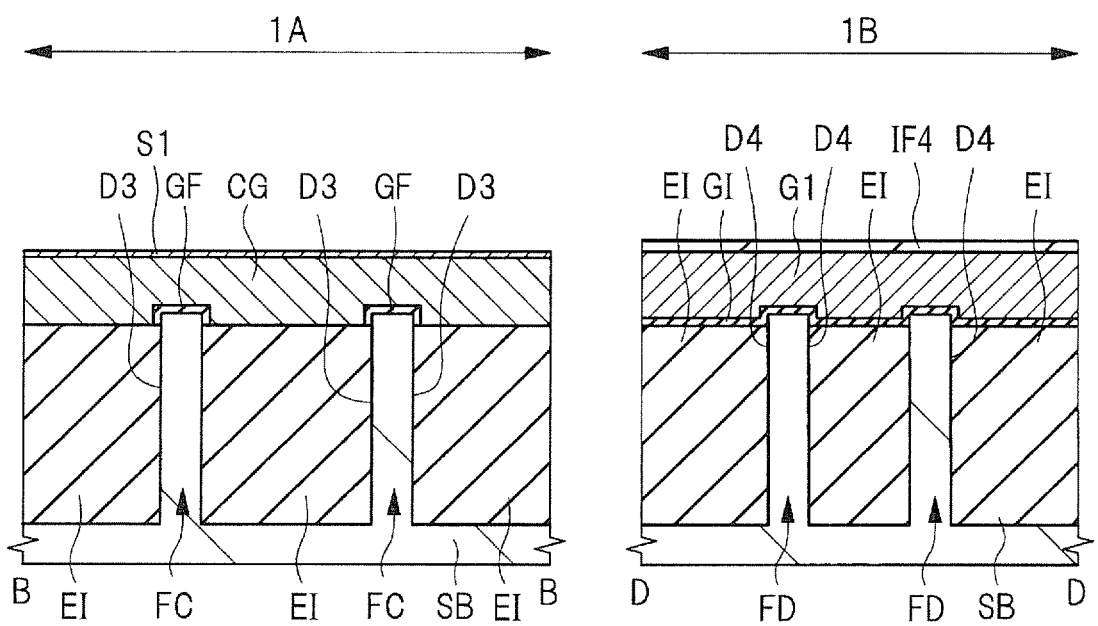
FIG. 56 is sectional views illustrating a semiconductor device of a comparative example.

Hereinafter, advantages of the semiconductor device according to the present embodiment and the manufacturing method thereof will be described with reference to FIGS. 55 and 56 illustrating a comparative example. FIGS. 55 and 56 are sectional views illustrating a semiconductor device of a comparative example, in which a memory cell including a FINFET is included. FIG. 55 is sectional views each taken along the direction in which a fin extends, illustrating transistors in a memory cell region and a logic region, similarly to FIG. 2. FIG. 56 is sectional views each taken along the direction in which a gate electrode extends, illustrating gate electrodes in the memory cell region and the logic region, similarly to FIG. 3. That is, FIG. 55 is sectional views taken along the lines corresponding to A-A Line and C-C Line in FIG. 1, and FIG. 56 is sectional views taken along the lines corresponding to B-B Line and D-D Line in FIG. 1.

Because a memory cell that forms a flash memory is driven by a voltage higher than that for a transistor formed in a logic region, it is required to have a high breakdown voltage performance in order to prevent a punch-through from occurring between adjacent cells. On the other hand, in a low resistance transistor that forms a logic circuit, a punch-through between adjacent cells never occurs even when the transistor does not have a breakdown voltage performance as high as that of a memory cell. Accordingly, the breakdown voltage performance required of a transistor in a logic region is lower than that required of a transistor that forms a memory cell.

In an FET having a fin-type channel, breakdown voltage isolation between elements is secured by the element isolation region embedded in a trench between adjacent fins. In this case, the breakdown voltage between the elements can be increased to a higher level, as the trench is deeper and accordingly the level difference between the upper surface of the fin and the bottom surface of the element isolation region is larger. The breakdown voltage between elements can be increased to a higher level, as the distance between the fins is larger. Accordingly, in a logic region where a high breakdown voltage performance is not required, the integration degree of elements can be increased by shortening the distance between the fins.

Herein, when the depth of the element isolation region between the fins over which a memory cell is formed is small, a punch-through or disturb (erroneous write) is likely to be caused between adjacent cells, which decreases the reliability of a semiconductor device. In order to prevent this, it can be considered that the respective trenches D3 and D4 in the memory cell region 1A and the logic region 1B are formed to be deep, as illustrated in FIGS. 55 and 56, in order to increase the breakdown voltage between the memory cells MC formed over the different fins FC. Herein, the trenches D3 and D4 are formed in the same step of processing the upper surface of the semiconductor substrate SB, and hence they have the same depth.

However, when the trench D4 between the fins ED in the logic region 1B is formed to be deeper, and when the integration degree of elements is intended to be increased by shortening the distance between the fins FD in the logic region 1B, there is the fear that it may become impossible to properly embed the element isolation region EI formed by a depositing process in the trench D4 having a deeper depth. That is, an embedding defect is caused in the trench D4 having a large aspect ratio. In this case, problems are caused, in which the breakdown voltage between elements in the logic region may be decreased, abnormality may be caused in forming a film, a foreign substance may remain in a faulty part, or the like, which decreases the reliability, the breakdown voltage performance, and the manufacturing yield of a semiconductor device.

Accordingly, when the trenches D3 and D4 are formed to be deep in order to increase the breakdown voltage between elements in the memory cell region 1A, it is necessary to secure a large space between the fins FD in the logic region 1B for preventing an abnormal event from occurring in embedding the element isolation region EI in the trench D4 in the logic region 1B, which makes it difficult to miniaturize a semiconductor device. Thus, there is a problem that it is difficult to satisfy both an improvement in the reliability of a semiconductor device and an improvement in the performance thereof. FIGS. 55 and 56 illustrate a structure in which the element isolation region EI is normally formed, but when the element isolation region EI is not properly embedded in the trench D4, it can be considered that a void may be caused in the element isolation region EI in the trench D4, or that concavities and convexities may be formed in the upper surface of the element isolation region EI, or the like.

So, in the present embodiment, the trench D1 in the memory cell region 1A and the trench D2 in the logic region 1B, which are illustrated in FIGS. 1 to 3, are formed, in different steps, to have different depths, respectively. That is, the depth of the trench D1 (see FIG. 3) between the fins FA, over which the memory cell MC is formed, is larger than that of the trench D2 (see FIG. 3) between the fins FB, over which the low breakdown voltage transistor Q1 is formed. In other words, in the direction perpendicular to the main surface of the semiconductor substrate SB, the length between the upper surface of the fin FA and the bottom surface of the element isolation region EI in the memory cell region 1A is larger than that between the upper surface of the fin FB and the bottom surface of the element isolation region EI in the logic region 1B.

Accordingly, the breakdown voltage between the memory cells MC, which are high breakdown voltages MONOS formed over the different fins FA, respectively, can be increased due to the large depth of the trench D1, and occurrence of a punch-through and disturb between the memory cells MC can be prevented. Further, the breakdown voltage between the fins FA can be increased, and hence the space between the fins FA can be reduced while occurrence of a punch-through is being prevented. Accordingly, the integration degree of the memory cells MC can be increased.

Furthermore, the trench D2 can be formed to be shallow in the logic region 1B, and hence the embeddability of the element isolation region EI in the trench D2 can be improved. Accordingly, the space between the low breakdown voltage transistors Q1, which are formed over the different fins FB, respectively, can be reduced. As illustrated in FIG. 3, the distance between the adjacent fins FB is smaller than that between the adjacent fins FA. The integration degree of elements can be increased by thus reducing the space between the fins FB.

From the above description, the reliability of a semiconductor device can be improved, and the performance thereof can be improved.

In the present embodiment, the breakdown voltage between the fins FA can be secured by forming, in the same way, the respective trenches D1 on both sides of the fin FA so as to be deep, as illustrated in FIG. 3. Further, the integration degree of elements can be effectively increased by forming, in the same way, the respective trenches D2 on both sides of the fin FB so as to be shallow. That is, the above advantages cannot be obtained only by providing a difference between the respective depths of the trenches beside and on both sides of a certain fin.

The above advantages are effective in a semiconductor device that has a metal gate electrode and the low breakdown voltage transistor Q1 required to operate at high speed, as in the present embodiment. However, the gate electrode G1 of the transistor Q1 in the logic region 1B may not be a metal gate electrode. That is, it is described in the embodiment that the memory cell MC and the transistor Q1 are formed by a process in which the gate electrode G1 is formed after the formation of a source/drain region, i.e., by a so-called gate last process. On the other hand, when the gate electrode of the transistor Q1 is not replaced by a metal gate electrode and the polysilicon film, formed as a dummy gate electrode in the embodiment, is used as the gate electrode, the step described with reference to FIGS. 37 to 40 may not be performed.

<First Variation>

Figure 42:
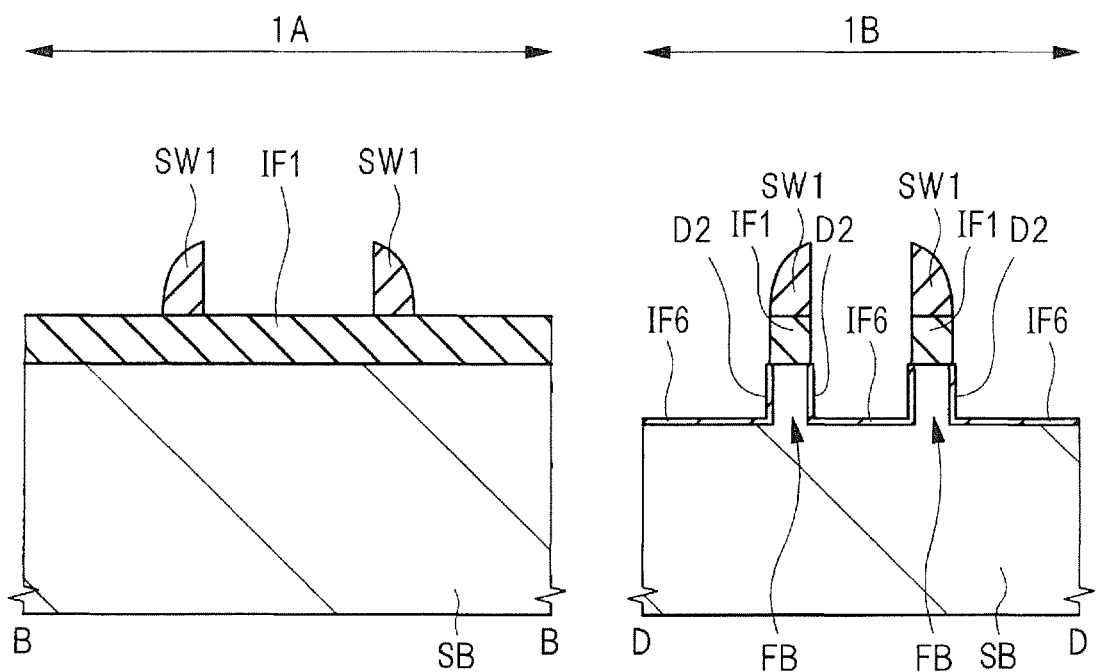
FIG. 42 is sectional views for explaining a manufacturing step of a semiconductor device according to First Variation of First Embodiment of the invention.
Figure 43:
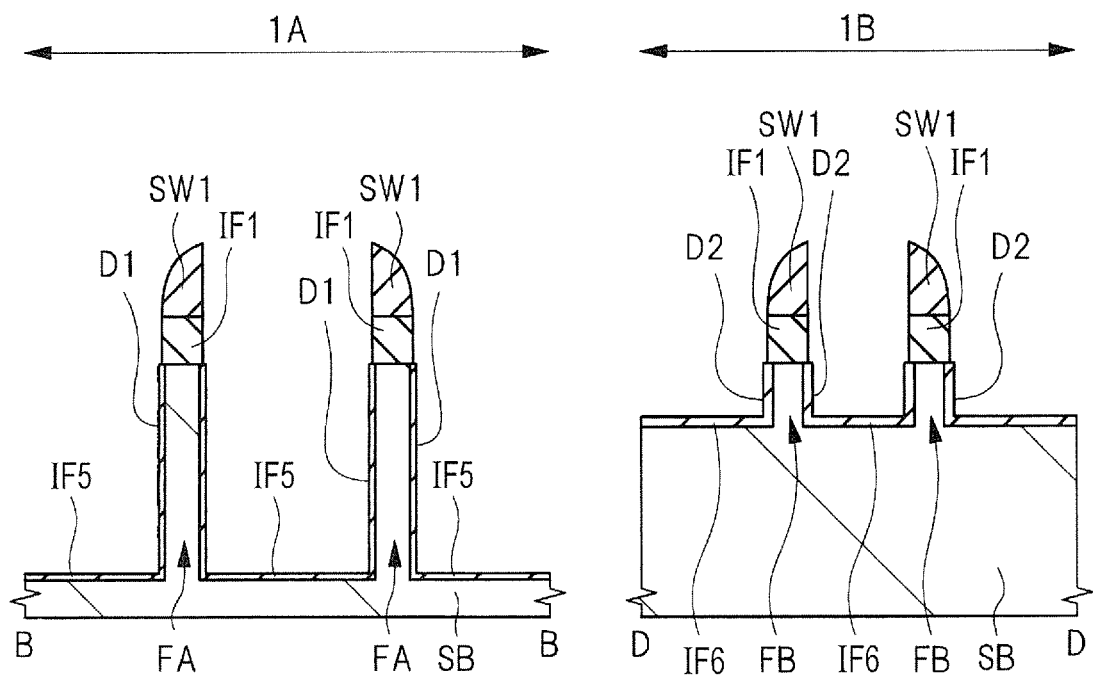
FIG. 43 is sectional views for explaining a manufacturing step of the semiconductor device following FIG. 42.

Hereinafter, First Variation of the semiconductor device according to the present embodiment will be described with reference to FIGS. 42 and 43. FIGS. 42 and 43 are sectional views of a semiconductor device according to First Variation of the embodiment. FIGS. 42 and 43 are views illustrating the sectional surfaces that are obtained in the same steps as those described with reference to FIGS. 14 and 16 and are taken along the same line. Herein, it will be described that after the formation of a trench around a fin, the surface of the fin is covered by performing oxidation processing, thereby protecting the surface thereof in the step of forming a photoresist film, the step of removing the photoresist film, and a cleaning step, which will be performed in later steps.

In the manufacturing steps of the semiconductor device according to the present variation, after the steps described with reference to FIGS. 5 to 12 are performed, the trench D2 and the fin FB in the logic region 1B are formed by performing steps similar to those described with reference to FIGS. 13 and 14, as illustrated in FIG. 42. Thereafter, the photoresist film PR1 (see FIGS. 13 and 14) is removed. Subsequently, a cleaning step is performed. Subsequently, an insulating film IF6, which covers the surface of the semiconductor substrate SB in the exposed logic region 1B, is formed by performing oxidation processing, such as, for example, thermal oxidation. The insulating film IF6 includes a silicon oxide film. Thereby, the sidewall of the fin FB is covered with the insulating film IF6.

In the oxidation processing, oxygen in the atmosphere reacts with the silicon in the surface of the semiconductor substrate SB to form a silicon oxide film, and hence part of the sidewall of the fin FB is replaced by the insulating film IF6. Accordingly, the width of the fin FB, the width orienting in the direction along the main surface of the semiconductor substrate SB, becomes small.

Subsequently, steps similar to those described with reference to FIGS. 15 and 16 are performed, as illustrated in FIG. 43. That is, the logic region 1B is covered with the photoresist film PR2 (see FIGS. 15 and 16). In this case, the sidewall of the fin FB is covered with the insulating film IF6, and hence the contamination of silicon by impurities in the resist and the diffusion of the impurities can be prevented. Subsequently, the trench D1 and the fin FA in the memory cell region 1A are formed. Thereafter, the photoresist film PR2 is removed, and then a cleaning step is performed.

Subsequently, an insulating film IF5, which covers the surface of the semiconductor substrate SB in the exposed memory cell region 1A, is formed by performing oxidation processing, such as, for example, thermal oxidation. The insulating film IF5 includes a silicon oxide film. Thereby, the sidewall of the fin FA is covered with the insulating film IF5, which can remove a layer in which silicon has been damaged by the above processing. In the heat treatment, the surface of the fin FB is further oxidized and the insulating film IF6 is further increased in thickness, and the width of the fin FB, the width orienting in the direction along the main surface of the semiconductor substrate SB, becomes further small.

The subsequent steps are performed similarly to the steps described with reference to FIGS. 19 to 41, thereby allowing the semiconductor device according to the present variation to be completed.

Herein, in the step described with reference to FIGS. 8 and 9, the sidewall spacers SW1, each having the same width, are self-alignedly formed in each of the memory cell region 1A and the logic region 1B. Accordingly, it can be considered that, in the steps described with reference to FIGS. 13 to 16, if the fins FA and FB are formed by using those sidewall spacers SW1 as a mask, the respective widths of the fins FA and FB may become equal to each other.

On the other hand, when oxidation processing is to be performed on the surface of a fin after the formation of the fin, as in the present variation, the oxidation processing is performed in each of the step of forming the fin FB in the logic region 1B and the step of forming the fin FA in the memory cell region 1A, and hence the surface of the fin FB formed ahead of the fin FA is oxidized twice. Accordingly, the oxidation amount of the surface of the fin FB is large than that of the fin FA, the surface of which is oxidized only once, and hence the width of the fin FB becomes smaller than that of the fin FA. That is, the respective widths of the fins FA and FB can be made different from each other.

In the present variation, the width of the fin FB can be made smaller than that of the fin FA, and hence the gate width of the transistor Q1 is made smaller than that of the memory cell MC illustrated in FIG. 41, thereby allowing the controllability of the transistor Q1 to be improved.

<Second Variation>

Figure 44:
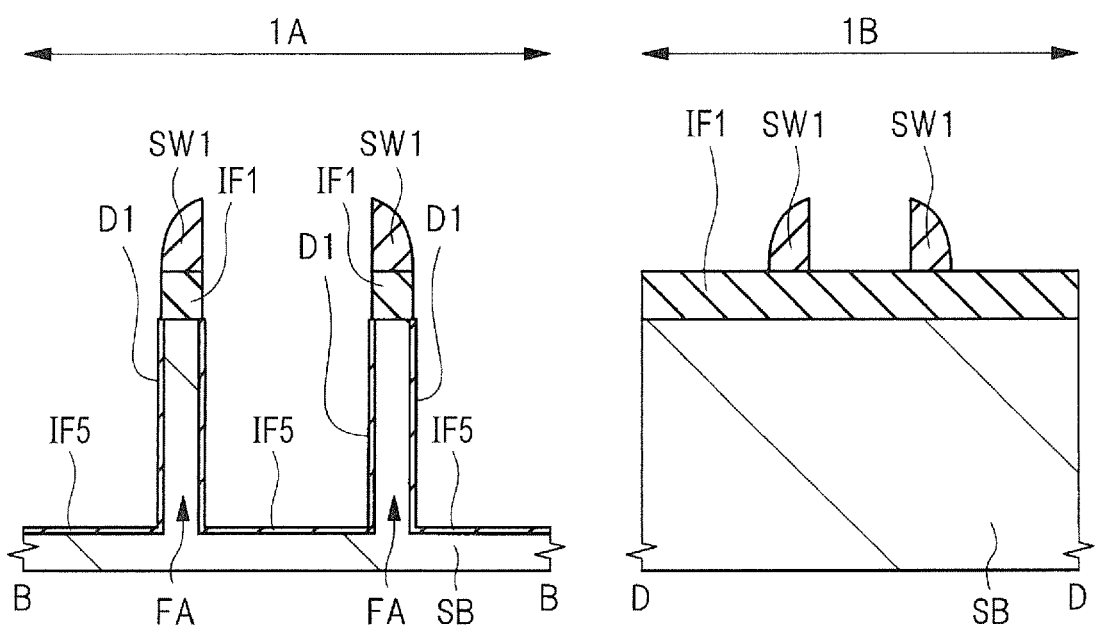
FIG. 44 is sectional views for explaining a manufacturing step of a semiconductor device according to Second Variation of First Embodiment of the invention.
Figure 45:
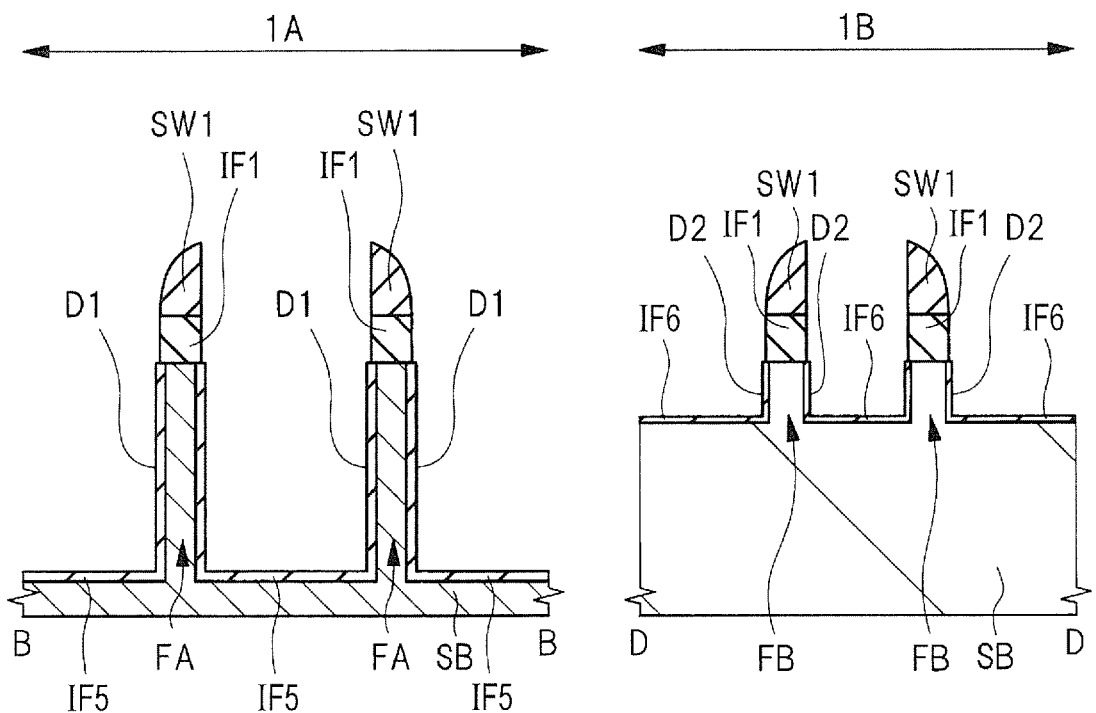
FIG. 45 is sectional views for explaining a manufacturing step of a semiconductor device according to Second Variation of First Embodiment of the invention.

Hereinafter, Second Variation of the semiconductor device according to the present embodiment will be described with reference to FIGS. 44 and 45. FIGS. 44 and 45 are sectional views of a semiconductor device according to Second Variation of the embodiment. FIGS. 44 and 45 are views illustrating the sectional surfaces that are obtained in the same steps as those described with reference to FIGS. 16 and 14 and are taken along the same line. Herein, it will be described that the surface of a fin is covered by performing oxidation processing after the formation of a trench around the fin, so that the surface of the fin is protected in the later-performed step of forming a photoresist film. Conversely to the above First Variation, the fin in the memory cell region is formed first, and then the fin in the logic region is formed.

In the manufacturing steps of a semiconductor device according to the present variation, the trench D1 and the fin FA in the memory cell region 1A are formed by performing the steps described with reference to FIGS. 5 to 12 and then steps similar to those described with reference to FIGS. 15 and 16, as illustrated in FIG. 44. Thereafter, the photoresist film PR2 (see FIGS. 15 and 16) is removed, and then a cleaning step is performed. Subsequently, an insulating film IF5, which covers the surface of the semiconductor substrate SB in the exposed memory cell region 1A, is formed by performing oxidation processing, such as, for example, thermal oxidation. The Insulating film IF5 includes a silicon oxide film. Thereby, the sidewall of the fin FA is covered with the insulating film IF5. By the oxidation processing, the width of fin FA, the width orienting in the direction along the main surface of the semiconductor substrate SB, becomes small.

Subsequently, steps similar to those described with reference to FIGS. 13 and 14 are performed, as illustrated in FIG. 45. That is, the trench D2 and the fin FB in the logic region 1B are formed in a state where the memory cell region 1A is covered with a photoresist film PR1. Subsequently, the photoresist film PR1 (see FIGS. 13 and 14) is removed, and then a cleaning step is performed. Subsequently, an insulating film IF6, which covers the surface of the semiconductor substrate SB in the exposed logic region 1B, is formed by performing oxidation processing, such as, for example, thermal oxidation. The insulating film IF6 includes a silicon oxide film. Thereby, the sidewall of the fin FB is covered with the insulating film IF6.

In the heat treatment, the surface of the fin FA is further oxidized and the insulating film IF5 is further increased in thickness, and the width of the fin FA, the width orienting in the direction along the main surface of the semiconductor substrate SB, becomes further small. Unlike the above First Variation, the surface of the fin FB is oxidized only once, and hence the thickness of the insulating film IF6 becomes smaller than in the case where the surface thereof is oxidized twice. Accordingly, the distance between the insulating films IF6, which are formed over the sidewalls on both sides of the trench D2 so as to face each other, becomes larger than the case where the surface of the fin FB is oxidized twice.

The subsequent steps are performed similarly to the steps described with reference to FIGS. 19 to 41, thereby allowing the semiconductor device according to the present variation to be completed.

In the present variation, the surface of the fin FB formed after the fin FA is oxidized only once, and hence the width of the trench D2 between the insulating films IF6, which face each other in the direction along the main surface of the semiconductor substrate SB, becomes larger than the case where the surface of the fin FB is oxidized twice. Accordingly, the embeddability of the element isolation region EI can be improved to a higher level than the case where the surface of the fin FB is oxidized twice, and hence the distance between the fins FB can be reduced and the integration degree in the logic region 1B can be further increased.

Second Embodiment

Figure 46:
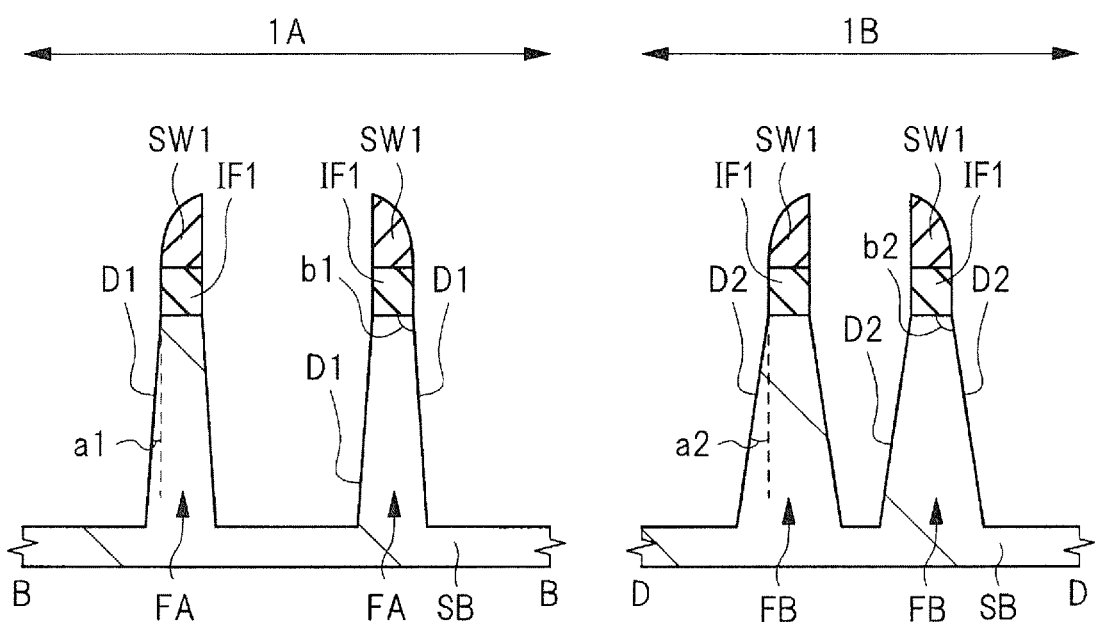
FIG. 46 is sectional views illustrating a manufacturing step of a semiconductor device according to Second Embodiment of the invention.
Figure 47:
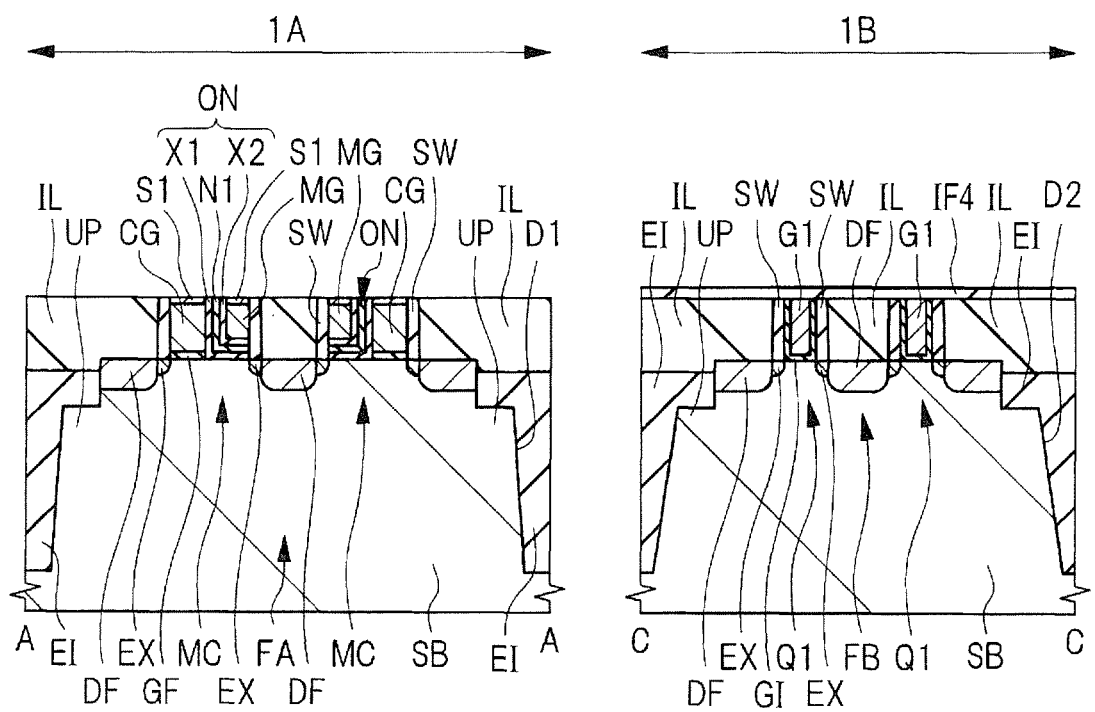
FIG. 47 is sectional views taken along A-A Line and C-C Line in FIG. 10, for explaining a manufacturing step of the semiconductor device following FIG. 46.
Figure 48:
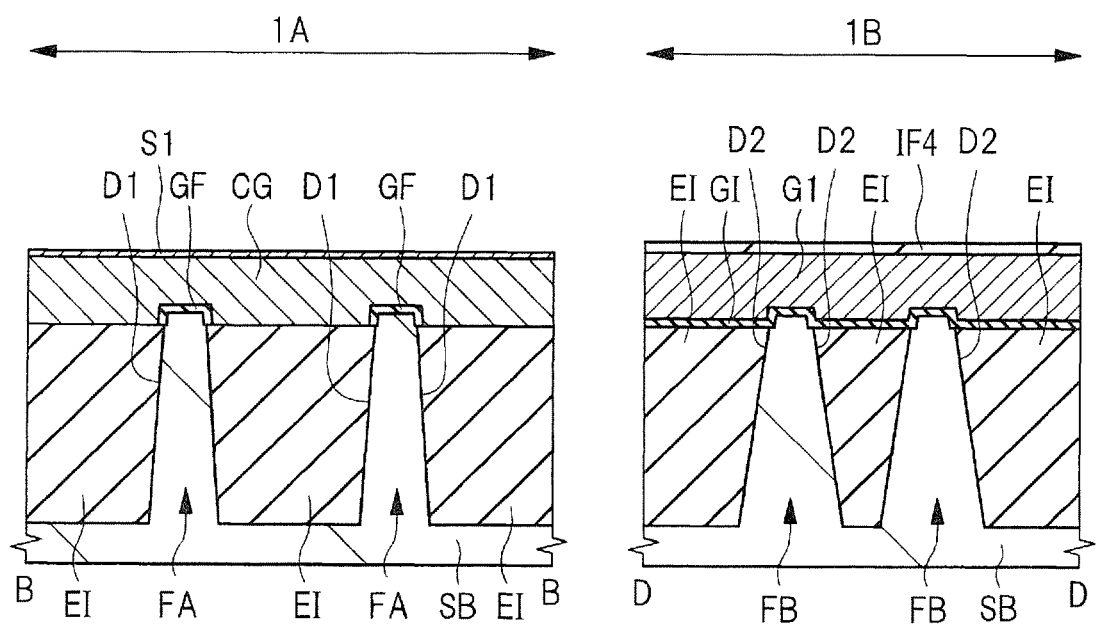
FIG. 48 is sectional views taken along B-B Line and D-D Line in FIG. 1, for explaining a manufacturing step of the semiconductor device following FIG. 46.

Hereinafter, Second Embodiment will be described with reference to FIGS. 46 to 48. FIGS. 46 to 48 are sectional views for explaining the manufacturing steps of a semiconductor device according to the present embodiment. FIG. 46 illustrates sectional surfaces that are obtained after the step described with reference to FIG. 16 is performed and in a state where a photoresist film is removed. FIGS. 47 and 48 illustrate a completed semiconductor device, and illustrate sectional surfaces taken along the same lines as those in FIGS. 2 and 3, respectively. That is, each of FIGS. 46 and 48 is sectional views taken along the lines corresponding to B-B Line and D-D Line in FIG. 1; and FIG. 47 is sectional views taken along the lines corresponding to A-A Line and C-C Line in FIG. 1.

In the present embodiment, it will be described that each fin is provided with a taper. Herein, a structure, in which the depth of a trench for isolating fins in the memory cell region and that of a trench for isolating fins in the logic region are lined up, will be described, but a difference may be provided between the depths of isolation trenches in the memory cell region and in the logic region, as in the above First Embodiment.

In the manufacturing steps of a semiconductor device according to the present embodiment, after the steps described with reference to FIGS. 5 to 12 are first performed, the steps described with reference to FIGS. 13 to 16 are performed in predetermined etching conditions, and then the photoresist film PR2 is removed, thereby obtaining the structure illustrated in FIG. 46. In the steps of forming the trenches D1 and D2 and the fins FA and FB, which have been described with reference to FIGS. 13 to 16, when dry etching is performed on the semiconductor substrate SB, the etching is performed by using gas containing HBr (hydrogen bromide), $CHF_3$ (trifluoromethane), and $O_2$ (oxygen). In the steps of forming the fin FA, which have been described with reference to FIGS. 15 and 16, etching is performing in a condition in which the flow ratio of $CHF_3$ (trifluoromethane) is smaller than that in the steps of forming the fin FB, which have been described with reference to FIGS. 13 and 14.

That is, when the respective fins FA and FB are formed by etching under, for example, $HBr—Cl_2—O_2—CHF_3$-based mixed gas atmosphere, a forward tapered shape is obtained in the sidewall of the fin when the flow ratio of $CHF_3$ gas is increased; and the sidewall of the fin approaches a vertical shape more closely when that of the $CHF_3$ is reduced to a smaller level. That is, the angle between the sidewall of the fin and the main surface of the semiconductor substrate approaches 90°.

This reason is considered as follows. That is, when the flow ratio of $CHF_3$ gas is large, an etching product is likely to be deposited, and a side surface protective film is formed at the end of the pattern. Because the side surface protective film acts as a mask member for the etching, the width of silicon becomes larger as silicon etching advances more closely to the pattern lower region. As a result, the final shape becomes a forward tapered shape.

On the other hand, when the flow ratio of $CHF_3$ gas is small, the side surface protective film is less likely to be formed during the etching. Accordingly, there is no protective action to the etching by the side surface protective film, and hence the width of silicon does not become large even when the etching advances, and the final shape becomes close to a vertical shape.

In the present embodiment, the flow ratio of $CHF_3$ gas is reduced such that the shape of the sidewall of the fin FA approaches a vertical shape in the etching step of forming the fin FA in the memory cell region 1A; and in the etching step of forming the fin FB in the logic region 1B, etching is performed in a condition in which the flow ratio of $CHF_3$ gas is larger than that in the step of forming the fin FA. Accordingly, the angle between the upper surface and the sidewall of the fin FA is larger than 900, and is smaller than the angle between the upper surface and the sidewall of the fin FB.

By performing, as the subsequent steps, steps similar to those described with reference to FIGS. 17 to 41, the semiconductor device illustrated in FIGS. 47 and 48 is completed. The write method of the formed memory cell MC is an SSI method, and the erase method is a BTBT method.

When a fin is formed by dry etching, it can be considered that the sidewall of the fin may not be vertical to the main surface of the semiconductor substrate SB, but may be slightly inclined obliquely. That is, the sidewall of the fin has a taper to the main surface of the semiconductor substrate SB. In the present embodiment, the sidewall of the fin FA is formed obliquely to the main surface of the semiconductor substrate SB, and the angle between the direction perpendicular to the main surface thereof and the sidewall is a1, as illustrated in FIG. 46. The angle between the upper surface and sidewall of the fin FA is b1. The sidewall of the fin FB is formed obliquely to the main surface of the semiconductor substrate SB, and the angle between the direction perpendicular to the main surface thereof and the sidewall is a2. The angle between the upper surface and sidewall of the fin FB is b2. The taper of a sidewall referred to in the present application means the above angles a1 and a2.

In the present embodiment, the flow ratio of $CHF_3$ is changed between the steps of forming the fin FA and of forming the fin FB, as described above, and hence the taper of the sidewall of the fin FA is smaller than that of the sidewall of the fin FB. That is, the relationships of a1>a2 and b1>b2 are satisfied. That is, the sidewall of the fin FA is formed at an angle closer to being perpendicular to the main surface of the semiconductor substrate SB than the sidewall of the fin FB. In other words, the angle b1 is closer to the right angle than the angle b2. Herein, in order to prevent the fins FA and FB from falling, each of the angles b1 and b2 is made larger than or equal to 90°.

Figure 57:
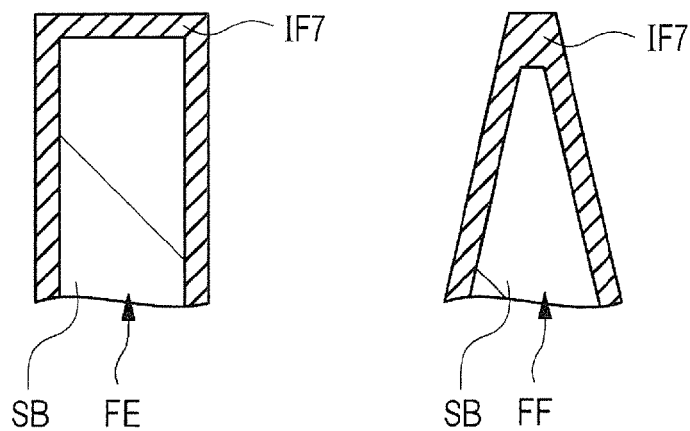
FIG. 57 is sectional views for explaining a structure of a fin whose surface is oxidized.

Subsequently, advantages of the semiconductor device according to the present embodiment and the manufacturing method thereof will be described with reference to FIG. 57. FIG. 57 is sectional views for explaining the structure of a fin whose surface is oxidized.

The surface of the fin is oxidized in the steps described with reference to FIGS. 23 and 24, and is covered with the silicon oxide film formed in the steps. The surface of the fin is oxidized also in the step of forming the lower silicon oxide film (bottom oxide film) X1 that forms the ONO film ON, the step having been described with reference to FIG. 28. Also when the surface of the fin is protected by covering it with an oxide film prior to the implantation step of forming a source/drain region, the implantation step having been described with reference to FIGS. 33 and 35, oxidation processing is performed on the fin. In the case where a source/drain region having a high concentration is formed, as in the memory cell region, it is more particularly necessary to thus form an oxide film in order to protect the surface of the fin from ion implantation, than the case where a source/drain region having a low concentration is formed, as in the logic region. From the above reason, the fin in the memory cell region is more likely to be oxidized than that in the logic region.

In these oxidation steps, a silicon oxide film is formed with the silicon, which forms the surface of the fin, reacting with oxygen, and hence the silicon in the surface of the fin is replaced by the silicon oxide film by oxidization. That is, the surface of the fin is corroded. FIG. 57 illustrates fins FE and EF, the surface of each of which is oxidized. The sidewall of the fin FE is formed to be perpendicular to the main surface of the semiconductor substrate SB, while that of the fin FF has a taper to the main surface of the semiconductor substrate SB. Accordingly, the fin FF has a pointed shape in which the tip is gradually tapered toward the upper portion.

When the surfaces of the fins FE and FF are oxidized, the surfaces are replaced by an insulating film IF7, which is a silicon oxide film, and the widths of the fins FE and FF become small. Herein, because the fin FF has a shape in which the upper end is tapered, the upper end is particularly likely to be oxidized. Accordingly, the width of the fin FF becomes small with the surface thereof being corroded, and the tip of the fin FF including silicon has a further tapered shape, and the width of the upper surface of the fin FF becomes particularly small. In this case, it can be considered that the width in the y direction of the channel of the transistor that will be formed over the fin FF in a later step, i.e., the gate width, may become excessively small or the shape of the fin may collapse. Accordingly, there is the fear that a malfunction may be caused in the transistor.

On the other hand, in the fin FE that has a small sidewall taper and has a sidewall formed at an angle close to being perpendicular to the main surface of the semiconductor substrate SB, the width of the upper surface of the fin FE can be sufficiently maintained even when the oxidation amount of the surface is equivalent to that of the fin FF, and hence the shape of the upper end of the fin FE can be prevented from collapsing. Accordingly, when the surface of the fin FE is oxidized, a malfunction can be prevented from occurring in the transistor formed over the fin FE.

As described above, the fin in the memory cell region is more likely to be oxidized than that in the logic region, and hence when the sidewall of the fin in the memory cell region has a smaller taper and is formed at an angle closer to being perpendicular to the main surface of the semiconductor substrate SB than the sidewall of the fin in the logic region, it becomes easy to prevent a malfunction from occurring due to oxidation.

In the present embodiment, the sidewall of the fin FA is formed to have a shape closer to being perpendicular to the main surface of the semiconductor substrate SB and have a smaller taper than the sidewall of the fin FB, as illustrated in FIGS. 46 to 48. Accordingly, in the memory cell region 1A where more oxidation steps, for forming the memory cell MC, are performed than in the logic region 1B, the angle b1 between the upper surface and sidewall of the fin FA is close to the right angle, and hence a malfunction can be prevented from occurring due to the oxidization of the surface of a fin. Accordingly, the reliability of a semiconductor device can be improved. Further, the width of the fin FA can be reduced while occurrence of a malfunction is being prevented, and hence the properties of the memory cell can be improved.

The sidewall of the fin FB has a taper larger than that of the fin FA and is formed obliquely to the main surface of the semiconductor substrate SB and the bottom surface of the trench D2. In other words, the angel of the coupled portion between the sidewall of the fin FB and the bottom surface of the trench D2 is not the right angle. In this case, it becomes easy in the steps described with reference to FIGS. 17 and 18 to embed the element isolation region EI in the trench D2. In other words, the embeddability in the trench D2 is improved. Accordingly, the element isolation region EI can be properly embedded in the trench D2 even when the adjacent fins FB are brought close together, and hence the integration degree of elements in the logic region 1B can be improved.

Herein, the memory cell MC illustrated in FIG. 47 is a memory in which the write method is an SSI method and the erase method is a BTBT method (see A Column in FIG. 54). In a write operation in such a memory cell MC, data is written by the SSI method in which: an electron is accelerated by a steep electric field in the upper surface of the fin FA directly under the memory gate electrode MG; and a hot electron thus generated is injected into the silicon nitride film N1. In an erase operation, data is erased by the BTBT method in which: an impact ion is generated by concentrating an electric field on the upper surface of the fin FA directly under the memory gate electrode MG, and thereby a hot hole is injected into the silicon nitride film N1.

In this case, when the angle of the corner of the fin FA, i.e., the angle b1 (see FIG. 46) between the upper surface and sidewall of the fin FA is closer to 900, an electric field is more likely to be concentrated on the fin FA in a write operation according to the SSI method and in an erase operation according to the BTBT method, and hence the efficiency of data rewrite is increased. That is, occurrence of an erroneous data rewrite operation can be prevented in a write operation and an erase operation.

In the present embodiment, the angle b1 of the corner of the upper surface of the fin FA is smaller than the angle b2 of the corner of the upper surface of the fin FB, and is close to 90°, as illustrated in FIG. 46. Accordingly, an electric field is likely to be concentrated on the corner of the upper surface of the fin FA directly under the memory gate electrode MG illustrated in FIG. 47, and hence occurrence of erroneous write can be prevented in the memory cell MC in which the write method is an SSI method and the erase method is a BTBT method. Accordingly, the reliability of a semiconductor device can be improved.

<Variation>

Figure 49:
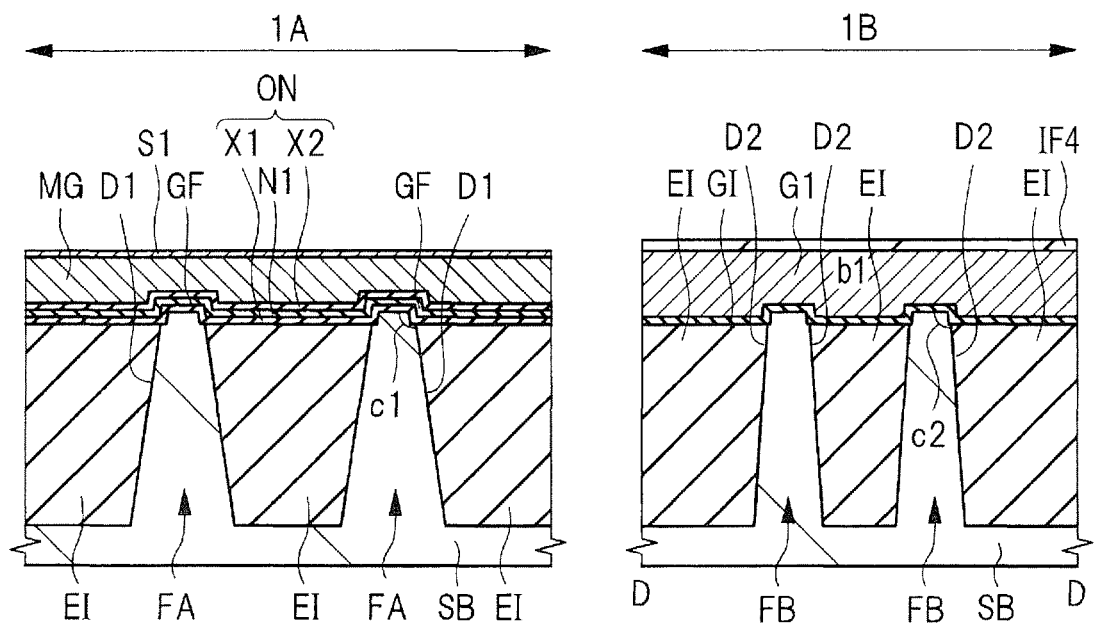
FIG. 49 is sectional views for explaining a manufacturing step of a semiconductor device according to a variation of the Second Embodiment of the invention.

Hereinafter, the case where the sidewall of the fin in the memory cell region has a large taper, conversely to the structure described with reference to FIG. 46, will be described with reference to FIG. 49. FIG. 49 is sectional views of a semiconductor device according to a variation of the present embodiment. FIG. 49 illustrates, as the sectional surfaces of the semiconductor device in the memory cell region 1A, sectional surfaces that are taken along the y direction and include the memory gate electrode MG and the ONO film ON directly thereunder, unlike FIG. 48. In FIG. 49, the sectional surfaces in the logic region 1B are taken along the same lines as those in FIGS. 3 and 48.

The structure of the semiconductor device according to the present embodiment is the same as that described with reference to FIGS. 47 and 48, except that the angle of the taper of the fin FA is larger than that of the taper of the fin FB.

That is, of the manufacturing steps of a semiconductor device, in the steps of forming the trenches D1 and D2 and the fins FA and FB, which have been described with reference to FIGS. 13 to 16, dry etching is performed on the semiconductor substrate SB by using etching gas containing HBr (hydrogen bromide), CHF$_3$ (trifluoromethane), and O$_2$ (oxygen). Additionally, in the step of forming the fin FA, which has been described with reference to FIGS. 15 and 16, etching is performed in a condition in which the flow ratio of CHF$_3$ (trifluoromethane) is larger than that in the step of forming the fin FB, which has been described with reference to FIGS. 13 and 14.

Accordingly, an angle c1 between the upper surface and sidewall of the fin FA is larger than 90°, and is larger than an angle c2 between the upper surface and sidewall of the fin FB. By performing the following steps similar to those described with reference to FIGS. 17 to 41, the semiconductor device illustrated in FIG. 49 is completed. The write method of the memory cell MC illustrated in FIG. 49 is an SSI method and the erase method is an FN method (see B Column in FIG. 54).

Figure 58:
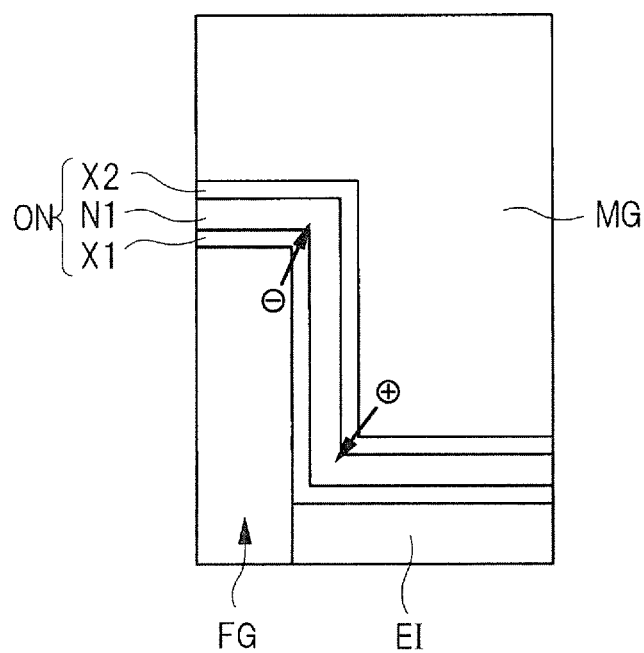
FIG. 58 is a sectional view for explaining write/erase operations in a memory cell over a fin.
Figure 59:
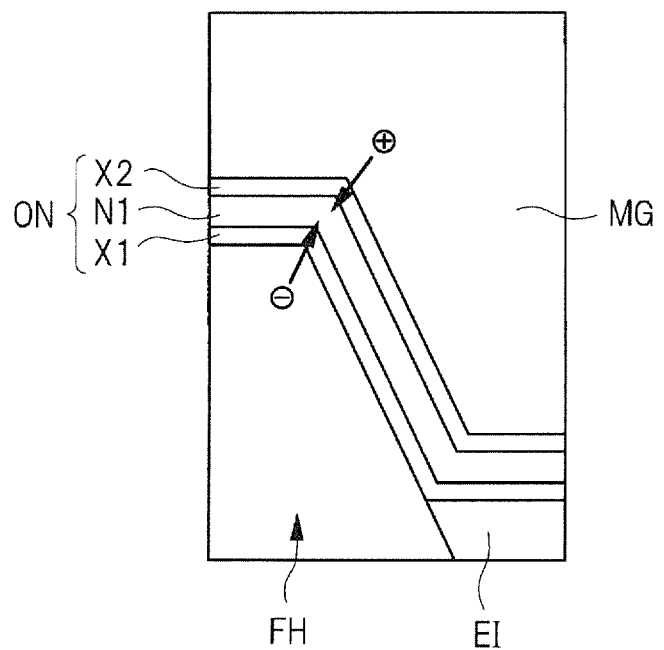
FIG. 59 is a sectional view for explaining write/erase operations in a memory cell over a fin.

Subsequently, advantages of the semiconductor device according to the present variation and the manufacturing method thereof will be described with reference to FIGS. 58 and 59. FIGS. 58 and 59 are sectional views for explaining write/erase operations in the memory cell over a fin. Each of FIGS. 58 and 59 is an enlarged sectional view that is taken along the y direction (gate width direction) and illustrates a memory gate electrode, and an ONO film, fin, and element isolation region that are arranged directly under the memory gate electrode. For easy understanding, hatching lines are omitted in FIGS. 58 and 59.

When write is performed in a memory cell in which the write method is an SSI method, a hot electron is injected from the channel in the upper surface of a fin into the silicon nitride film of an ONO film, thereby allowing data to be written. That is, an electron is injected into the ONO film near the corner, the end portion, of the upper surface of the fin. On the other hand, when erase is performed in a memory cell in which the erase method is an FN method, a hot hole is injected from the inside of a memory gate electrode into the silicon nitride film of the ONO film such that the electron injected into the ONO film in the above write operation is cancelled, thereby allowing the data to be erased. Accordingly, it is necessary that an area of the ONO film, into which an electron is injected when write is performed, and an area thereof, into which a hole is injected when erase is performed, are the same as each other in the ONO film.

As illustrated in FIG. 58, however, when the sidewall of the fin FG is perpendicular to the main surface of the semiconductor substrate, a hot electron is injected into the ONO film ON near the corner, the end, of the upper surface of the fin FG when write is performed, while a hot hole is likely to be injected particularly from the corner of the memory gate electrode MG, the corner having an angle close to an acute angle, into the ONO film ON when erase is performed. This is because an electric field is likely to be concentrated on the corner in the memory gate electrode MG.

That is, near the coupling portion between the sidewall of the fin FG, the sidewall being perpendicular to the main surface of the semiconductor substrate SB, and the upper surface of the element isolation region EI, the memory gate electrode MG has a corner whose angle is the right angle, and in this case, a hot hole is likely to be injected into the ONO film ON near the corner. Accordingly, the area into which an electron is injected when write is performed, and the area into which a hole is injected when erase is performed, are misaligned, and hence there is the fear that the data in the memory cell may not be erased even when an erase operation is performed.

On the other hand, when the sidewall of the fin FH has a taper to the main surface of the semiconductor substrate SB, as illustrated in FIG. 59, the angle of the corner of the memory gate electrode MG, the corner being near the coupling portion between the sidewall thereof and the upper surface of the element isolation region EI, becomes large. Accordingly, an electric field in the memory gate electrode MG is prevented from being concentrated on the corner when an erase operation is performed, and hence the area, into which a hole is to be injected, can be brought close to the side of the corner of the upper surface of the fin FH. That is, occurrence of misalignment between the area into which an electron is injected when write is performed, and the area into which a hole is injected when erase is performed, can be prevented.

In the present variation, the ONO film ON is formed along: the upper surface of the element isolation region EI; the sidewall of the fin FA exposed over the element isolation region EI; and the upper surface of the fin FA, as illustrated in FIG. 49. The upper surface and sidewall of the fin FA and the upper surface of the element isolation region EI are covered with the memory gate electrode MG via the ONO film ON.

Herein, the taper of the fin FA is made larger than that of the fin FB in the present variation, and thereby the angle of the memory gate electrode MG near the coupling portion between the sidewall of the fin FA and the upper surface of the element isolation region EI, is prevented from becoming an angle close to an acute angle (e.g., right angle). Accordingly, the area, into which a hole is to be injected, can be brought close to the side of the corner of the upper surface of the fin FA, and hence occurrence of misalignment between the area into which an electron is injected when write is performed, and the area into which a hole is injected when erase is performed, can be prevented, similarly to the structure described with reference to FIG. 59. Accordingly, a rewrite efficiency is improved, and the reliability of a semiconductor device can be improved.

Third Embodiment

Figure 50:
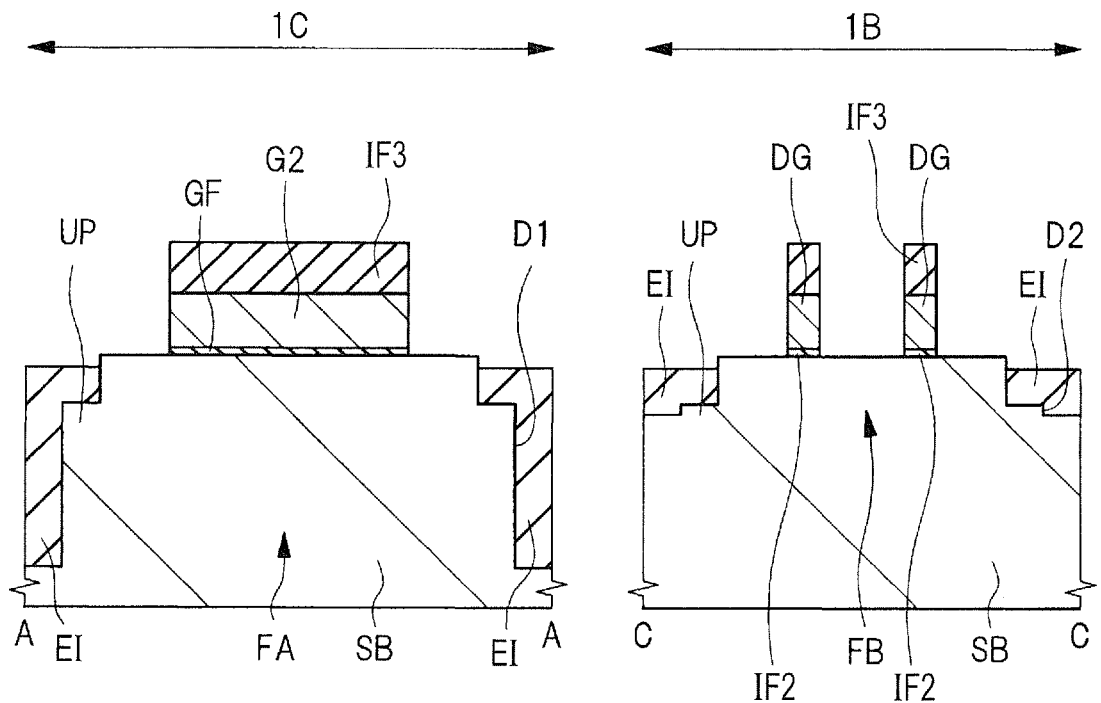
FIG. 50 is sectional views illustrating a semiconductor device according to Third Embodiment of the invention.
Figure 51:
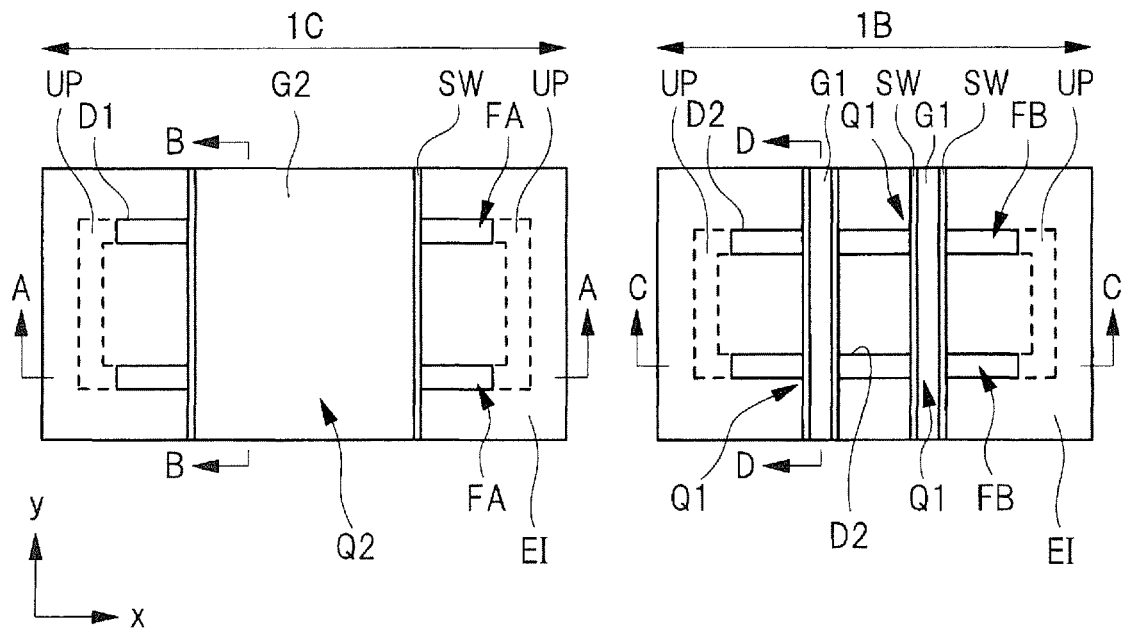
FIG. 51 is plan views illustrating a semiconductor device according to Third Embodiment of the invention.
Figure 52:
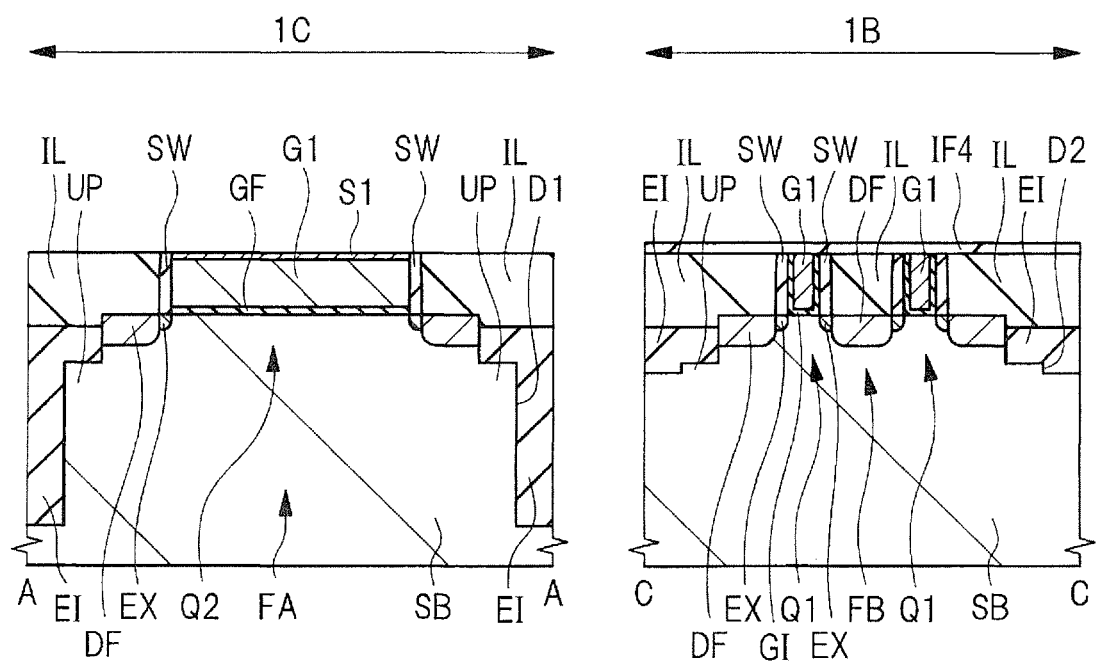
FIG. 52 is sectional views illustrating a semiconductor device according to Third Embodiment of the invention.
Figure 53:
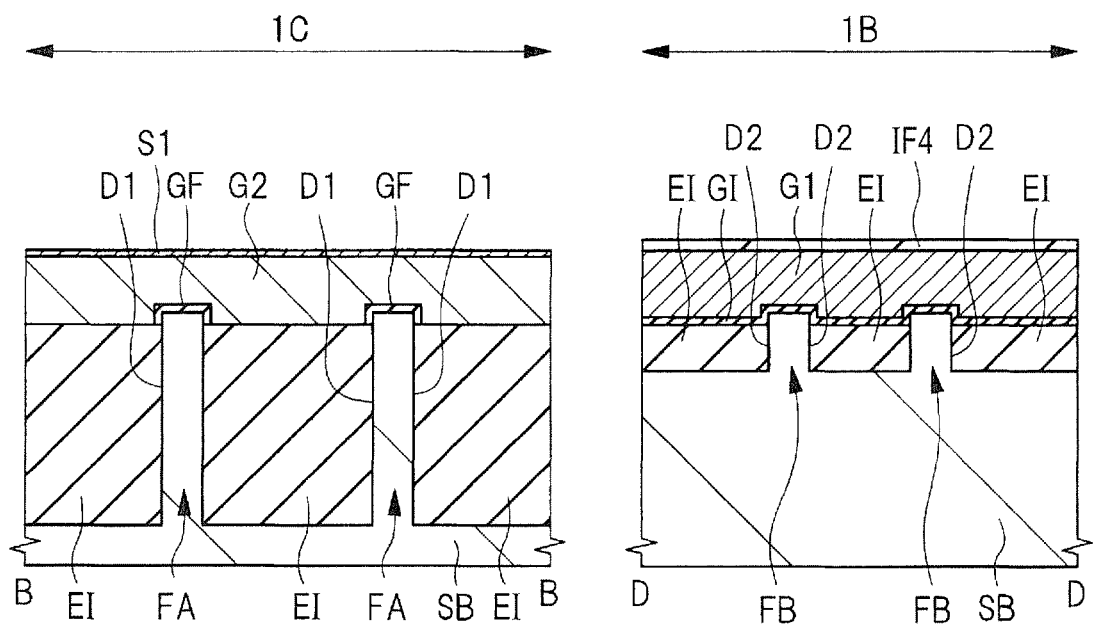
FIG. 53 is sectional views illustrating a semiconductor device according to Third Embodiment of the invention.

Hereinafter, the case where a high breakdown voltage FINFET is provided instead of a memory cell, unlike the above First and Second Embodiments, will be described with reference to FIGS. 50 to 53. Each of FIGS. 50, 52, and 53 is sectional views for explaining a manufacturing step of the semiconductor device according to the present embodiment. FIG. 51 is sectional plan views for explaining a manufacturing step of the semiconductor device according to the embodiment.

FIG. 50 illustrates a semiconductor device under manufacturing after the steps of forming a gate electrode, corresponding to the steps described with reference to FIGS. 27 and 33, are performed. That is, FIG. 50 is sectional views taken along the lines corresponding to A-A Line and C-C Line in FIG. 10, respectively. However, on the left side of the view, a sectional surface in an I/O region 1C, not in a memory cell region, is illustrated. FIG. 51 is plan views corresponding to FIG. 1. FIG. 52 is sectional views corresponding to FIGS. 2 and 41. FIG. 53 is sectional views corresponding to FIG. 3. That is, FIG. 52 is sectional views taken along A-A Line and C-C Line in FIG. 51, respectively; and FIG. 53 is sectional views taken along B-B Line and D-D Line in FIG. 51, respectively.

In the manufacturing steps of a semiconductor device according to the present embodiment, steps similar to those described with reference to FIGS. 5 to 26 are first performed. However, in order to explain herein the step of forming a high breakdown voltage transistor instead of a memory cell, FIG. 50 illustrates the I/O region 1C. An I/O region is a region where a high breakdown voltage semiconductor element that forms an I/O (Input/Output) circuit is provided. The I/O circuit is an input/output circuit, which is a circuit for inputting/outputting data between a semiconductor chip and a device coupled to the outside of the semiconductor chip. FIG. 50 illustrates on the left side thereof the I/O region 1C, and on the right side thereof the logic region 1B. The same is true with FIGS. 51 and 52 that are referred to in the later description.

Subsequently, the steps of forming a gate electrode, which have been described with reference to FIGS. 27 and 33, are simultaneously performed, as illustrated in FIG. 50. Herein, however, only one gate electrode G2 is formed over the fin FA in the I/O region 1C, instead of one pair of gate electrodes, unlike the above First Embodiment. That is, herein, the insulating films IF3 in the I/O region 1C and the logic region 1B are patterned by using a photolithography technique and a dry etching process, and then the polysilicon film SL2 and insulating film IF2 directly under the insulating film IF3 are patterned. Thereby, the gate electrode G2 including the polysilicon film SL2 in the I/O region 1C, the gate electrode G1 including the polysilicon film SL2 in the logic region 1B, and the gate insulating film GF including the insulating film IF2 in the I/O region 1C, are formed.

By performing the following steps similar to those described with reference to FIGS. 34 to 41, the semiconductor device according to the present embodiment illustrated in FIGS. 51 to 53 is completed. As illustrated in FIG. 51, the gate electrode G2 extends in the y direction in the I/O region 1C, and is formed to stretch directly over the fins FA. As illustrated in FIG. 52, the gate electrode G2 and the source/drain region formed in the upper surface of the fin FA beside the gate electrode G2 form a high breakdown voltage transistor Q2.

In the present embodiment, the trench D1 in the I/O region 1C and the trench D2 in the logic region 1B are formed in different steps so as to have different depths, respectively, similarly to the above First Embodiment. That is, the depth of the trench D1 between the fins FA over which the high breakdown voltage transistor Q2 is formed, is larger than that of the trench D2 between the fins FB over which the low breakdown voltage transistor Q1 is formed. In other words, in the direction perpendicular to the main surface of the semiconductor substrate SB, the length between the upper surface of fin FA and the bottom surface of element isolation region EI in the I/O region 1C is larger than that between the upper surface of the fin FB and the bottom surface of the element isolation region EI in the logic region 1B.

Because the trench D1 is thus deeper, the breakdown voltage between the high breakdown voltage transistors Q2, which are formed over the different fins FA, respectively, can be increased, and occurrence of a punch-through between these transistors Q2 can be prevented. Furthermore, the trench D2 can be formed to be shallow in the logic region 1B, and hence the embeddability of the element isolation region EI in the trench D2 can be improved. Accordingly, the space between the low breakdown voltage transistors Q1, which are formed over the different fins FB, respectively, can be reduced, and hence the integration degree of elements can be increased. Accordingly, the reliability of a semiconductor device can be improved, and the performance thereof can be improved.

The invention made by the present inventors has been specifically described above based on preferred embodiments, but it is needless to say that the invention should not be limited to those embodiments and various modifications can be made without departing from the gist of the invention.

For example, First Embodiment and Second Embodiment may be combined, or Second Embodiment and Third Embodiment may be combined.

In addition, part of the contents described in the embodiments will be listed below.

(1) A semiconductor device including:

a semiconductor substrate having a first region and a second region that are lined up along a main surface;

a plurality of first protruding portions each of which is part of the semiconductor substrate in the first region and protrudes from an upper surface of the semiconductor substrate and extends in a first direction along the main surface of the semiconductor substrate;

a first element isolation region embedded in a first trench between the first protruding portions adjacent to each other;

a first transistor that is formed over an upper surface of the first protruding portion via a first insulating film and is provided with both a first gate electrode extending in a second direction intersecting the first direction at a right angle and a first source/drain region formed in the upper surface of the first protruding portion;

a plurality of second protruding portions each of which is part of the semiconductor substrate in the second region and protrudes from the upper surface of the semiconductor substrate and extends in the first direction;

a second element isolation region embedded in a second trench between the second protruding portions adjacent to each other; and a second transistor that is formed over an upper surface of the second protruding portion via a second insulating film and is provided with both a second gate electrode extending in the second direction and a second source/drain region formed in the upper surface of the second protruding portion, in which an angle between the upper surface and a sidewall of the first protruding portion is smaller than an angle between the upper surface and a sidewall of the second protruding portion.

(2) The semiconductor device according to item (1), in which in the second direction, a space between the first protruding portions adjacent to each other is larger than a space between the second protruding portions adjacent to each other.

(3) A semiconductor device including:

a semiconductor substrate having a first region and a second region that are lined up along a main surface;

a plurality of first protruding portions each of which is part of the semiconductor substrate in the first region and protrudes from an upper surface of the semiconductor substrate and extends in a first direction along the main surface of the semiconductor substrate;

a first element isolation region embedded in a first trench between the first protruding portions adjacent to each other;

a first transistor that is formed over an upper surface of the first protruding portion via a first insulating film and is provided with both a first gate electrode extending in a second direction intersecting the first direction at a right angle and a first source/drain region formed in the upper surface of the first protruding portion;

a plurality of second protruding portions each of which is part of the semiconductor substrate in the second region and protrudes from the upper surface of the semiconductor substrate and extends in the first direction;

a second element isolation region embedded in a second trench between the second protruding portions adjacent to each other;

a second transistor provided with both a second gate electrode that is formed over an upper surface of the second protruding portion via a second insulating film and extends in the second direction and a second source/drain region formed in the upper surface of the second protruding portion;

a fourth insulating film provided with both a third insulating film and a charge storage film that are sequentially formed over the first protruding portion and the first element isolation region, and formed along an upper surface of the first element isolation region, a sidewall of the first protruding portion over the first element isolation region, and the upper surface of the first protruding portion; and a third gate electrode that is adjacent to a sidewall of the first gate electrode via the fourth insulating film and extends in the second direction, in which the upper surface and the sidewall of the first protruding portion and the upper surface of the first element isolation region are covered with the third gate electrode via the fourth insulating film, and in which the third gate electrode and the first source/drain region form a third transistor, and in which the first transistor and the second transistor form a nonvolatile memory element, and in which an angle between the upper surface and a sidewall of the first protruding portion is larger than an angle between the upper surface and a sidewall of the second protruding portion.

What is claimed is:

1. A semiconductor device comprising:
    a semiconductor substrate having a main surface, the main surface including a memory cell region and a logic region in a plan view,
    wherein the memory cell region comprises:
        a plurality of first protruding portions each of which protrudes from an upper surface of the semiconductor substrate and extends in a first direction along the main surface of the semiconductor substrate;
        a first element isolation region embedded in a first trench between adjacent ones of the plurality of first protruding portions; and
        a first transistor that is formed over upper surfaces of the plurality of first protruding portions via a first insulating film and is provided with both a first gate electrode extending in a second direction intersecting the first direction at a right angle and a first source/drain region formed in the upper surfaces of the plurality of first protruding portions,
    wherein the logic region comprises:
        a plurality of second protruding portions each of which protrudes from the upper surface of the semiconductor substrate and extends in the first direction;
        a second element isolation region embedded in a second trench between adjacent ones of the plurality of second protruding portions; and
        a second transistor provided with both a second gate electrode that is formed over upper surfaces of the plurality of second protruding portions via a second insulating film and extends in the second direction and a second source/drain region formed in the upper surfaces of the plurality of second protruding portions,
    wherein the memory cell region further comprises:
        a fourth insulating film including a third insulating film and a charge storage film that are sequentially formed over the plurality of first protruding portions; and
        a third gate electrode that is adjacent to a sidewall of the first gate electrode via the fourth insulating film and extends in the second direction,
    wherein the fourth insulating film is interposed between the third gate electrode and the plurality of first protruding portions,
    wherein the third gate electrode and the first source/drain region form a third transistor,
    wherein the first transistor and the third transistor form a nonvolatile memory element,
    wherein in a direction perpendicular to the main surface of the semiconductor substrate, a distance between the upper surfaces of the plurality of first protruding portions and a bottom surface of the first element isolation region in the memory cell region is larger than a distance between the upper surfaces of the plurality of second protruding portions and a bottom surface of the second element isolation region in the logic region, and
    wherein an angle between an upper surface and a sidewall of each of the plurality of first protruding portions is smaller than an angle between an upper surface and a sidewall of each of the plurality of second protruding portions.

2. The semiconductor device according to claim 1, wherein in the second direction, a space between the adjacent ones of the plurality of first protruding portions is larger than a space between the adjacent ones of the plurality of second protruding portions.

3. The semiconductor device according to claim 1, wherein in the second direction, a width of each of the plurality of first protruding portions is larger than a width of each of the plurality of second protruding portions.

4. The semiconductor device according to claim 1, wherein in the second direction, a width of each of the plurality of first protruding portions is smaller than a width of each of the plurality of second protruding portions.

5. The semiconductor device according to claim 1, wherein the first transistor is driven by a voltage higher than a voltage for the second transistor.

6. The semiconductor device according to claim 1, wherein the second gate electrode contains a metal.

7. The semiconductor device of claim 1, wherein an angle between the upper surface and a portion of the sidewall that connects to the upper surface of each of the plurality of first protruding portions is smaller than an angle between the upper surface and a portion of the sidewall that connects to the upper surface of each of the plurality of second protruding portions.

* * * * *